United States Patent [19]

Gussman

[11] Patent Number: 4,947,545
[45] Date of Patent: Aug. 14, 1990

[54] AUTOMATED BURN-IN SYSTEM

[75] Inventor: Robert L. Gussman, Houston, Tex.

[73] Assignee: Reliability Incorporated, Houston, Tex.

[21] Appl. No.: 198,064

[22] Filed: May 24, 1988

Related U.S. Application Data

[63] Continuation-in-part of Ser. No. 57,255, Jun. 1, 1987.

[51] Int. Cl.$^5$ ............................................. B23P 21/00
[52] U.S. Cl. ........................................ 29/705; 29/739;
    29/740; 29/762; 29/244
[58] Field of Search ................. 29/837, 565, 705, 714,
    29/739, 740, 759, 762, 764, 244, 256, 257;
    439/331, 372; 81/124.3, 124.7; 254/131; 269/49

[56] References Cited

U.S. PATENT DOCUMENTS

| | | | |
|---|---|---|---|
| 1,033,758 | 7/1912 | Howell | 269/49 X |
| 2,584,124 | 2/1952 | Gustafson | 269/49 X |
| 2,677,426 | 5/1954 | Glitsch | 29/565 X |
| 3,159,393 | 12/1964 | Villano | 269/49 |
| 3,588,983 | 6/1971 | Hoy | 29/764 |
| 4,175,734 | 11/1979 | Williams | 269/49 |

Primary Examiner—Timothy V. Eley
Attorney, Agent, or Firm—Michael F. Heim

[57] ABSTRACT

An improved burn-in board cartridge for use in burn-in and testing of IC packages in an automated burn-in and test system is disclosed. The cartridge includes printed circuit cards mounted on a single or both side faces of the cartridge, thereby permitting IC packages to be mounted on either or both sides of the cartridge. The cartridge includes a sturdy frame holding in place the printed circuit cards and providing strength to reduce damage to the circuit cards. Attached to the frame are rails which are used to position the cartridge in various apparatus such as burn-in chambers. Cooling tubes and electrical components can be placed inside the two-sided cartridge, between the printed circuit cards. The burn-in chamber is divided into zones with each zone having a number of slots into which a burn-in board is placed. The chamber includes rotating air diverters positioned at each end of a zone which are capable of channeling the heated air within the chamber around any one zone. Each zone has an access door to permit loading and unloading of burn-in boards from any zone. An automated handler is provided to automatically insert and remove the burn-in board and cartridge from various units in the system. The handler includes a generally T-shaped member inserted into apertures on the burn-in board by rotating the handler with a cam lever and a first cam follower. A plurality of handlers may be used to grasp and insert a number of burn-in boards sequentially, using a second cam lever and cam follower.

21 Claims, 44 Drawing Sheets

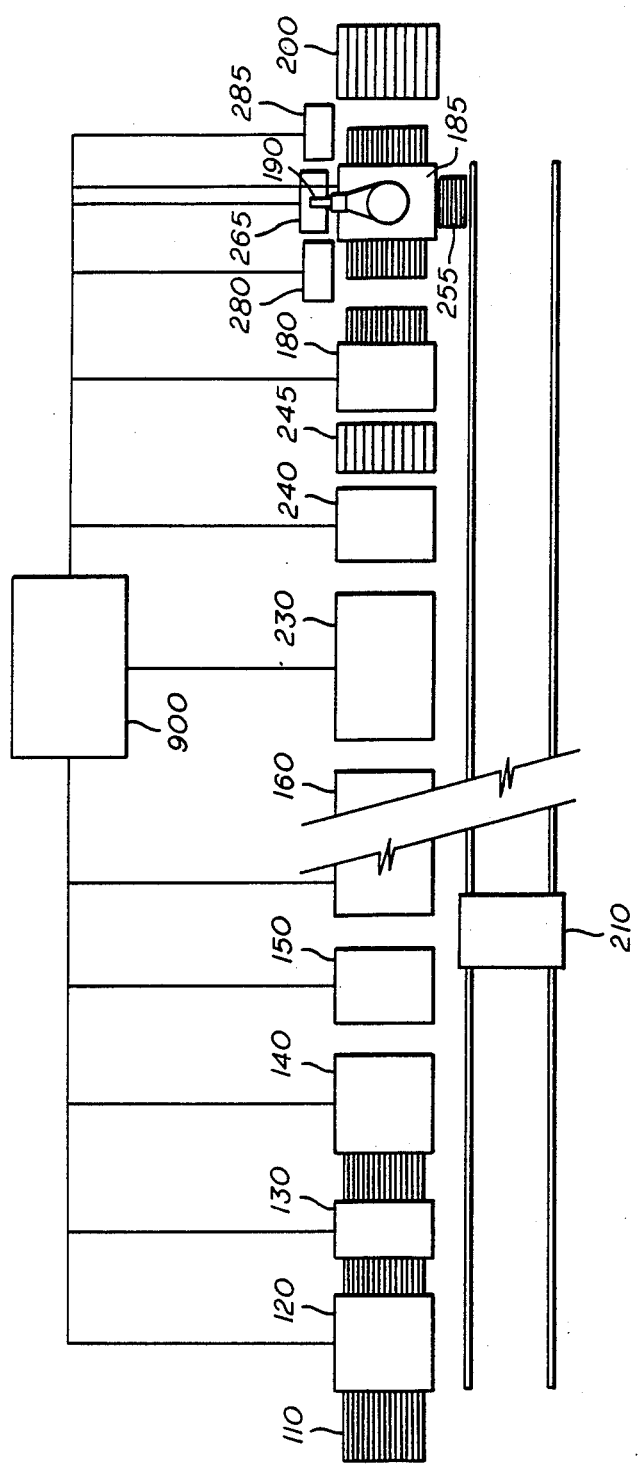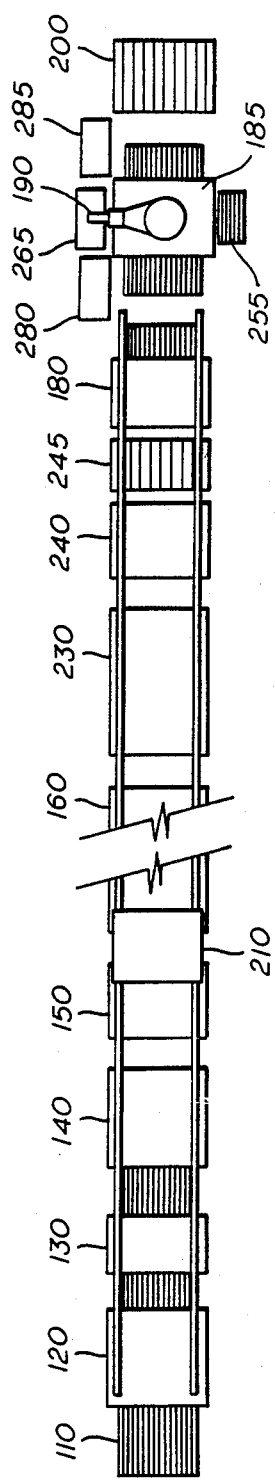

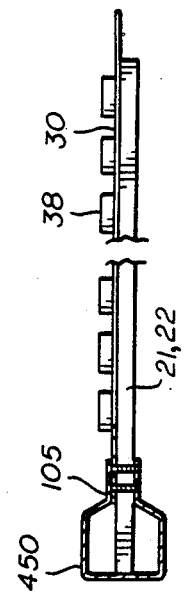
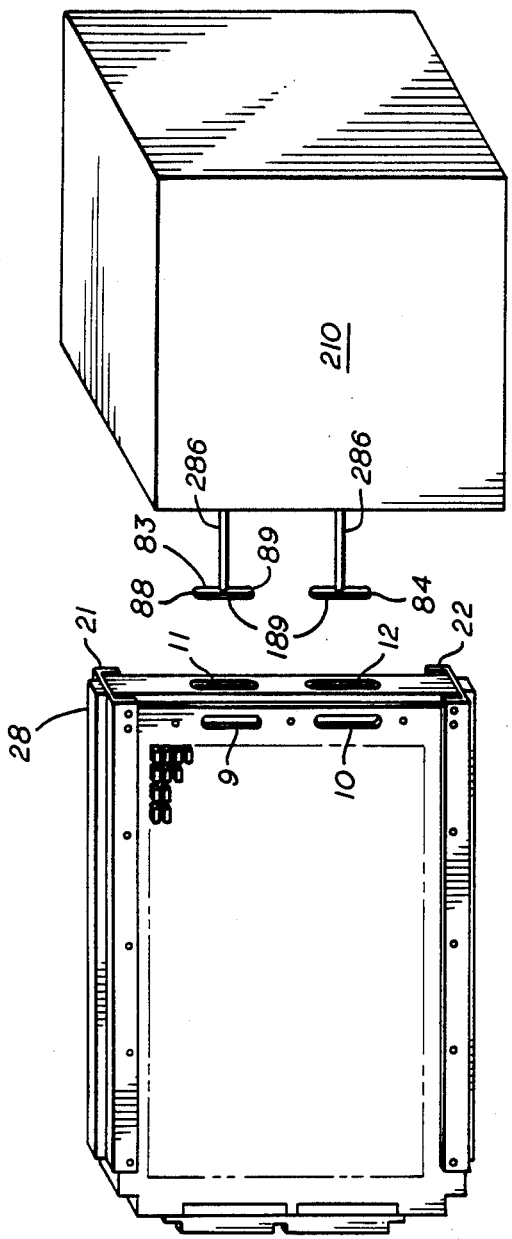
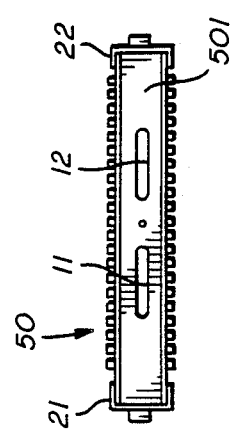
FIG. 23
FIG. 22
FIG. 21

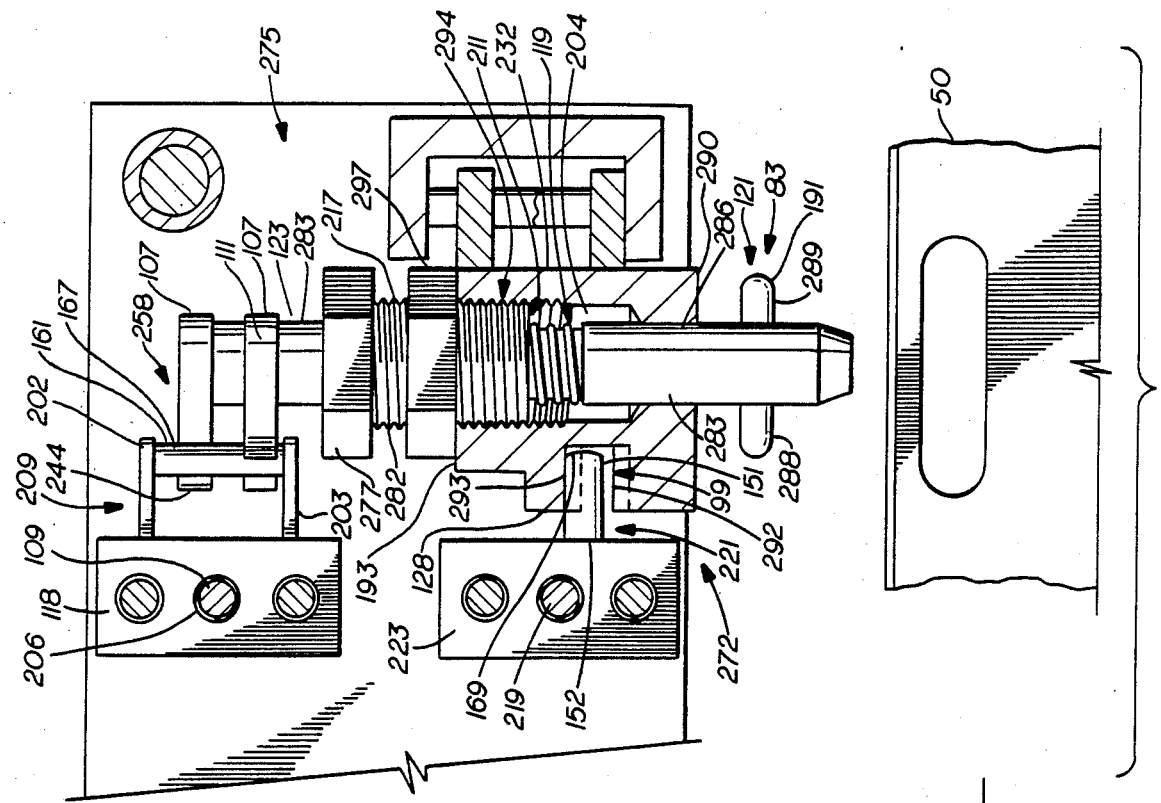

AUTOMATED BURN-IN SYSTEM

RELATED APPLICATION

This application is a continuation-in-part of U.S. Ser. No. 057,255, filed June 1, 1987, entitled "Automated Burn-In System."

BACKGROUND OF THE INVENTION

The present application relates generally to the field of automated apparatus for handling electronic circuit components, and, more particularly, to automated apparatus for use in the art of burning-in and testing circuit components prior to their distribution and use. Still more particularly, the present invention is directed to an automated system wherein electronic integrated circuit (IC) packages are placed in the burn-in system in their storage containers, automatically unloaded from their containers and inserted into sockets on printed circuit (PC) boards, subjected to burn-in and, in some cases, testing in an environmentally controlled chamber; automatically removed from the PC boards, and loaded into storage devices which indicate how the IC's performed during the burn-in and testing. The entire process, from the initial placement of the IC's into the system to the removal of the tested and graded IC's from the system, is completely automated and therefore capable of "hands-off" operation.

According to present practices, IC packages are mass-produced and installed in electronic circuits within highly sophisticated, complex and costly equipment. As with many mass-produced products, IC packages are prone to failure, in many cases at the beginning of operation. The complexity of the equipment within which such packages are installed makes post-installation failures highly undesirable. For example, when equipment reaches the final inspection stage of production, before failures are detected, the high level skills required for testing and repair add a significant cost to production expenses. Even more significantly, when the product has been installed in the field and a service technician must make warranty repairs, the costs thereby incurred can have a significant effect on profitability. As a result, manufacturers of electronic equipment are demanding ever greater quality and dependability in commercial grade IC packages.

Quality and dependability are enhanced substantially by detection of those IC packages likely to fail in the first few hours of operation, prior to installation of the packages in electronic equipment. One of the methods for exposing flawed IC packages is referred to as "burn-in." According to burn-in techniques, IC packages are stressed within their physical and electrical limits prior to installation, whereby those packages likely to become early failures in completed equipment can be discovered.

Burn-in involves placing a large number of IC packages on one or more printed circuit boards ("burn-in boards"); placing the burn-in boards with the packages mounted thereon in a chamber whose environment, particularly temperature, is controllable; applying direct current (dc) biases to each package on each board in such a manner as to forward and reverse bias as many of the package's junctions as possible, and/or actively clocking each package to its maximum rated conditions, such application of dc biases and clock signals being accomplished substantially simultaneously to each package; removing the burn-in boards from the chamber after the IC packages have been subjected to the environmental condition of the chamber and the biases and clock signals for a designated period of time; and removing the IC packages from the burn-in boards.

The burn-in process may encompass one of five general combinations of events. The simplest form of burn-in exposes the devices under test to a specific temperature without supplying power or clocking signals to the devices. In a second form, the devices are exposed to a particular temperature and supplied with power but not with clocking signals. In a third form, the devices are raised to a particular temperature and are exercised by the addition of both power and clocking signals, but no effort is made to monitor or evaluate performance. This third is probably the most popular form of burn-in at the present time. In a fourth form, which is gaining popularity at present, the devices are powered and clocked at a particular temperature, and the burn-in board input signals are monitored to insure that a short circuit or an open circuit at one device does not defeat the exercising of other devices. Finally, a fifth form of burn-in, which is popular especially for memory devices, involves monitoring and functional testing of devices that are powered and clocked at a particular temperature by monitoring output signals received from the memory devices. As used herein, the phrase "burn-in" or "burn-in process," unless otherwise specified, refers to any one of the five forms of burn-in described above.

A second method for improving quality control of the IC package subsequent to burn-in is to verify that the IC package functions according to its minimum rated specifications. Typically, each IC package is tested across a broad range of parameters and graded in quality according to its performance. Thereafter, the IC packages may be sorted into groups according to the predetermined performance grades.

The IC packages can be electrically tested either within or outside the burn-in chamber, depending on the sophistication of the particular chamber, by applying a room temperature test of critical dc parameters; for example, input currents and thresholds, output voltages and currents, and, in the case of digital components, by making a functional test to verify truth table performance. In this way, the packages that fail during burn-in are detected and segregated from those that do not fail. Because the packages that do not fail during the burn-in process have withstood substantial stress, such IC packages possess a high degree of dependability and can be installed in highly complex equipment with reasonable confidence that such IC packages will not fail prematurely.

The burn-in and testing processes, however, although successful in reducing the expense of troubleshooting failed electronic equipment, are not themselves without expense. Substantial capital expenditures are necessary to purchase or construct burn-in chambers, burn-in boards, and test equipment. Personnel must be employed and trained to operate the equipment and to monitor the time-consuming processes. In some cases entire businesses have been built around performance of the burn-in and testing processes. Use of the processes and, consequently, the success of a business that provides such services, is dependent upon the cost effectiveness of burning-in and testing the IC package vis-a-vis not burning-in or testing the IC packages but instead replacing those IC packages that fail after installation and use in the field.

One means for improving the cost effectiveness of the burn-in process is a reduction in labor cost. There is labor cost associated with almost all steps in the burn-in process. Consequently, efforts have been undertaken to automate certain stages of the process such as the loading of IC packages into burn-in board sockets and unloading and sorting the same (for example, see the commonly invented and assigned U.S. Pat. No. 4,567,652, entitled "Burn-In Board Loader", and U.S. Pat. No. 4,584,764, entitled "Burn-In Board Unloader and Package Sorter"). The savings in labor cost resulting from automating certain stages of the burn-in process can be substantial.

Increasing the cost effectiveness of the burn-in and testing processes can also be done by increasing the throughput of the IC packages. Since the burn-in process takes a great deal of time (from 6 to 160 hours), it is particularly advantageous to increase the number of IC packages which can be placed in the burn-in chambers. Another way to increase the cost effectiveness of the burn-in and testing process is to utilize equipment which is less subject to deterioration so that repair and replacement costs may be kept to a minimum. In addition, the reliability of the burn-in and testing process is improved when equipment is less prone to give inaccurate results due to deterioration.

A savings in the cost of labor is not the sole justification for automating the various stages of the burn-in board process. Increased reliability arises from the elimination of human error and the reduction of contamination when automated "hands-off" operation is present.

In an effort to realize the full benefits of automation, the focus in electronic factories has turned to automating entire processes, instead of merely providing islands of automation. Problems immediately arise, however, in how to integrate smoothly all components in a process. This problem is intensified in the burn-in process primarily due to the uniqueness of the process. Unlike the normal process of loading IC packages onto PC boards, the burn-in system utilizes a burn-in board with a uniform arrangement of sockets across the entire board; whereas a typical PC board, not designed for burn-in use is characterized by a random arrangement of components positioned across a board designed for a particular application.

A burn-in process, unlike the normal process of loading IC packages onto PC boards, requires that the IC packages be unloaded from the burn-in board after the components have been subjected to burn-in and testing. This creates a myriad of difficulties such as unloading the IC packages without damaging them or the burn-in board; identifying which IC packages passed and failed the burn-in and testing process; categorizing those IC packages according to performance; precisely identifying burn-in board and socket locations; and identifying what type of IC packages are being tested presently so that the IC packages may be handled properly. In addition, since the sockets in the burn-in board are subject to fatigue from re-use, defective sockets must be detected on each board, and, furthermore, must not be used in subsequent component testing until repaired.

The great length of time associated with the burn-in and testing process (6 to 160 hours) requires that the burn-in chambers be fully utilized to maximize throughput in the process. To maximize through-put, the process should not operate in a sequential step-by-step manner with each burn-in board since doing so would result in underutilization of the burn-in chamber by leaving the chamber unoccupied in whole or in part for significant periods of time. Maximum utilization of the chamber thus creates further difficulties in overall integration of the automated burn-in system. This problem is intensified by the requirement that all burn-in boards be loaded into or removed from a single burn-in chamber at the same time since the burn-in boards must be cooled before electrical signals can be removed; once loaded, all boards must remain in the chamber until the burn-in process is completed.

Currently, burn-in boards typically have sockets mounted to one side. Due to the size of the burn-in board, the board warps easily, and fitting the board into the burn-in chambers thus becomes a problem. In addition, board warpage results in deterioration of the burn-in board circuitry. Deterioration of the circuitry is also caused by the insertion and removal of IC packages from the board due to the flexing which occurs to the board during those procedures. Conventional burn-in boards are, additionally, easily damaged and often have chipped-off corners. The trend toward automation will only intensify the above problems.

As a consequence of the problems discussed above and other problems, the industry associated with the burn-in process to date has not achieved an automated, "hands-off" operation.

SUMMARY OF THE INVENTION

Accordingly, there is provided a system for entirely automating the process of burning-in and testing integrated circuit (IC) packages. The IC's in their storage containers are placed in the system by an operator. The containers are grasped and identified by a handler, which functions to remove the IC packages from the container. In the alternative, individual IC packages can be introduced into the system. The IC packages are placed in a tester which examines each package for mechanical and electrical defects. Defective IC packages are discarded from the system and the remaining packages are loaded onto a burn-in board by a loading means. The burn-in board cartridge is preferably a one- or two-sided burn-in board but alternatively may be any circuit board capable of supporting a plurality of sockets for receiving IC packages, or any module frame capable of supporting a plurality of burn-in boards.

The loading apparatus may include a mechanism to sense whether the IC package has been inserted. If a socket refuses to accept an IC package after a predetermined number of attempts, then the socket is treated as defective and consequently skipped.

After the burn-in cartridge has been loaded, it is conveyed by a shuttle apparatus to a loaded cartridge tester where the burn-in board is supplied with power. The IC packages are checked at this time to see if any are overheating; if any of the packages are too hot, indicating "short" circuits, the IC package is removed to avoid damaging the burn-in board. If an IC package fails to warm at all, indicating an "open" circuit, the cartridge tester assumes that it is defective and removes it from the cartridge. In both cases, a new IC package is then inserted in the empty socket. If the new IC package also is operating at an incorrect temperature the socket is assumed to be defective. The new IC package is then removed and the location of the defective socket is noted in a central computer.

From the loaded cartridge tester the cartridge is transferred via the shuttle apparatus to a burn-in chamber where the IC packages are stressed within their physical and electrical limits, and, if the process includes functional testing, the performance of each package is noted in the central computer. From the burn-in chamber the cartridge is transported to an unloading-/sorting apparatus where IC packages are unloaded from the cartridge and directed to a serial IC tester. The IC packages may be sorted at either or both the unloader/sorter and serial IC tester according to performance and placed in containers.

The automated burn-in system may further include an empty cartridge tester for the purpose of testing the sockets and circuitry on the empty cartridge for open and short circuits, and for proper capacitance and resistance. Defective sockets are detected and identified to the central computer.

In addition to loaded cartridges, the shuttle apparatus can also transport empty cartridges and empty IC package containers. The shuttle apparatus includes a position-sensing means to permit positioning of the shuttle at a desired location, and equipment for gripping the cartridge to enable it to move the cartridge from apparatus to apparatus.

The automated burn-in system further includes a central computer for controlling the flow of cartridges and IC packages between each apparatus, for initiating operation of each apparatus, and for supervising system operation. Individual processing units forming a part of each apparatus communicate with the central computer and control the operation of the individual apparatus.

The burn-in board cartridge disclosed herein is capable of supporting sockets on one or both sides of the cartridge. Thus, a two-sided cartridge includes a printed circuit ("PC") board used on both sides of the cartridge, thereby effectively doubling the capacity of the burn-in board and the number of connectors which are available for signal handling. A frame holds one or two PC boards in place on the cartridge and serves to diminish the deterioration experienced by conventional PC boards. Damage to the board, warpage, and flexing of the board are all significantly reduced.

The cartridge with burn-in boards on both sides provides other advantages not present in conventional burn-in boards. The two-sided burn-in board cartridge may include capacitors, resistors or digital circuitry in the interior of the cartridge for exercising the IC packages during burn-in. In high speed digital logic it is highly desirable to position the drivers as close as possible to the sockets.

The two-sided cartridge may also include a cooling means in the interior of the cartridge. Such a cooling means reduces the exposure temperature of electric devices in the cartridge interior, while not significantly affecting the ambient burn-in environment of the IC packages. By maintaining the cartridge interior at a cooler temperature, the effective life of electric devices therein is prolonged.

A further advantage to the two-sided burn-in board cartridge is that burn-in and testing of an IC package with an extremely high pin count can be accommodated by utilizing the connectors from both sides of the cartridge. The cartridge has an improved capacity for bringing signals into and out of IC packages with high pin counts since the cartridge has twice the edge-connector capacity of the traditional burn-in board.

Finally, the cartridge may be configured for use in an automated handling apparatus. Aligned apertures on opposing side faces of the cartridge frame combine with openings in one end thereof to enable a mechanical T-shaped handling apparatus to engage the cartridge for transport and for loading and unloading from a burn-in chamber.

The handling apparatus includes a rotational mechanism for rotating a T-shaped handle in such a manner that the handle engages the aligned aperatures. A removal mechanism is also provided to enable the handling apparatus to connect or disconnect each burn-in board with connectors in the burn-in chamber.

The burn-in chamber includes one or more stress chambers, each of which is divided into a plurality of burn-in zones. Each burn-in zone is capable of supporting burn-in and testing of a plurality of burn-in cartridges substantially independent of other burn-in zones. Each zone includes an air diverter mechanism immediately upstream of the zone whereby air flow may be directed around the zone to permit cooling, unloading, and reloading thereof. In this manner, IC package throughput can be maximized.

These and various other characteristics and advantages of the present invention will become readily apparent to those skilled in the art upon reading the following detailed description.

BRIEF DESCRIPTION OF THE DRAWINGS

For a detailed description of the preferred embodiment of the invention, reference will be made now to the accompanying drawings, wherein:

FIG. 1 illustrates schematically the preferred layout of the automated burn-in system;

FIG. 2 shows an alternative embodiment of the automated burn-in system which utilizes a shuttle traveling on an overhead rail;

FIG. 21 shows an alternative embodiment of the cartridge depicted in FIG. 18 wherein an end circuit card is provided at the top end of the burn-in board cartridge;

FIG. 22 illustrates schematically the shuttle apparatus used to transport the cartridge in an automated environment;

FIG. 23 shows a side view of the single-sided cartridge;

FIG. 28 shows a front view of the automatic handler;

FIG. 29 is an isometric view of the automatic handler of FIG. 28;

DETAILED DESCRIPTION OF THE PREFERRED EMBODIMENT

Figure 3A:
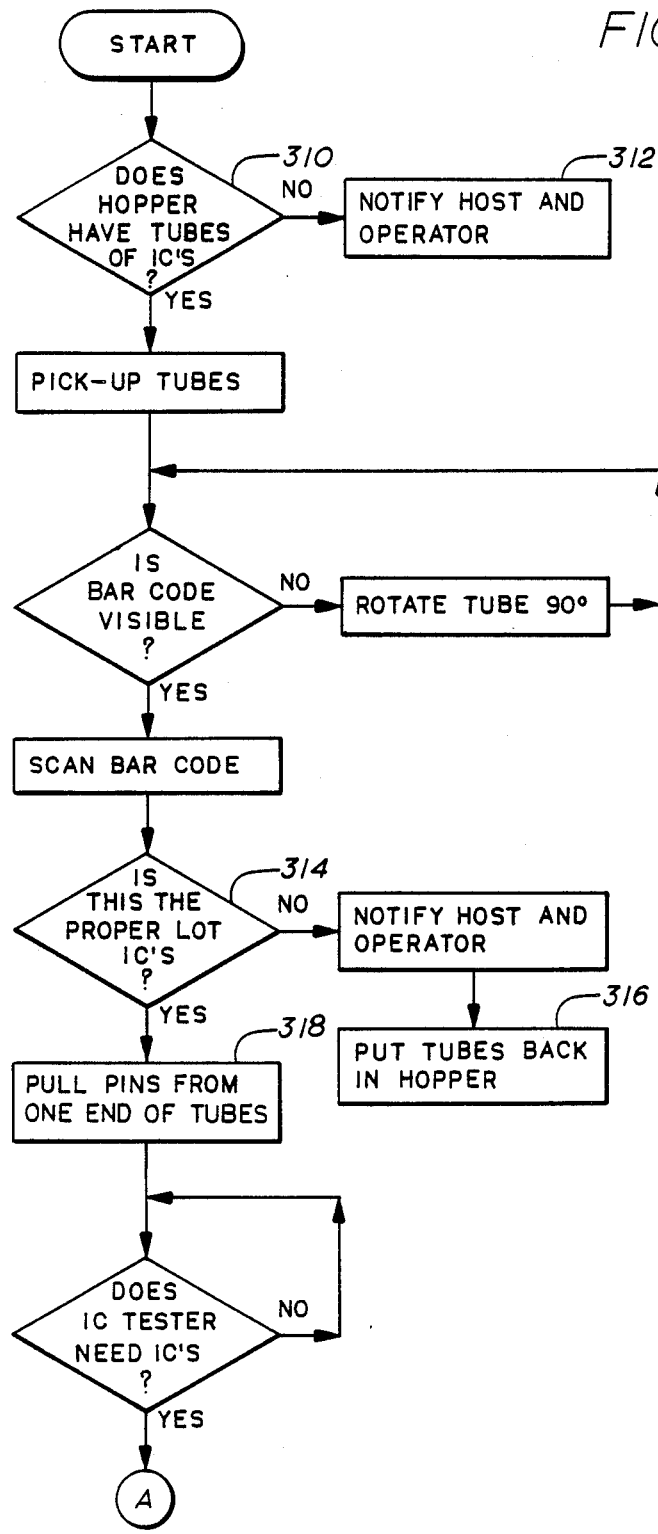
FIGS. 3A and B are an operational flow chart for the incoming tube handler.

"Burn-in" refers generally to any one of several techniques whereby integrated circuit (IC) packages are stressed within their physical and electrical limits prior to their sale or distribution so that those packages likely to become early failures in completed equipment can be discovered. The burn-in techniques include loading the IC packages into sockets on burn-in boards, placing the burn-in boards in a chamber whose environment, particularly temperature, is controllable, applying electrical test signals to the boards while subjecting the IC packages to the maximum temperature rating therefor (in some cases), monitoring the test signals (in some cases), functionally testing the IC packages (in some cases), removing the burn-in boards from the chamber, and unloading the IC packages from the burn-in boards.

A typical IC package, as are referred to herein, comprises a dual in-line package ("DIP") having a body portion which is generally a parallelpiped with from four to sixty-four electrical leads of a generally L-shaped cross-section extending out and down from the opposing sides of the body. The overall width of the DIP may be, for example, 0.3, 0.4 or 0.6 inch. Sockets mounted on the BIC burn-in board 50 include socket contacts defining slots for receiving electrical leads on DIP IC packages.

Unless specified otherwise herein, the term "IC package" may also refer to a surface mounted device (a "chip carrier") including small outline integrated circuits (SOIC's), plastic leaded chip carriers (PLCC's), ceramic leaded chip carriers (CLCC's), leadless chip carriers (LCC's), or pin grid arrays (PGA's). The SOIC also comprises a generally parallelpiped body portion having electrical leads extending from opposing sides of the body. The electrical leads may have either a J-shaped or an S-shaped ("gull wing") cross-section permitting the lead to lie on the surface of the socket instead of being inserted into slots in the socket. The PLCC, CLCC, and LCC have bodies which are of a square or rectangular geometry with a relatively thin cross-section, giving these IC packages an overall wafer-shaped appearance. In the usual construction, the PLCC and the CLCC have multiple electrical leads positioned flush with or bent into close proximity with the body of the package, while the LCC has conductive coatings applied at select areas on the major body surfaces.

To accommodate surface mounted IC packages, the sockets include socket contacts having conductive coatings on the surface of the socket. The PGA's also have a wafer-shaped body. The leads of the PGA are usually uniformly spaced throughout the length and width of the bottom surface of the body and protrude perpendicularly therefrom. Special zero-insertion force sockets with a separately operable closure mechanism are required to accommodate the large number and high-density spacing of the PGA leads.

I. SYSTEM OVERVIEW

FIG. 1 shows the preferred embodiment of the automated burn-in system. The system is comprised of a number of apparatus, with each of the apparatus being responsible for a particular function in the burn-in process. The burn-in system includes an incoming tube hopper 110, an incoming tube handler 120, an IC tester 130, a cartridge loader 140, a loaded cartridge tester 150, a burn-in chamber 160, a cartridge unloader/sorter 180, a serial IC tester 185, a discharge tube handler 190, a pin station 265, holding bins 280, 285, an empty tube hopper 255, a discharge tube hopper 200, a shuttle apparatus 210, and a central control apparatus 900 (collectively sometimes referred to hereafter as "individual apparatus" or "unit" of the burn-in system).

The tube hopper 110 receives IC storage containers, and the tube handler 120 removes the pins from the tubes and the IC packages from their storage containers ("tubes") and places the IC packages into the IC tester 130. The IC tester 130 runs mechanical and electrical tests on the raw IC packages, rejecting those IC packages which fail to pass the tests. The acceptable IC packages are received at the cartridge loader 140 where the IC packages are loaded on a burn-in board cartridge. The loaded cartridge is placed in the loaded cartridge tester 150 and the cartridge is supplied with power; IC packages which have open or short circuits are removed from the cartridge.

From the cartridge tester 140, the loaded cartridge is transferred to the burn-in chambers 160 where the IC packages are stressed within their physical and electrical limits and, if the process includes functional testing, the performance of each package is recorded in the host or central computer 900. The IC packages are subsequently unloaded by category, if desired, from the cartridge in the cartridge unloader 180 and passed to the serial IC tester 185, which performs parametric tests on each IC package. If desired, the IC packages then may be sorted into tubes according to each package's performance during the burn-in and testing. The discharge tube handler 190 removes tubes filled with IC packages from the cartridge unloader 180 or serial IC tester 185 and passes the tubes to the pin station 265 to be pinned. The tubes may also be marked at the pin station 265 to reflect the performance of the IC packages during burn-in and testing. Finally, the discharge tube handler 190 deposits the tubes in the discharge tube hopper 200.

Referring still to FIG. 1, the automated burn-in system may further include an empty cartridge tester 240 for testing the empty cartridge for electrical open and short circuits. If necessary, empty and loaded cartridges can be stored in a cartridge storage apparatus 230. The cartridge is transported between apparatus by a shuttle apparatus 210 disposed on a track positioned alongside of the burn-in system apparatus. Finally, the central computer 900 serves to orchestrate the operation of each apparatus in the system. In an alternative embodiment shown in FIG. 2, the track is located over the top of the burn-in system.

The automated burn-in system made in accordance with the principles of the present invention may be constructed with one or more of the individual apparatus comprising a dual unit in which mechanical apparatus of the individual unit is duplicated in a side-by-side or over and under construction to increase throughput. Consequently, the system may be paired so that operation occurs on both halves of the dual individual unit at the same time. It will be assumed for purposes of further discussion that both halves of any dual unit are constructed and function in substantially the same manner, except as otherwise indicated hereafter.

In normal practice, IC packages are stored in containers to protect them from contamination. While individual IC packages can be introduced into the burn-in system, the preferred embodiment of the present invention contemplates a "tube-to-tube" process; that is, the introduction of the IC storage containers ("tubes") into the system and the receipt of categorized IC tubes out of the system. Such a "tube-to-tube" process eliminates the possibility that IC packages will be contaminated when placed into or taken out of the system. Each IC package tube used in the burn-in system has associated with it a bar code label (not shown). The bar code label may include an orientation line which runs lengthwise with the tube and a series of parallel lines of varying thickness arranged generally perpendicularly of the orientation line to form a serial bar code.

Incoming Tube Hopper

Referring again to FIG. 1, the incoming tube hopper ("ITHO") 110 receives tubes or containers of IC packages from a human operator and stores the same for the incoming tube handler 120.

Incoming Tube Handler

Referring still to FIG. 1, the incoming tube handler ("ITHA") 120 receives tubes of IC packages from the tube hopper 110, identifies the tubes, removes the pins from the tubes and the IC packages from the tubes, and sends the IC packages to the IC tester 130.

Figure 3B:
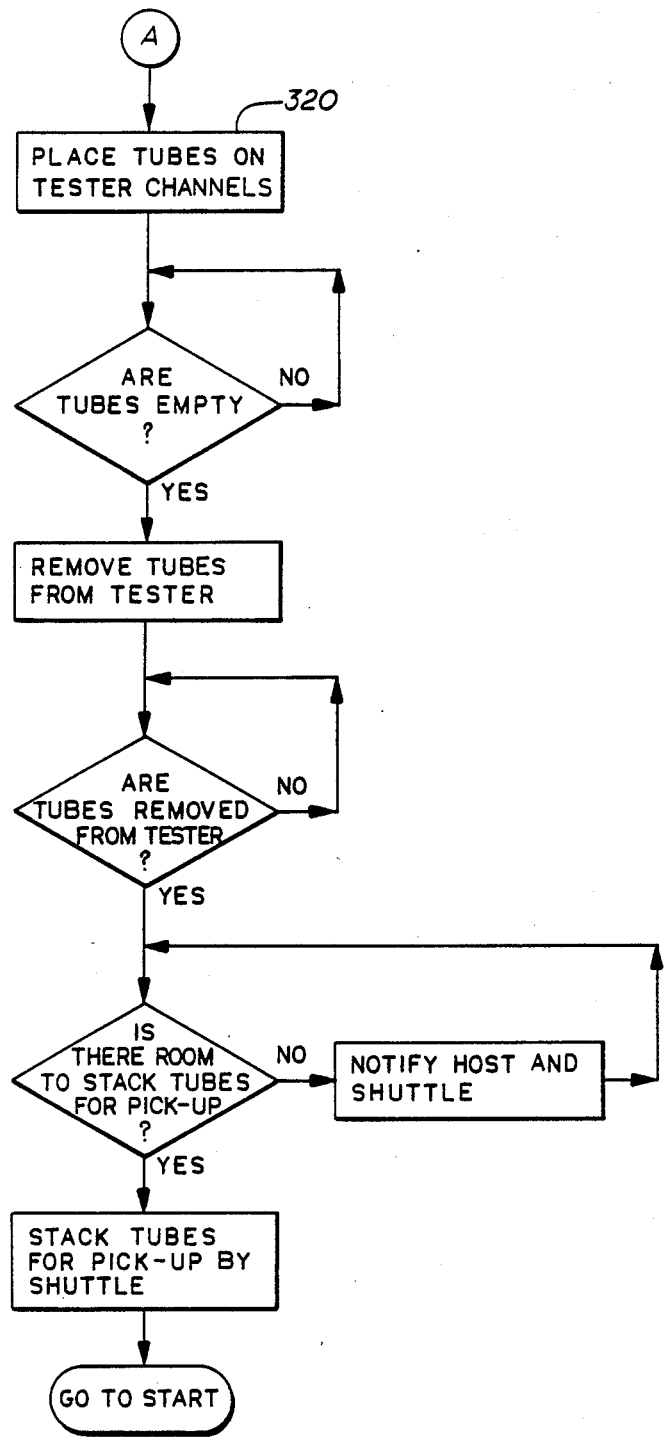

The incoming tube handler 120 utilizes an on-board microprocessor to control handler operation. FIG. 3 is a flow chart depicting the preferred method of operation of the tube handler 120. Thus, the incoming tube handler 120 begins operation by monitoring the status of tubes in the tube hopper 110 to detect a shortage of tubes for processing by the burn-in system (step 310). In the event of a shortage, the tube handler 120 signals the central computer 900, and the operator is alerted of the requirement for additional tubes as shown in step 312.

The tube handler 120 grasps tubes from the tube hopper 110 and rotates the tubes until the bar code orientation line is detected by a bar code reader. The bar code reader may be any conventional type, but preferably comprises a laser scanner type reader that avoids direct contact with the IC container. Optimally, the reader is a moving beam laser scanner that is fixed in place while the laser beam is directed across the bar code. When the tube is properly oriented, the reader scans the serial code on the bar code label to identify the lot numbers of the IC packages contained in the particular tube. At step 314, this information is compared with data received from the central computer 900 (FIG. 1) specifying the lot numbers of IC packages which are to be burned-in. A discrepancy between the actual lot numbers and the acceptable lot numbers causes the tube handler to initiate an error signal which is sent to the central computer 900. The unacceptable tubes then are replaced in the incoming tube hopper 110 (step 316).

Referring still to FIG. 3, once an acceptable tube has been identified, the tube is opened at one end (step 318) and, when the IC tester 140 is ready to receive IC packages, the tube handler 130 positions the tube to deliver IC packages to the IC tester 140 (step 320). The tube handler 130 then continues to monitor the delivery of IC packages from the tube into the IC tester 140 and, after all of the IC packages have been received in the tester 140, the tube handler 130 removes the empty tube from the tester and deposits the tube in a tube stack for pick up by the shuttle apparatus 210.

IC Tester

Figure 4A:
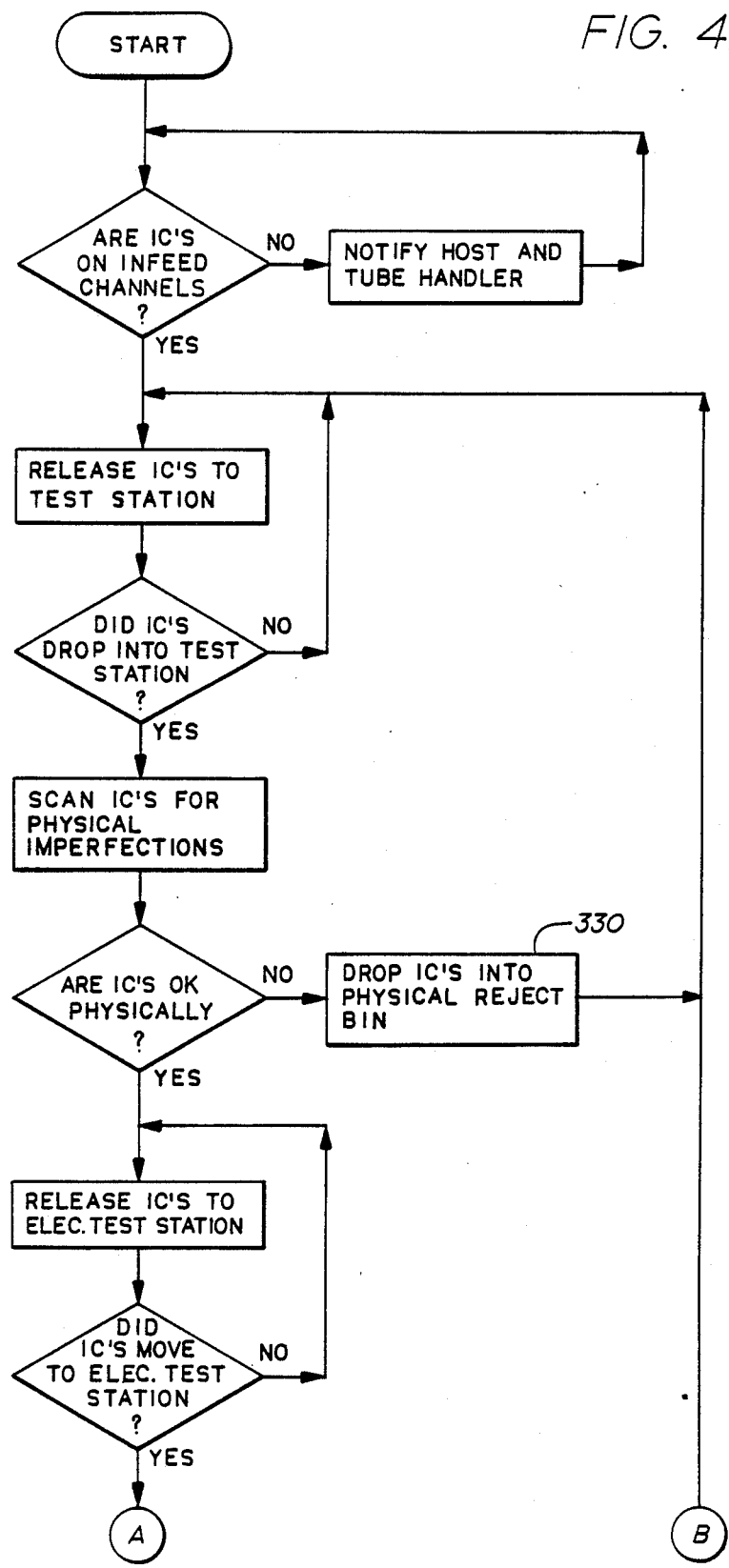
FIGS. 4A and B are an operational flow chart for the IC tester.
Figure 4B:
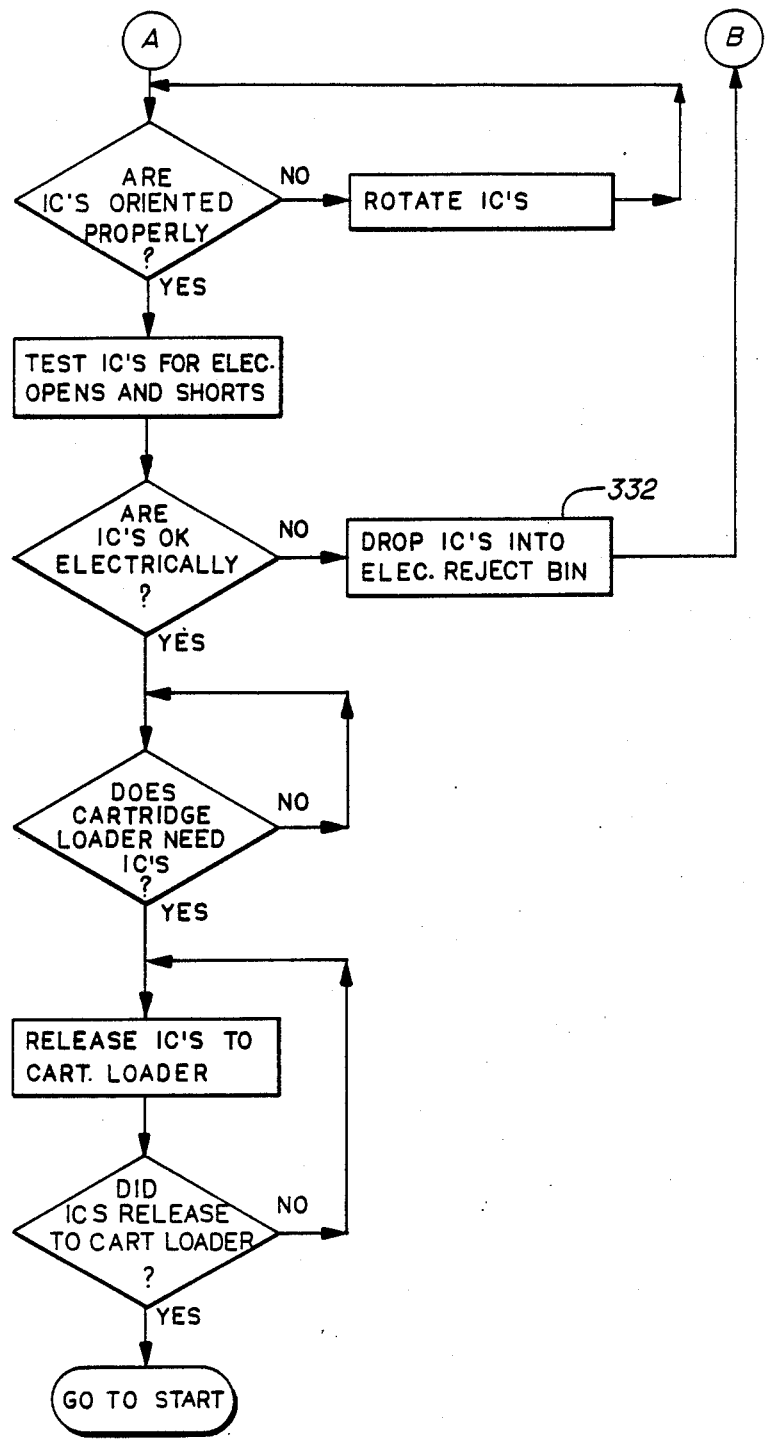
Figure 5A:
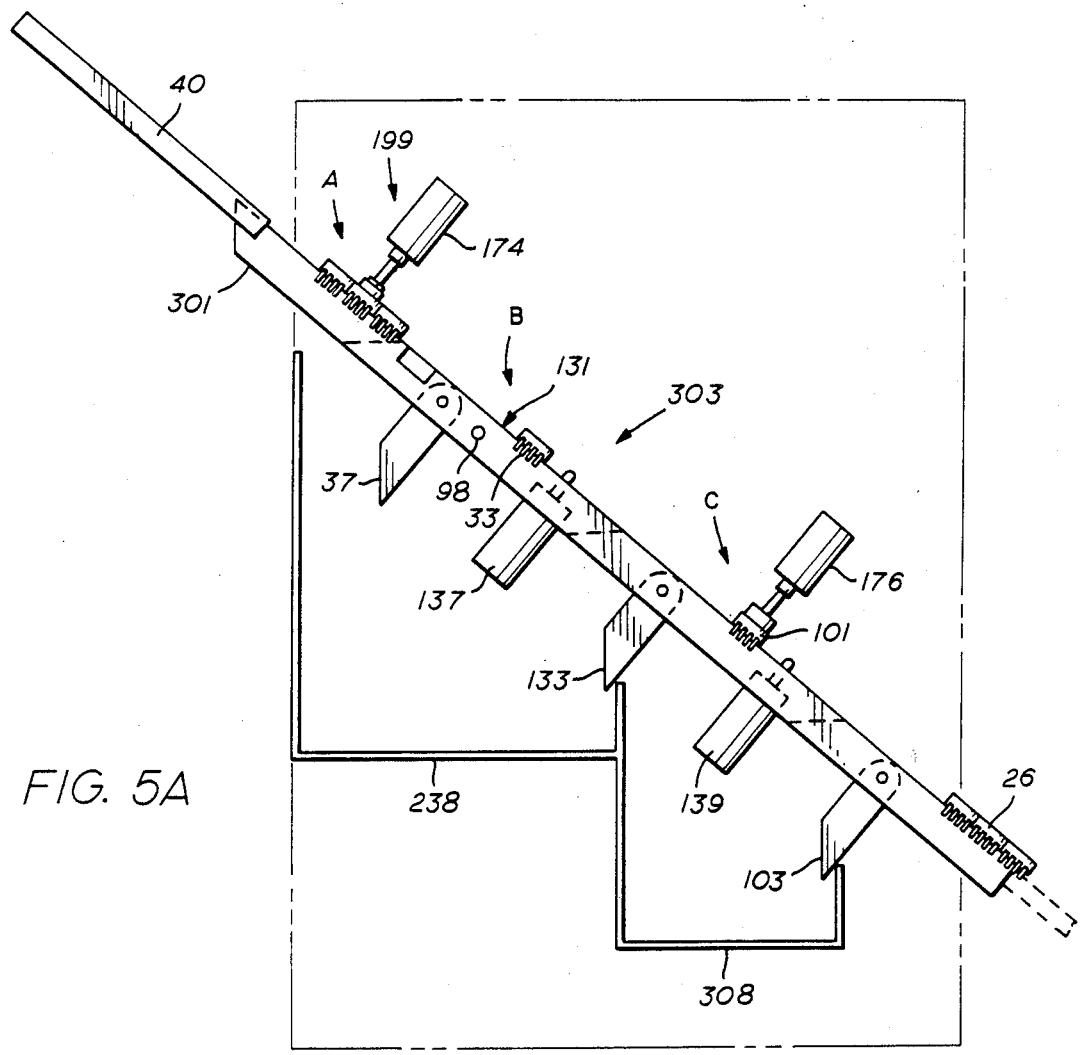
FIG. 5A illustrates schematically the operation of the IC tester.

The IC tester ("ICTS") 130 tests IC packages for physical imperfections and for simple electrical defects. The IC tester 130 includes an on-board microprocessor for controlling operation of the unit. FIG. 4 is a flow chart reflecting the general operating procedure for the IC tester 130. Referring to FIG. 4, IC packages are received on infeed channels of the tester 130 from tubes placed in position by the tube handler 120. FIG. 5A illustrates schematically a channel track 131 comprising the IC tester 130. Referring to both FIGS. 4 and 5A, the channel track 131 is divided into an upper infeed section 301 and a lower test section 303. IC packages 26 are delivered onto the upper infeed section 301 of track 131, preferably in tubes 40. An infeed gate and an infeed sensor may be provided between the infeed section 301 and the test section 303 to monitor the incoming IC packages. The track 131 is positioned at an acute and variable angle with respect to the horizontal to cause the IC packages 26 to pass down the track 131 in response to the force due to gravity. The IC tester 130 may comprise a plurality of channel tracks 131 in order to accommodate a large throughput of IC packages. For simplicity, the discussion herein will focus on a single track 131. Unless otherwise noted, other tracks are structured and operate identically.

The IC tester 130 preferably includes three separate test stations. The first test run by the IC tester 130 is a physical check to remove from the track those DIP IC packages 26 having leads which are too deformed to be loaded automatically onto the burn-in board. U.S. Pat. No. 4,567,652 entitled "Burn-In Board Loader," commonly assigned, discloses such a test ("policing") station 199 and is herein incorporated by reference. Thus, the track 131 has a protuberance along both sides of the track 131 at test station A. As disclosed in U.S. Pat. No. 4,567,652, the protuberance includes a widened section so as to narrow the clearance between the sides of track 131 and an adjacent wall through which the leads of the IC packages 26 must pass. Any IC packages 26 having electrical leads which are deformed abnormally inwardly or outwardly with respect to the IC body portion are jammed at the narrowed clearance at station A, thereby halting the serial flow of IC packages along the track 131. A sensor 98 positioned below station A detects the interruption in the flow of IC packages, alerting the on-board microprocessor to the presence of a jam.

The IC packages pass through the policing station 199 one at a time. Air cylinder 174 is positioned above the track 131 and is actuated to extend the shaft thereof and halt the flow of the IC package which is next in line to be tested. Air cylinder 174 holds the IC package until it is released after the preceding IC package has passed completely through the police station 199.

Track 131 can also be modified to accommodate IC package configurations other than DIP's For example, where the IC packages consist of chip carriers, the chip carrier is transported along the upper surface of the track 131. In addition, the track 131 may include a pair of side walls which extend upward alongside the upper surface of the track so as to guide the chips by contact with the side walls. The track would thus define a channel for slidably transporting chips through the test stations.

In the situation where pin grid arrays (PGA's) are used, the PGA can be placed on the track described above in an inverted manner so that the body surface lies on the track and the leads project upwardly. The primary test run on both the chip carriers and the PGA's are electrical tests at station C.

When the IC tester 130 is alerted to a jam condition, an ejection mechanism 37 within the track 131 removes the jammed IC package 26 from the track. The ejected IC package is deposited into a mechanical reject bin 238 where it can be collected later by an operator for further processing or disposal (step 330).

Figure 5B:
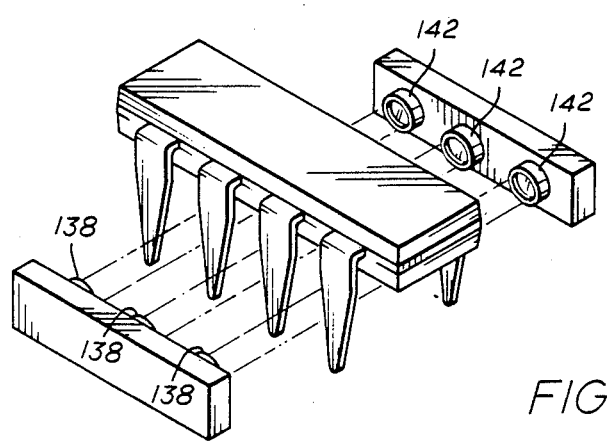
FIG. 5B is a schematic illustration of the physical test conducted on IC package leads to check for misalignment.

Leads which are not deformed abnormally inwardly or outwardly may still be unacceptable if the leads are missing or if the leads are bent laterally with respect to the IC body portion. Referring still to FIGS. 4 and 5A, the second test performed by the IC tester 130 is also a physical check; the IC packages 26 are examined at test station B by optical sensors to insure that the leads are present and are properly aligned in terms of lead spread and straightness. Test station B includes a gate 137 to halt the flow of IC packages down the track 131 so as to permit examination of individual IC packages; optical sensors positioned adjacent to the track detect lead misalignment. Test Station B is shown in detail in FIG. 5B. The optical sensors include a plurality of photoelectric transmitters 138 and photoelectric receivers 142 for detecting lead misalignment. If an IC package is found to be defective, it is ejected automatically into the mechanical reject bin 238 by an ejector mechanism 133 positioned within the track 131 (step 330).

Referring still to FIGS. 4 and 5A, the third test conducted by the IC tester 130 is an electrical check for open and short circuits at test station C. Test station C includes a gate 139 to halt the flow of IC packages down the track 131. Positioned above track 131 is air cylinder 176 which includes a plurality of electrical probes 101 to contact the leads 33 of the IC package 26. Once the IC package is stopped at gate 139, air cylinder 176 is actuated to extend probe 101 into contact with the leads of the IC package. The IC package 26 positioned at the test station C is also examined to insure that it is properly oriented. If the IC package is improperly oriented, it is rotated 180° end for end. The tester 130 is programmed to conduct open circuit and short circuit checks with the probe 101, and any IC packages found to have electrical defects are ejected from track 131 into an electrical reject bin 308 by ejector mechanism 103 (step 332).

During the three tests conducted in the IC tester 130, mechanical and electrical defects are recorded and communicated to the central computer 900, as are the number of IC packages which pass all tests. Since the central computer 900 already received from the handler 120 the identity of the tubes within which the IC packages were stored, it is therefore possible to associate the number of defects with a particular tube and lot number.

Cartridge Loader

On leaving the IC tester 130, the IC packages pass to the burn-in cartridge loader ("BCLD") 140, as shown in FIG. 1. The loader 140 is responsible for placing the IC packages onto burn-in cartridges. One example of such a loader is disclosed in commonly assigned U.S. Pat. No. 4,567,652, granted to the present inventor, which is incorporated herein by reference. The preferred manner of placing the IC packages on the board may differ, however, from that disclosed in U.S. Pat. No. 4,567,652. In addition, the traditional burn-in board used in U.S. Pat. No. 4,567,652 preferably is replaced by a burn-in board cartridge described herein.

The function of the loader 140 is to mount IC packages in sockets on burn-in board cartridges. The cartridge loader 140 preferably includes a loader incoming buffer, a loading station, and a loader discharge buffer. The loader incoming buffer stores empty burn-in board cartridges. The loading station is the position at which empty cartridges are loaded with IC packages, and the loader discharge buffer receives loaded burn-in cartridges for storage. Both the incoming and the discharge buffers are capable of storing a plurality of cartridges. The loader 140 automatically moves the cartridge from the incoming buffer to the loading station and from the loading station to the discharge buffer. In addition, a mechanism is provided in the loading station for rotating the cartridge 180° to permit loading on a second side of the cartridge if a two-sided cartridge, described infra in detail in section II, entitled "Burn-in Cartridge". Bar code readers are positioned in the incoming buffer and the loading station to scan a bar code label placed on the burn-in board surface or surfaces to identify the cartridge and the specific side face of the cartridge.

Loading of IC packages onto the cartridge proceeds automatically with precise position placement of the packages by a loading mechanism. Associated with the loading mechanism is a sensing means for determining whether an IC package has been properly inserted into the sockets on the burn-in board cartridge.

Figure 6A:
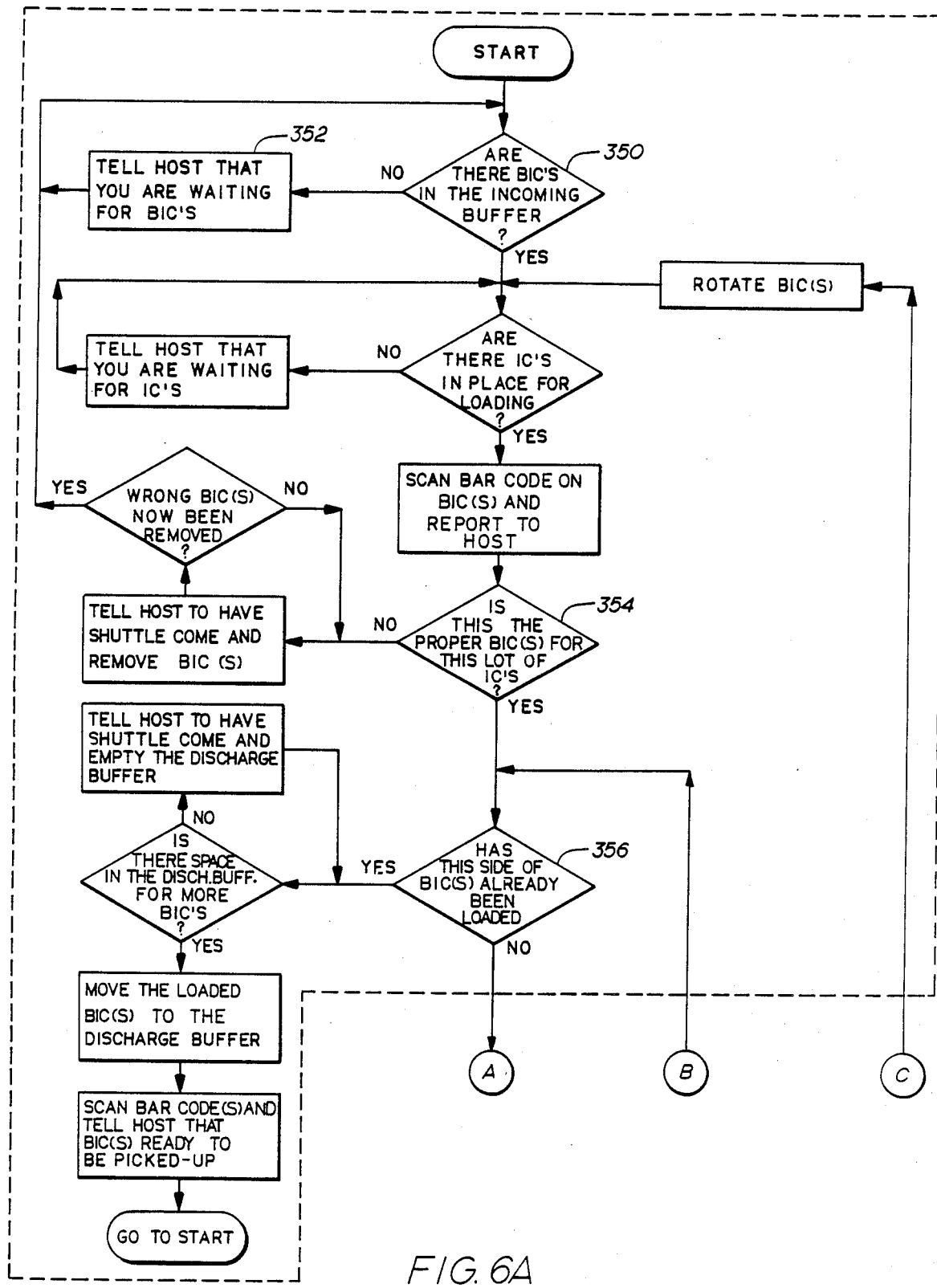
FIGS. 6A and B are an operational flow chart for the cartridge loader.
Figure 6B:
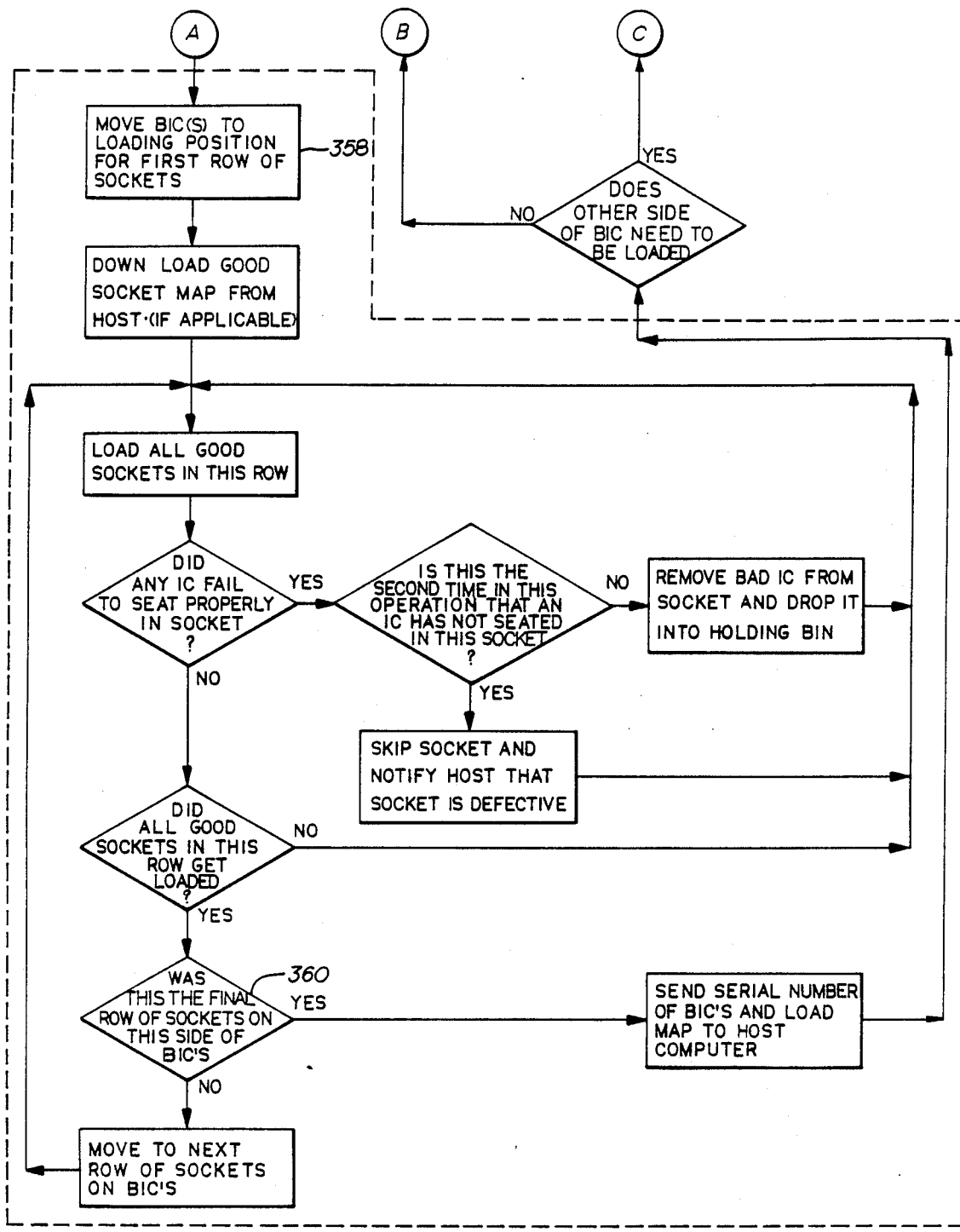

The preferred manner of operation of the cartridge loader 140 is set forth in the flow chart of FIG. 6. The operation of the loader is controlled by a microprocessor unit programmed in accordance with the operational flow chart. Referring now to FIGS. 1 and 6, the operation of the cartridge loader 140 can be broken into two portions—an auxiliary portion 141 and the actual loading portion 143. In the auxiliary portion of loader operation, the incoming buffer is monitored for the presence of empty cartridges at step 350. As shown in step 352, the absence of an empty cartridge causes the loader 140 to signal the central computer 900 that empty cartridges are required at the loader 140. Similarly, a lack of IC packages available for loading causes the loader 140 to notify the central computer 900 that IC packages are not available for loading. Once a burn-in cartridge is selected for loading, the bar code reader scans the bar code label on the side face of the cartridge to identify the burn-in cartridge. This information is compared with an identification of the burn-in cartridges suitable for use with the particular lot number of IC packages to be loaded (step 354). A discrepancy causes the loader 140 to exchange the burn-in cartridge selected for loading.

When a suitable cartridge has been identified, a determination is made at step 356 as to whether the particular side face of the selected cartridge has already been loaded with IC packages; if the cartridge has been loaded it is transferred to the discharge buffer and the central computer 900 is so notified. If the discharge buffer lacks room for the loaded cartridge, the cartridge loader signals the central computer 900 to have the shuttle pick up cartridges from the discharge buffer.

Referring still to FIGS. 1 and 6, if the selected cartridge has an empty side face and the auxiliary portion of the loading operation is completed, the actual loading portion 143 of the operation can begin. The burn-in board cartridge is moved into loading position at step 358 by aligning the first row of cartridge sockets with the loading mechanism. At that time, the central computer 900 downloads a Good Socket Map, which identifies to the loader 140 the sockets that are functioning properly on the particular cartridge then in use, and IC packages are mounted in all good sockets in the pre-positioned row. A sensor detects if any IC package fails to mount properly in a socket. An IC package that does not mount properly is removed from the socket and dropped into a holding bin, and an attempt is made to mount another IC package in that socket. If two consecutive IC packages fail to mount in the same socket, the socket is considered defective and is deleted from the Good Socket Map.

When all of the good sockets in the row have been loaded, the cartridge loader 140 determines whether that row is the last row of the cartridge (step 360). A finding that it is not the last row initiates repositioning of the cartridge so that the next row is aligned with the loading mechanism. After all rows on a side face of the cartridge have been loaded, the identification of the cartridge and the side face, along with a Load Map, are sent to the central computer 900. In addition, if a two-sided cartridge is in use, the cartridge is rotated so that the other side face is in position for loading. The auxiliary portion 141 of the operation then begins for the second side face of the selected cartridge with a determination of the availability of IC packages, as described supra.

Loaded Cartridge Tester

Referring now to FIG. 1, after the cartridge is loaded, it may be transferred by the shuttle apparatus 210 to the loaded cartridge tester ("LBTS") 150, if testing is desired. The loaded cartridge tester 150 preferably includes an input buffer, a test station, and an output buffer. Loaded cartridges which are ready to be tested are placed in the input buffer, and tested cartridges are stored in the output buffer. Both buffers are capable of storing a plurality of cartridges. Transfer between the buffers and the test station is done automatically within the tester 150. Positioned in the input buffer or the test station is a bar code reader which scans the bar code label on the cartridge and identifies the cartridge and side face of the cartridge to be tested. A heat sensitive scanner is used in the tester 150 to sense the temperature of the IC packages during the testing process. In addition, the tester 150 preferably includes a loader means and an unloader means for the removal and replacement of defective IC packages and a mechanism for rotating a two sided burn-in cartridge if such a cartridge is used in the system. Finally, electrical test connectors are placed in the test station to provide power to the cartridge.

Figure 7A:
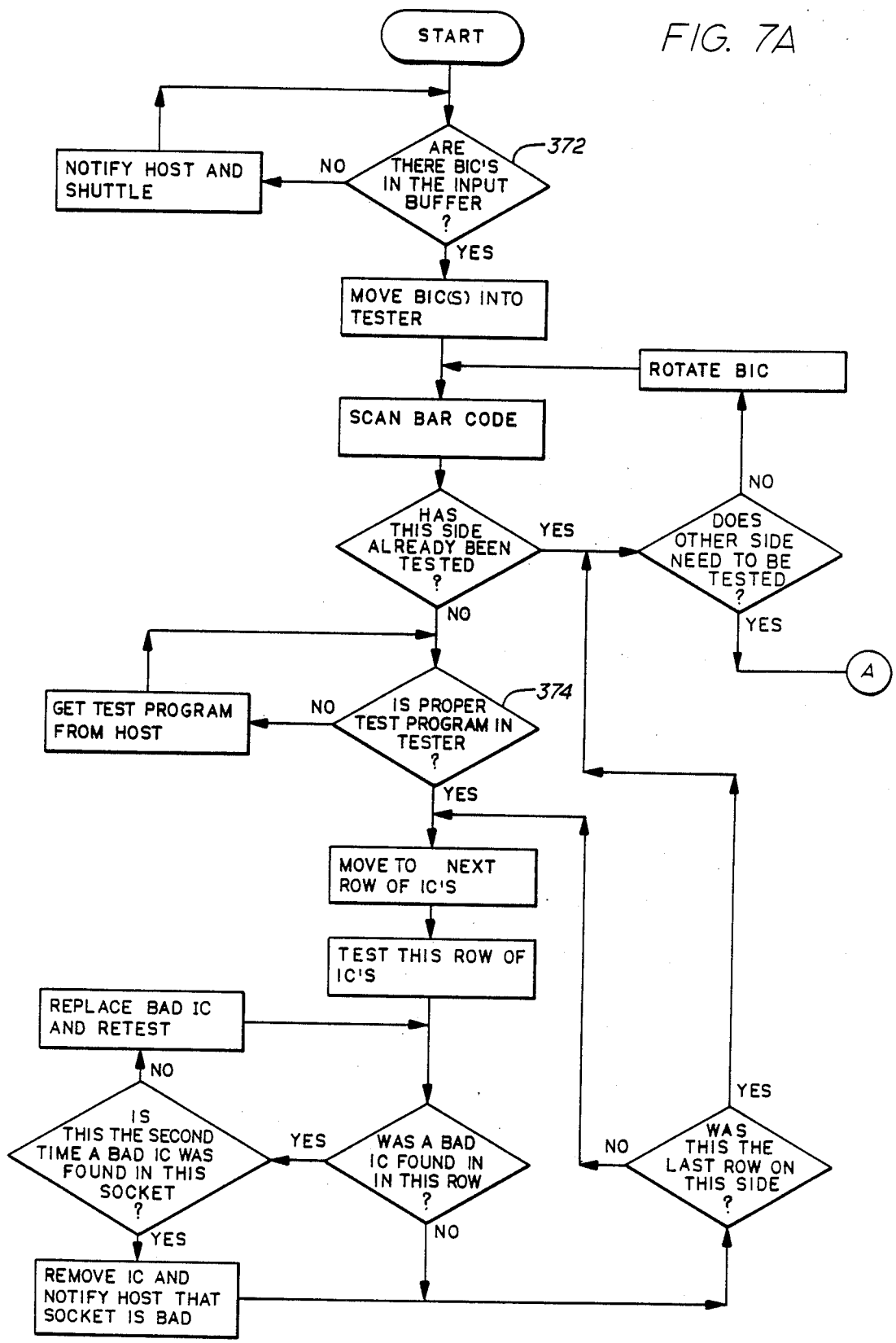
FIGS. 7A and B are an operational flow chart for the loaded cartridge tester.
Figure 7B:
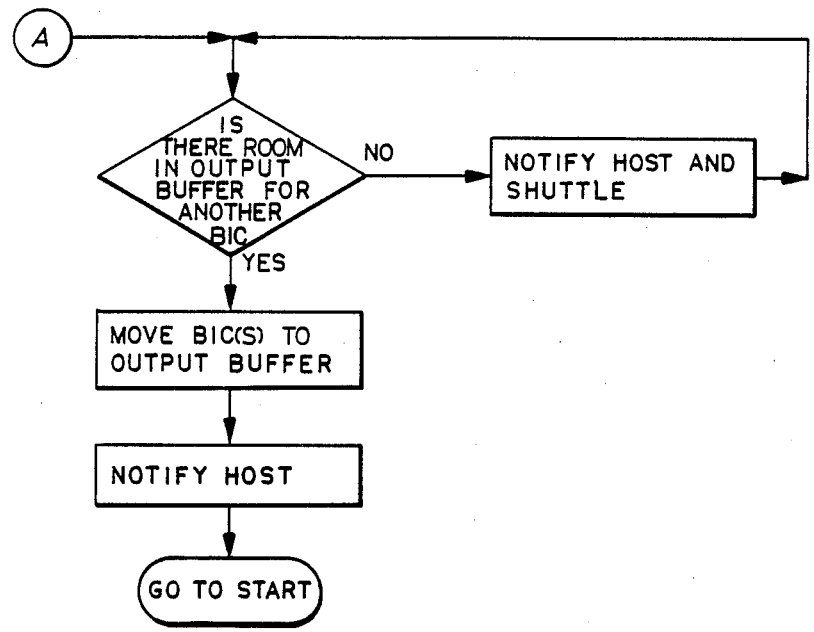

The loaded cartridge tester 150 includes a microprocessor to control tester operation. The tester 150 operates generally as shown in the flow chart of FIG. 7. Referring now to FIGS. 1 and 7, the loaded cartridge tester 150 initially monitors the presence of loaded cartridges in the input buffer at step 372; the absence of loaded cartridges is noted, and a signal reflecting the same is relayed to the central computer 900. A burn-in cartridge is automatically moved from the input buffer to the test station where the bar code reader scans the bar code label on one or both side faces of the cartridge to find a side face of the cartridge that has not been tested. If both sides of a two-sided cartridge have been tested, or if the side face of a single-sided cartridge has been tested, the cartridge is transferred to the output buffer, the central computer 900 is notified, and a new cartridge is sought.

On finding that a side face of the cartridge has not been tested, the loaded cartridge tester 150 determines whether the proper test program for that particular cartridge is present in the tester microprocessor (step 374); if necessary, the program is retrieved from the central computer 900. The IC packages then are tested row-by-row and simultaneously examined by the heat sensitive scanner to determine whether any of the IC packages are overheated or underheated. The unloader means removes IC packages not within a specified range of a particular temperature, and the loader means places the new IC packages in their place. If a new IC package also fails to exhibit an acceptable temperature, the tester 150 notifies the central computer 900 that the socket is defective. The loaded cartridge tester 150 therefore serves as a prescreening check to prevent damage to the burn-in system during the burn-in and testing that occurs in the burn-in chambers. After the last row of the cartridge is scanned, the loaded cartridge tester 150 rotates the two-sided cartridge and scans the opposite face to determine whether both sides have been tested. Tester operation then proceeds accordingly.

Burn-In Chambers

Referring now to FIG. 1, when prescreen testing is completed in the loaded cartridge tester 150, the cartridge is transferred to the burn-in chambers ("BICH") 160. A number of identical burn-in chambers may be provided; each burn-in chamber includes a plurality of electrical zones, all of which operate at the same temperature. In addition, each zone includes a number of slots ("n") for receiving burn-in cartridges. The number of slots ("n") may be, for example, four to eight slots. In the preferred embodiment, cartridges are loaded in the burn-in chambers horizontally from the shuttle apparatus 210, which passes alongside the burn-in system apparatus (FIG. 1). Alternatively, if an overhead shuttle is used, cartridges may be received vertically through the top of the burn-in chamber (FIG. 2).

Figure 8A:
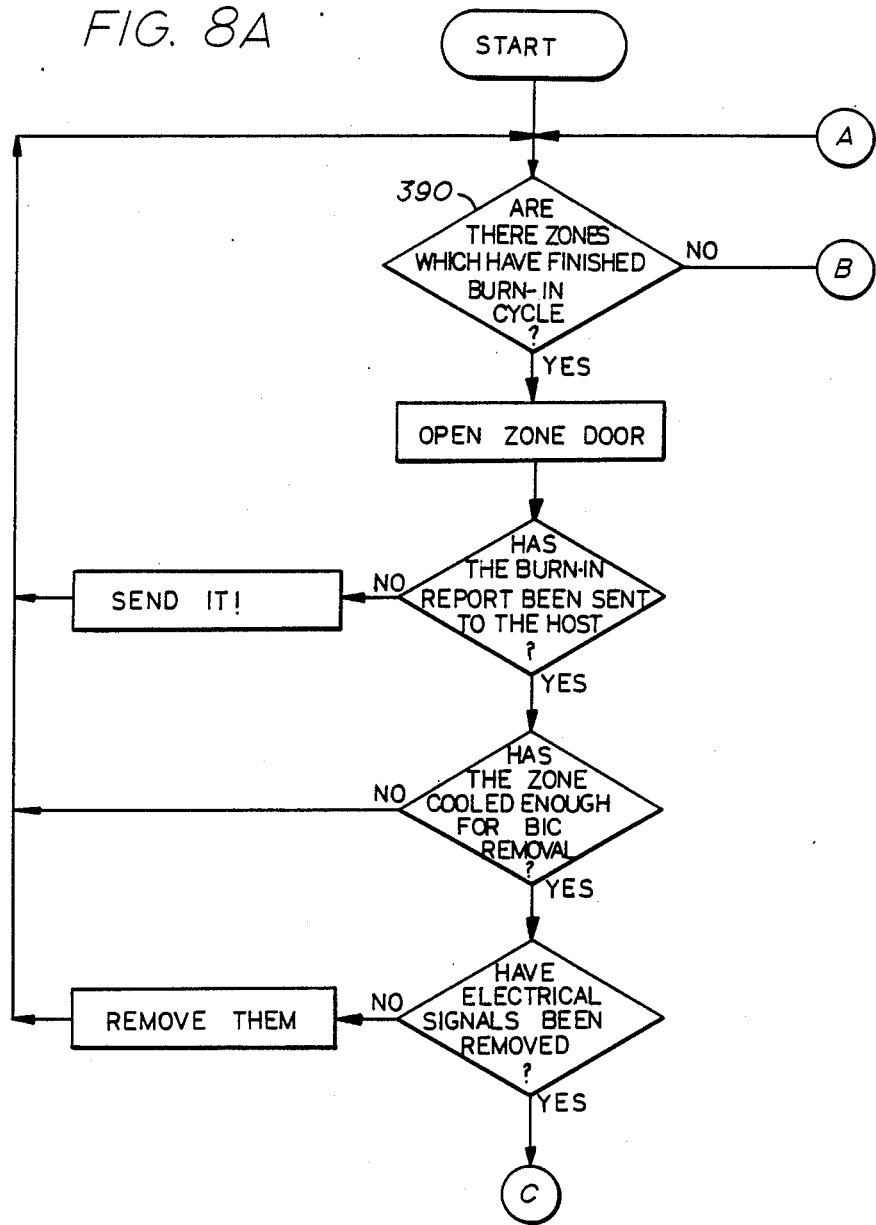
FIGS. 8A–C are an operational flow chart for handling the burn-in cartridge in the burn-in chamber.
Figure 8B:
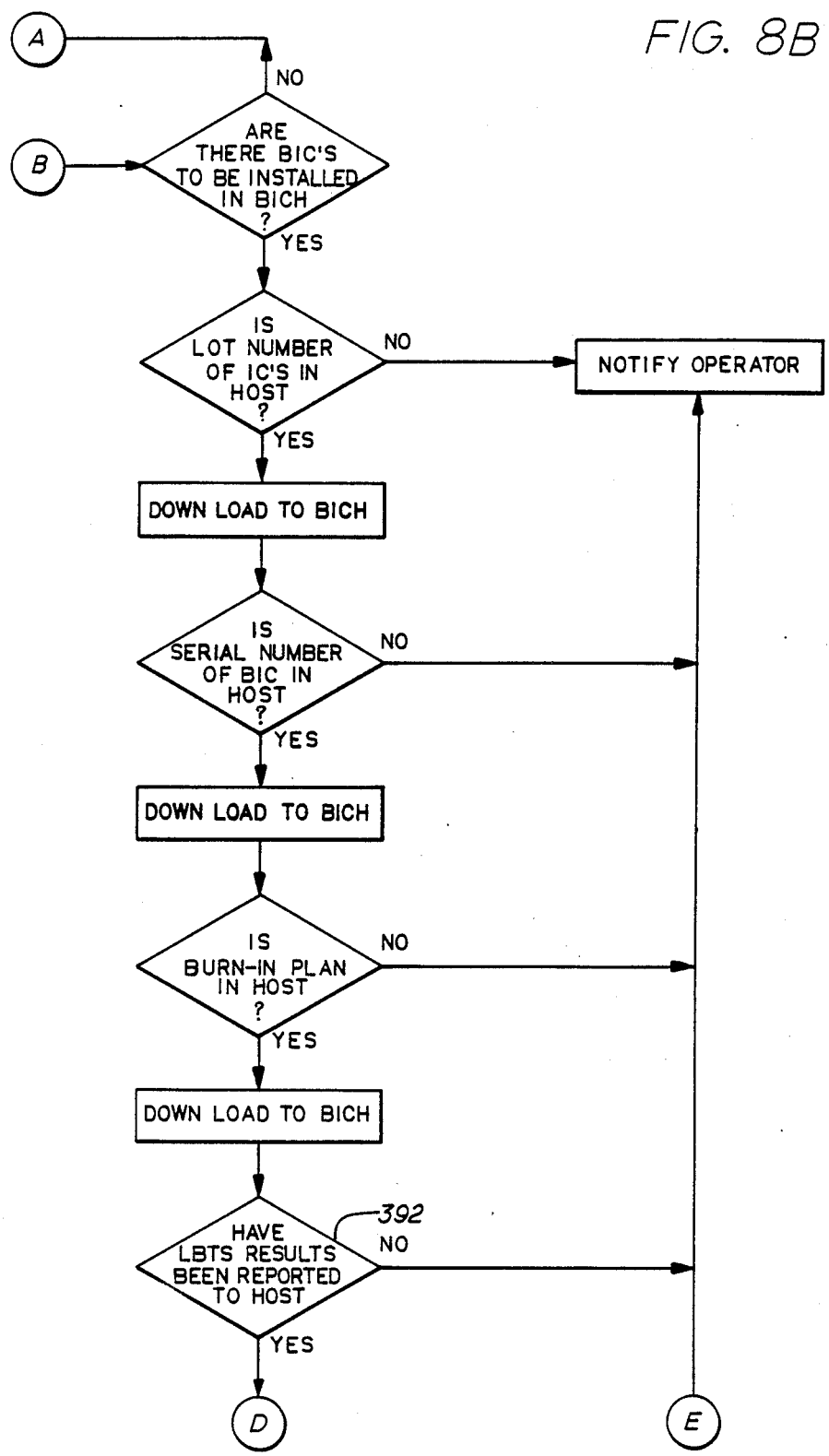
Figure 8C:
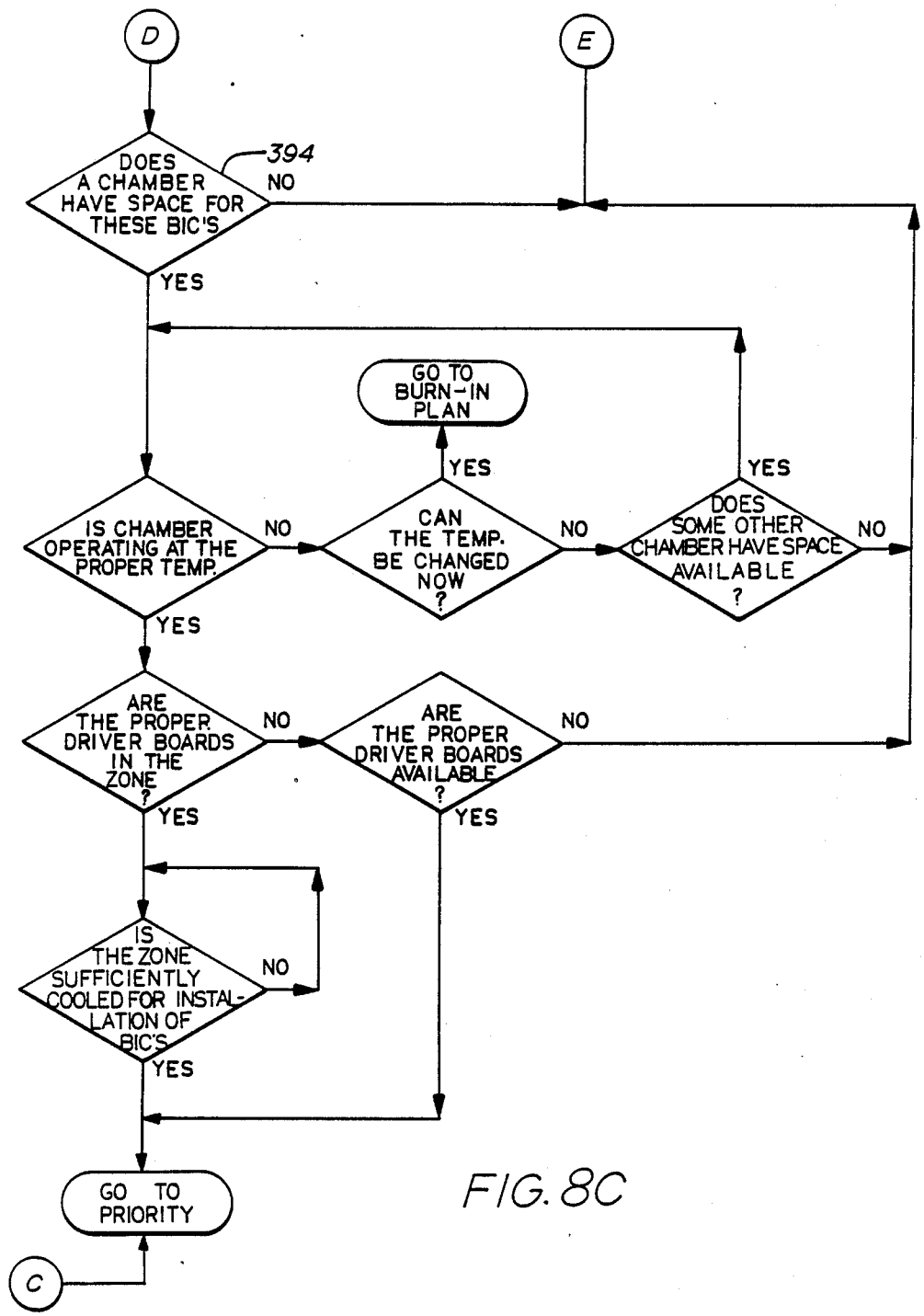

The operation of the burn-in chambers 160 is controlled by one or more microprocessors, programmed in accordance with the flow chart of FIG. 8. Referring now to FIGS. 1 and 8, the burn-in chamber initially examines each of the chamber zones at step 390 to determine whether any zones have completed a burn-in cycle. A determination that one of the zones has completed the burn-in cycle leads to an inquiry as to the availability of burn-in board cartridges requiring burn-in. When cartridges are available, the central computer 900 downloads relevant data, including the lot number of the IC packages, the serial number of the burn-in cartridge, and the burn-in plan. In addition, a check is made at step 392 to insure that the results from the loaded cartridge tester 150 have been reported to the central computer. If any of the cartridge data is missing from the central computer 900, the operator is alerted.

The burn-in chamber 160 then determines whether there is space in a chamber zone to accommodate one or more cartridges (step 394). If open slots are located in a zone, a determination is made as to whether the zone operating temperature is acceptable or, if not, whether it can be adjusted. If a zone with the proper operating temperature is located, a determination is made as to whether the proper driver boards are available.

Once the burn-in cartridges are installed by the shuttle apparatus 210, the burn-in cycle (which may include testing) commences. The performance of each IC package during the burn-in cycle is noted and reported to the central computer 900. Once a zone completes a burn-in cycle and the zone has cooled, and all electrical communication with the cartridges has ceased, the chamber 160 notifies the central computer 900 that the cartridges are ready for removal.

Cartridge Unloader

After the burn-in and testing process has been completed in the burn-in chambers 160, burn-in cartridges are transferred to the cartridge unloader-sorter ("USRT") 180. The cartridge unloader-sorter 180 includes an unloader input buffer, an unloading station, and an unloader discharge buffer. Cartridges are received in the unloader input buffer and then transferred to the unloading station for processing. The unloading station has associated with it a mechanism for rotating the cartridge (if necessary), an unloading mechanism for releasing IC packages from the sockets on the burn-in board cartridge, and a bar code reader for scanning the bar code label on each side face of the cartridge. The unloader preferably also includes means for sorting the IC packages according to performance grades in the event that the IC packages undergo testing and consequent grading within the burn-in chamber. Commonly assigned U.S. Pat. No. 4,584,764, entitled, "Automated Burn-In Board Unloader and Package Sorter," incorporated herein by reference, discloses a prior art unloader-sorter apparatus.

Figure 9A:
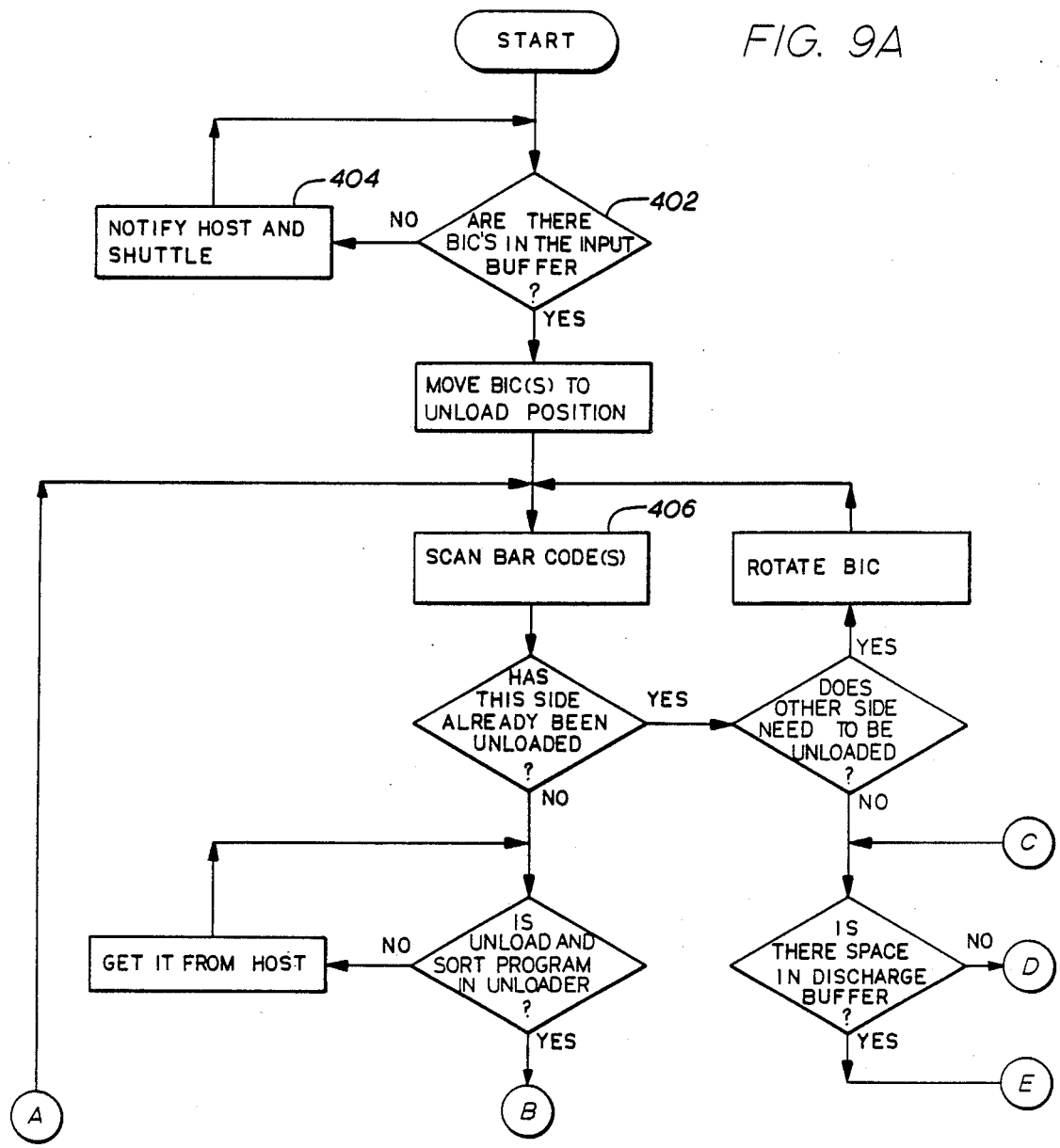
FIGS. 9A–C are an operational flow chart for the cartridge unloader/sorter.
Figure 9B:
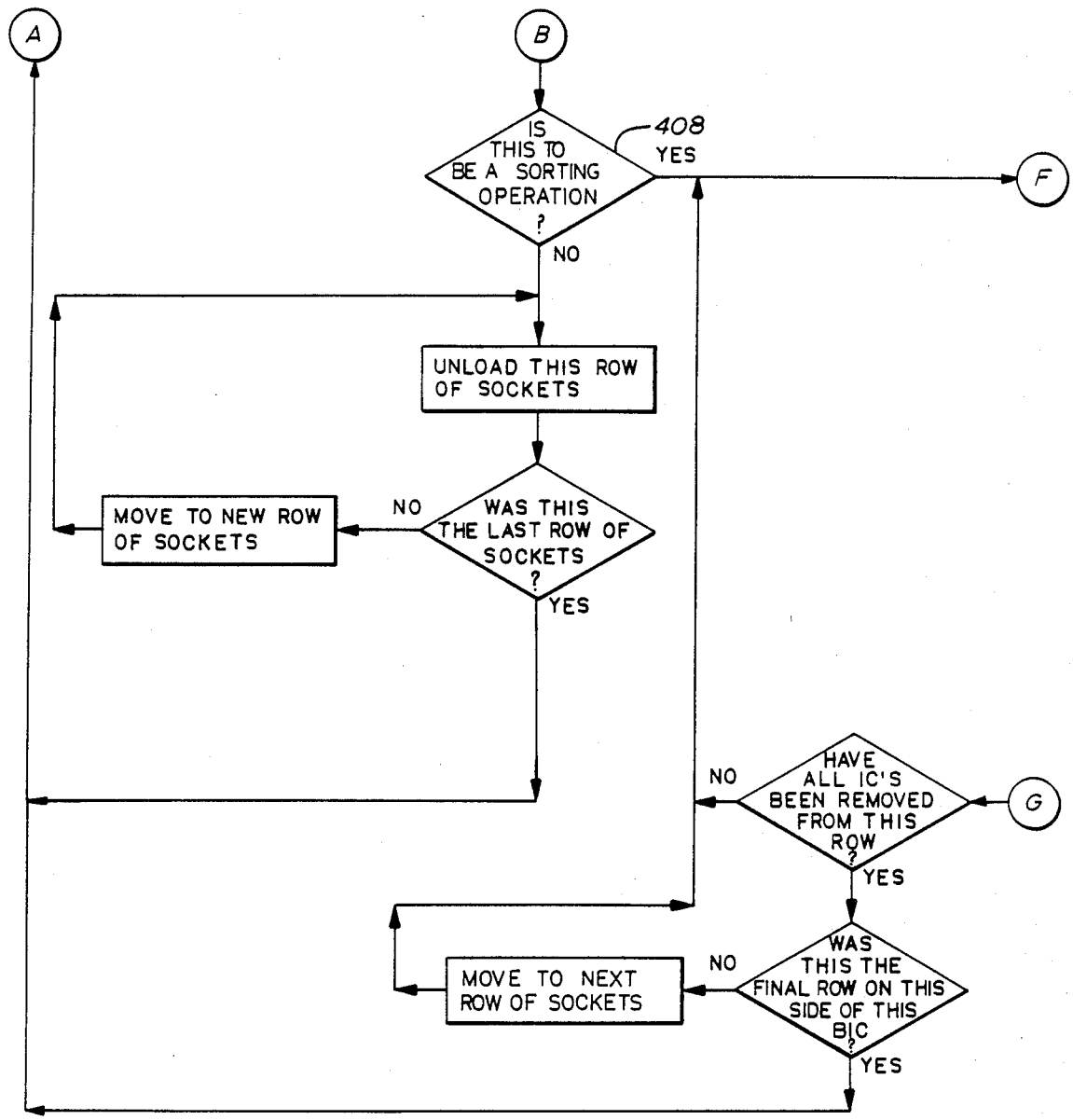
Figure 9C:
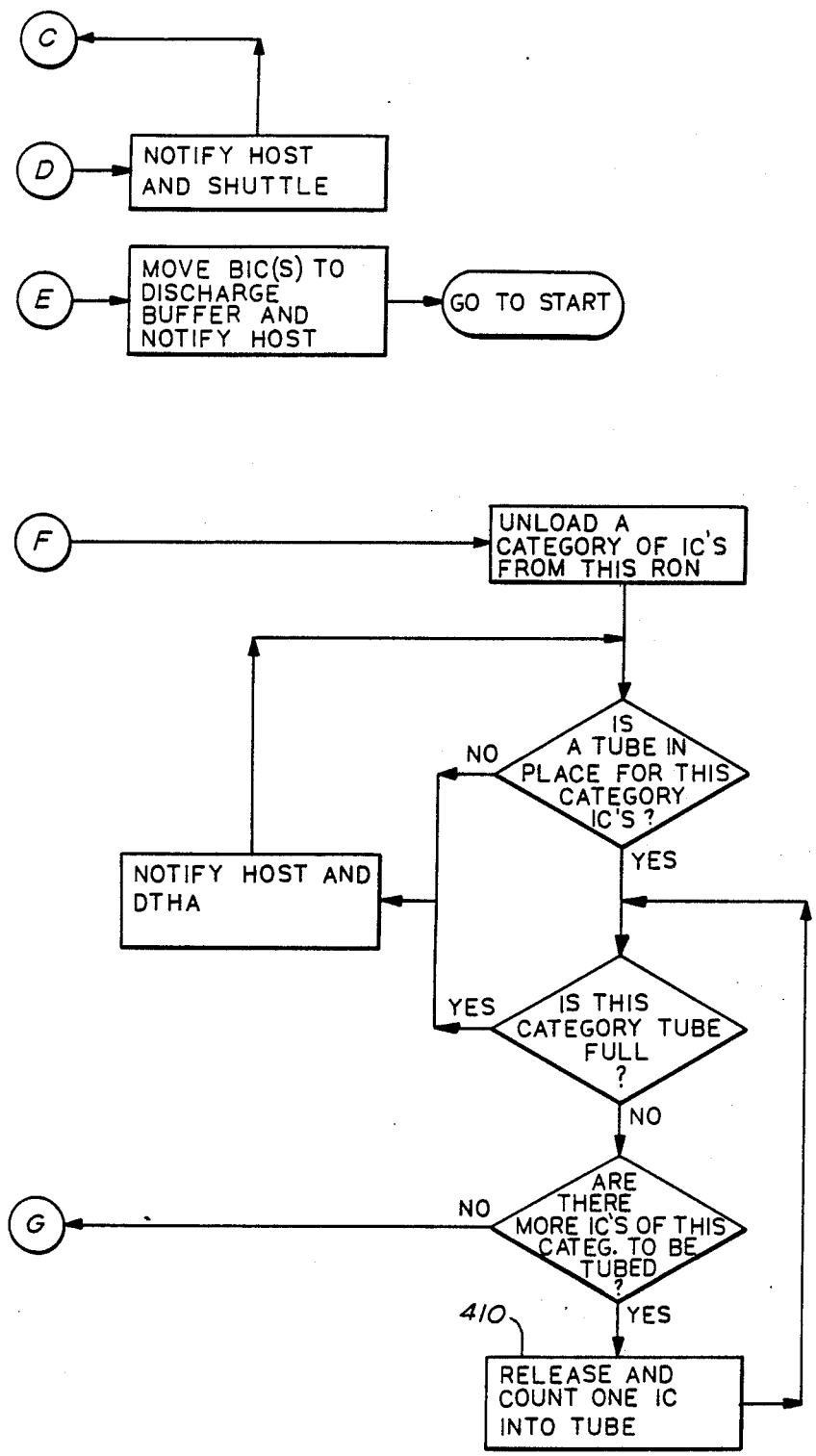
Figure 10A:
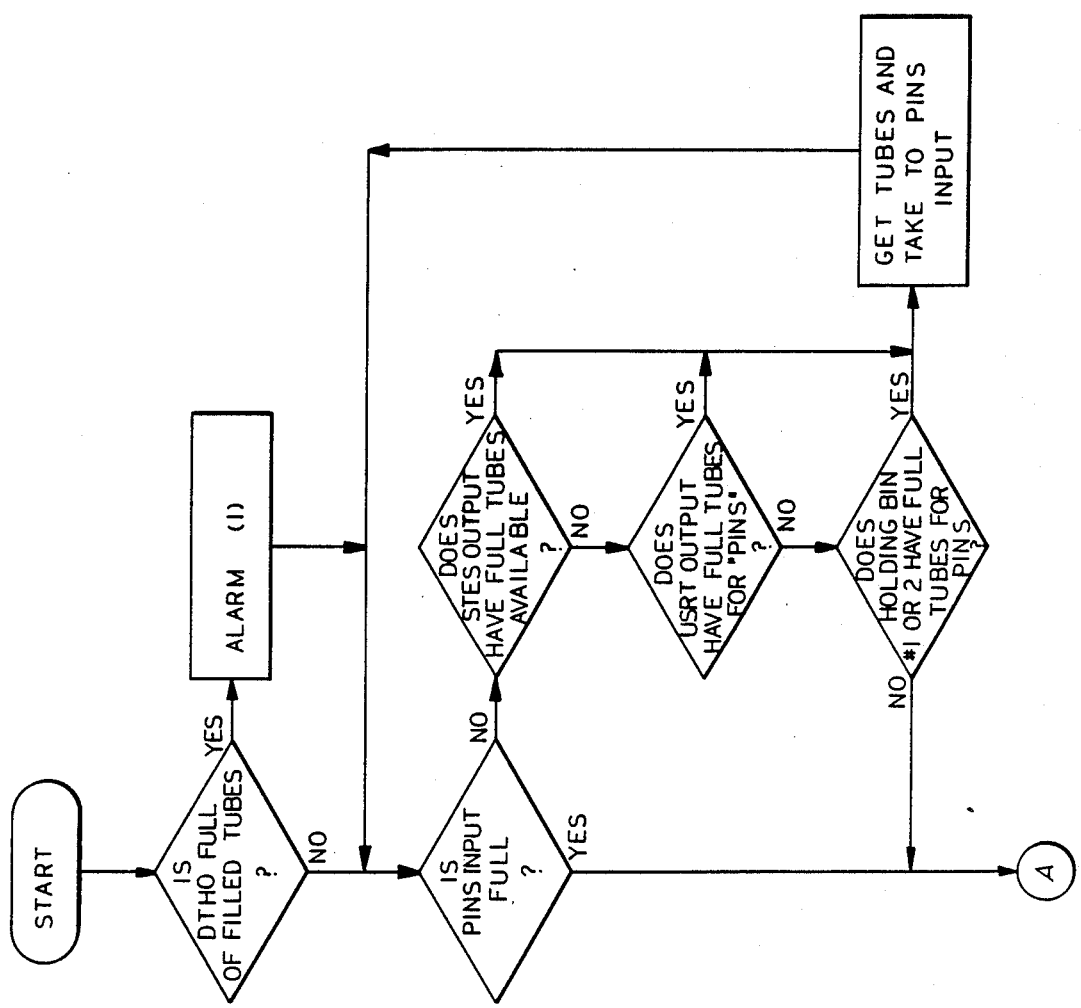
FIGS. 10 A–I are an operational flow chart for the discharge tube handler.
Figure 10B:
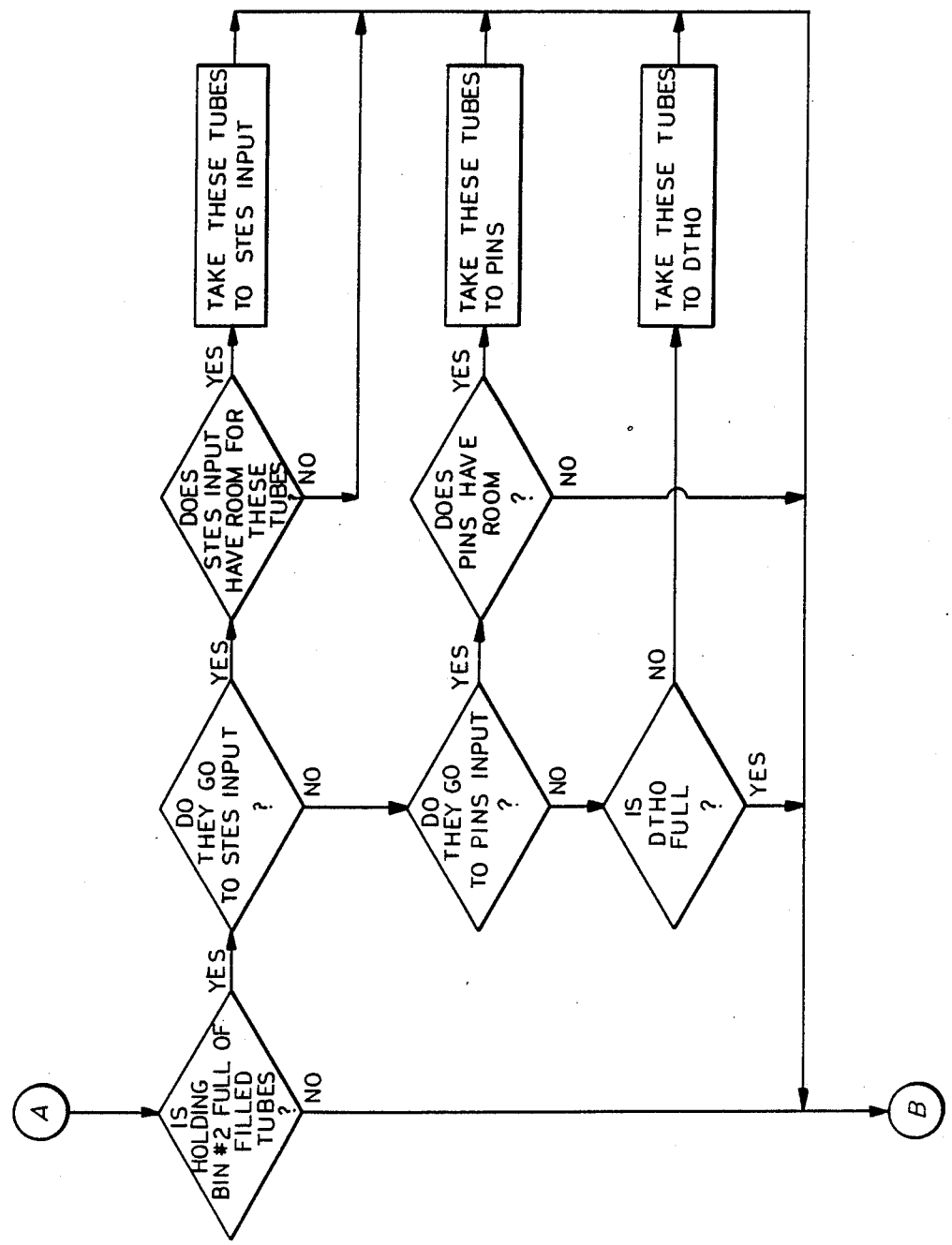
Figure 10C:
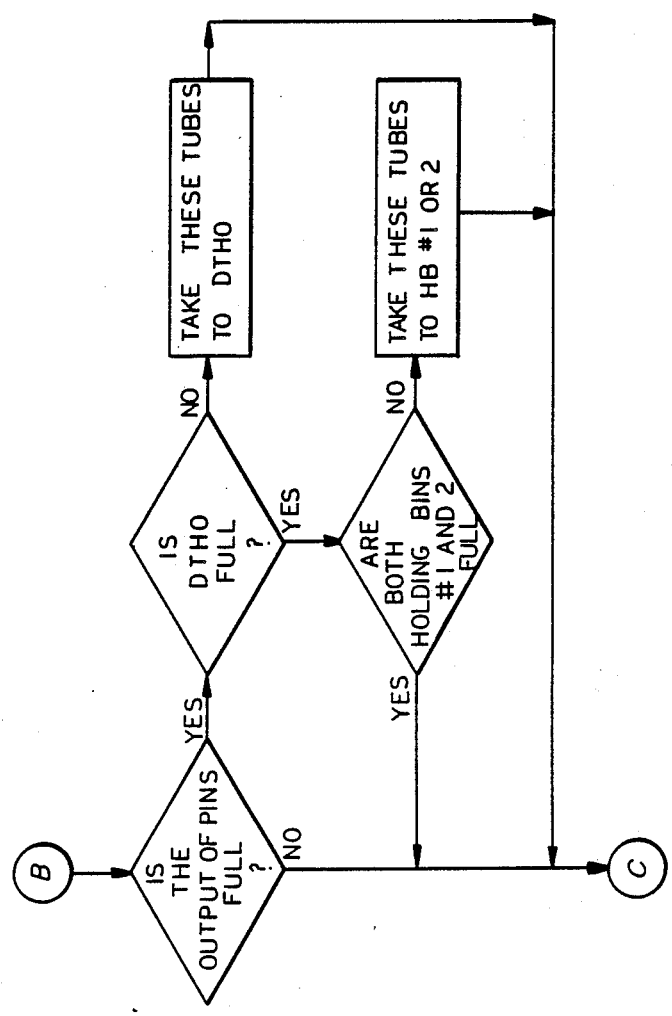
Figure 10D:
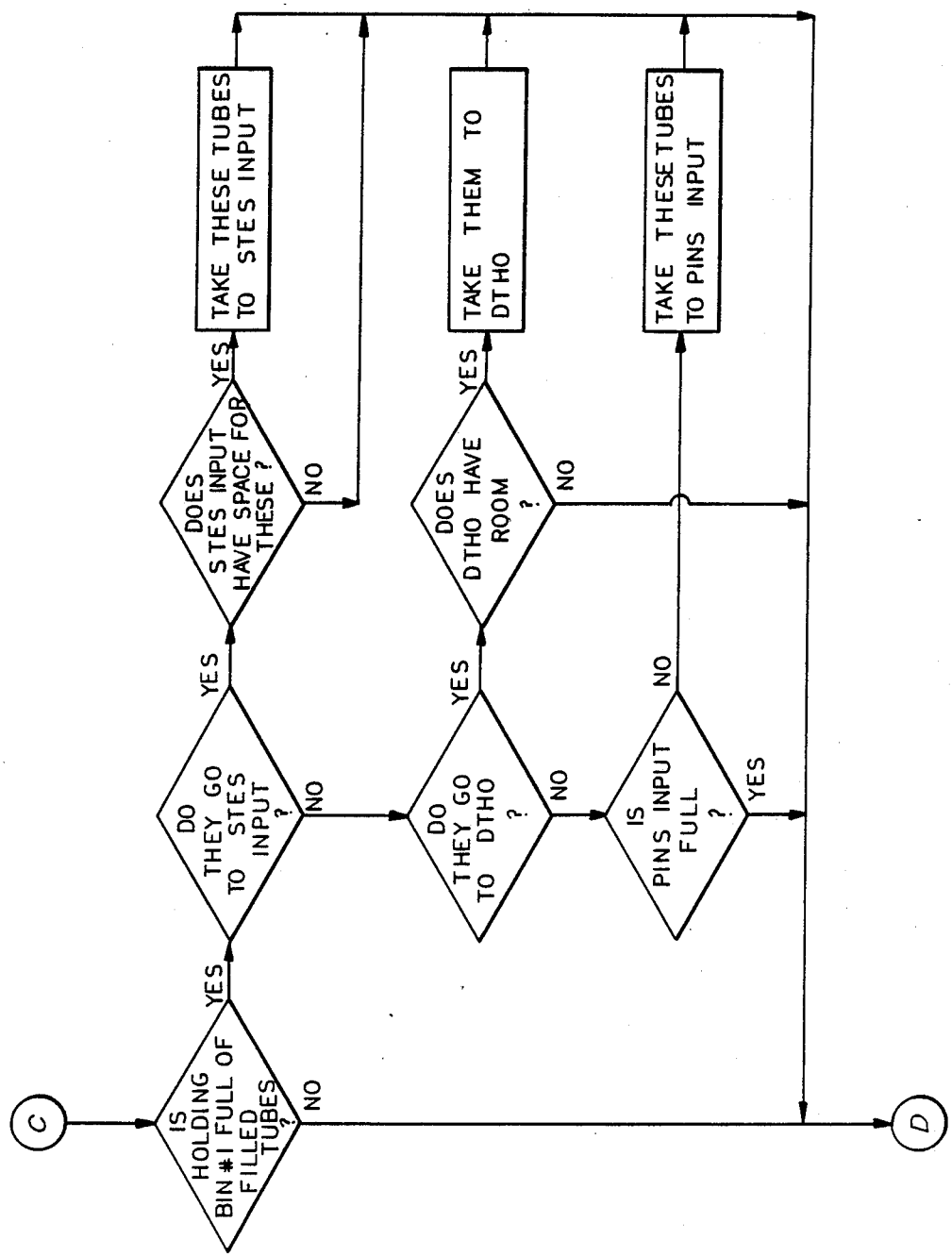
Figure 10E:
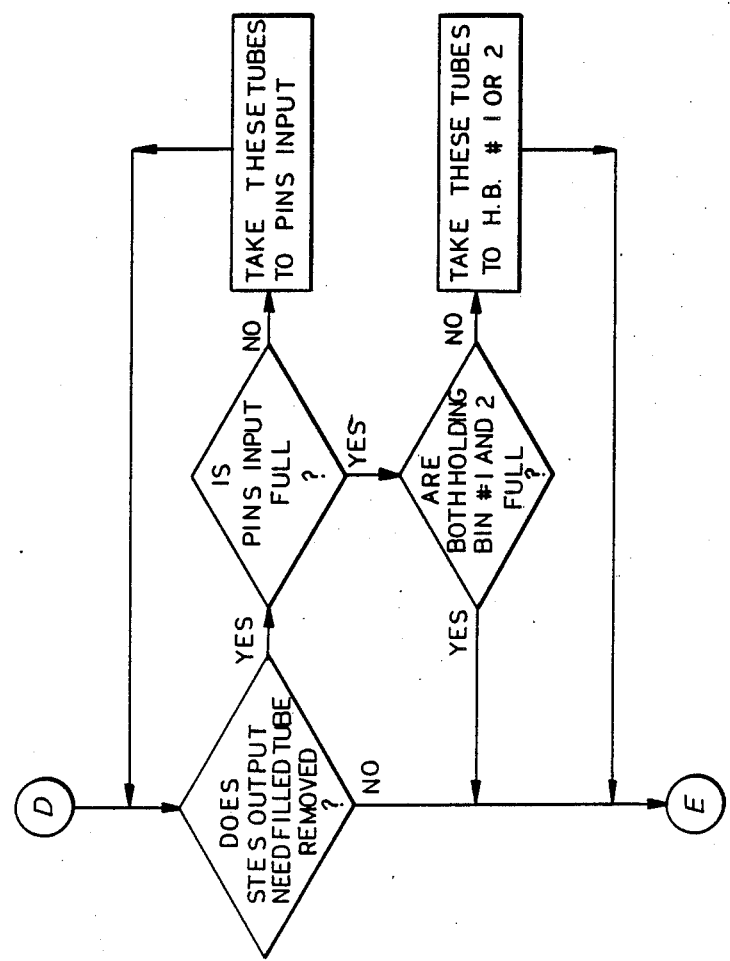
Figure 10F:
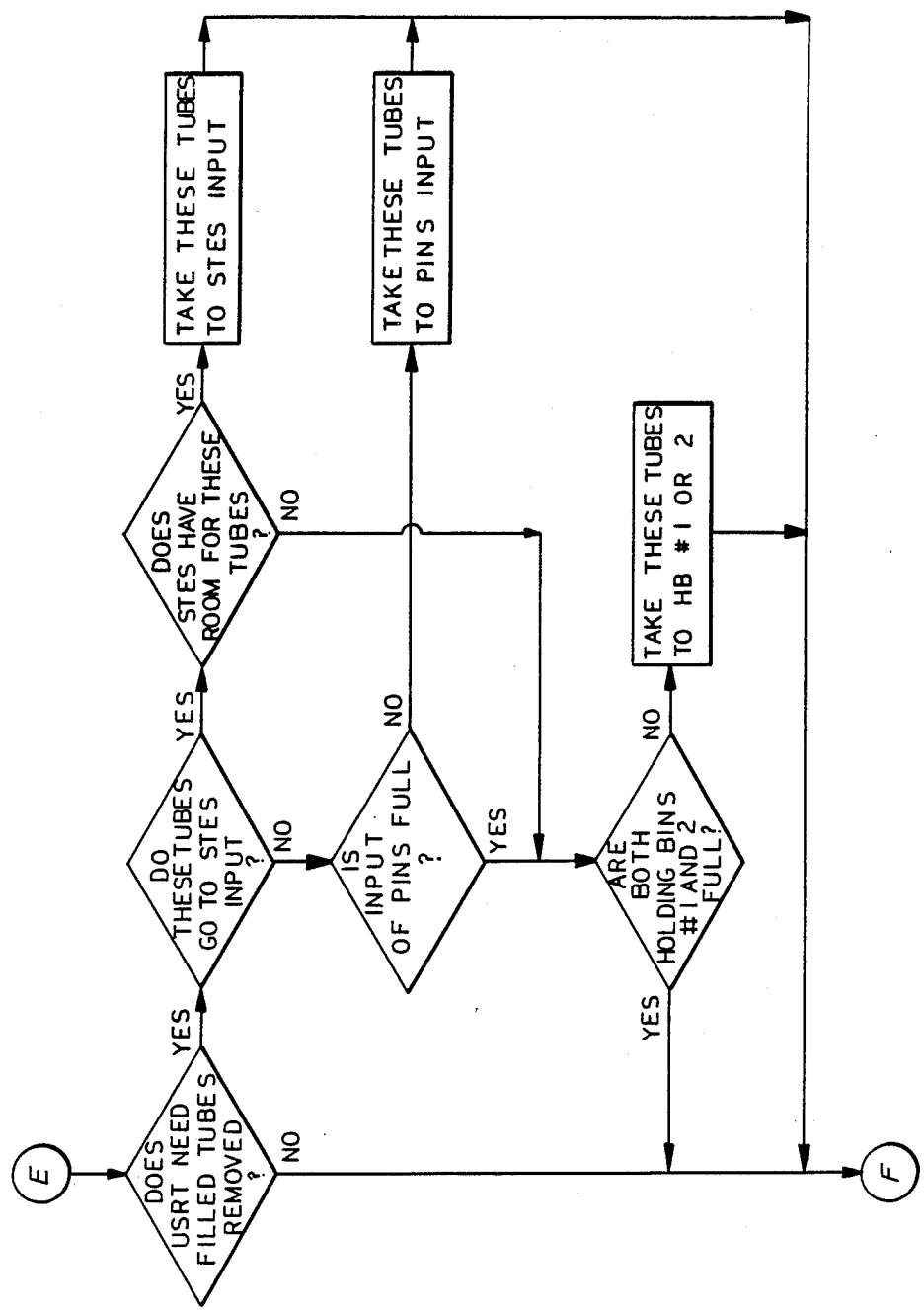
Figure 10G:
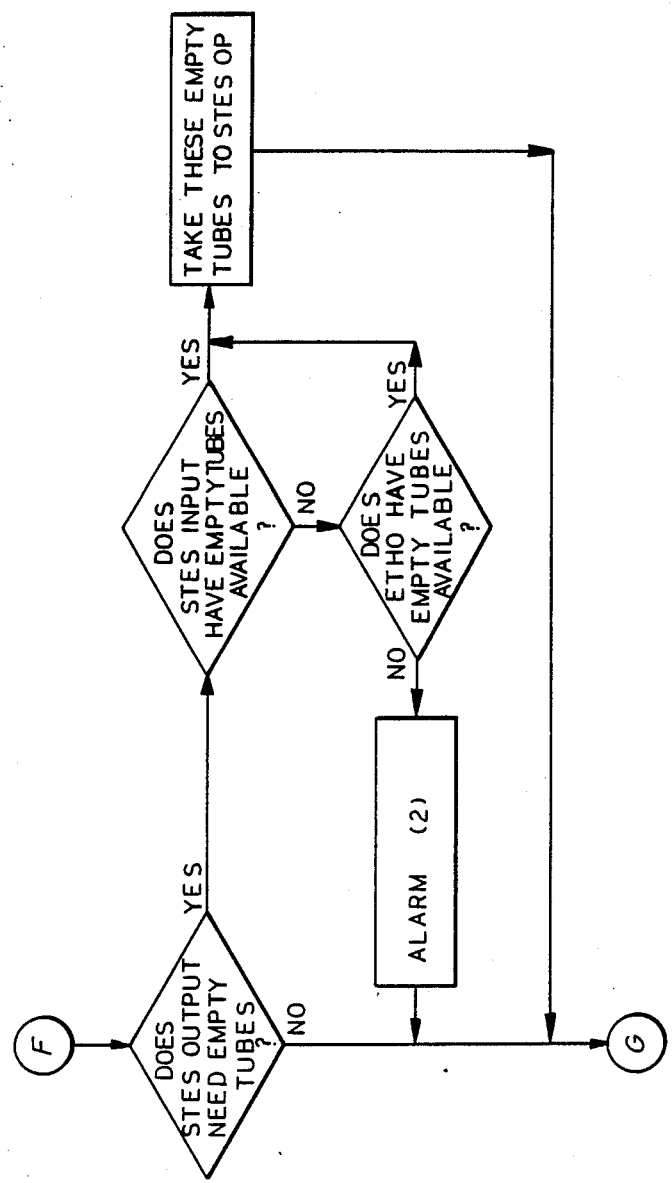
Figure 10H:
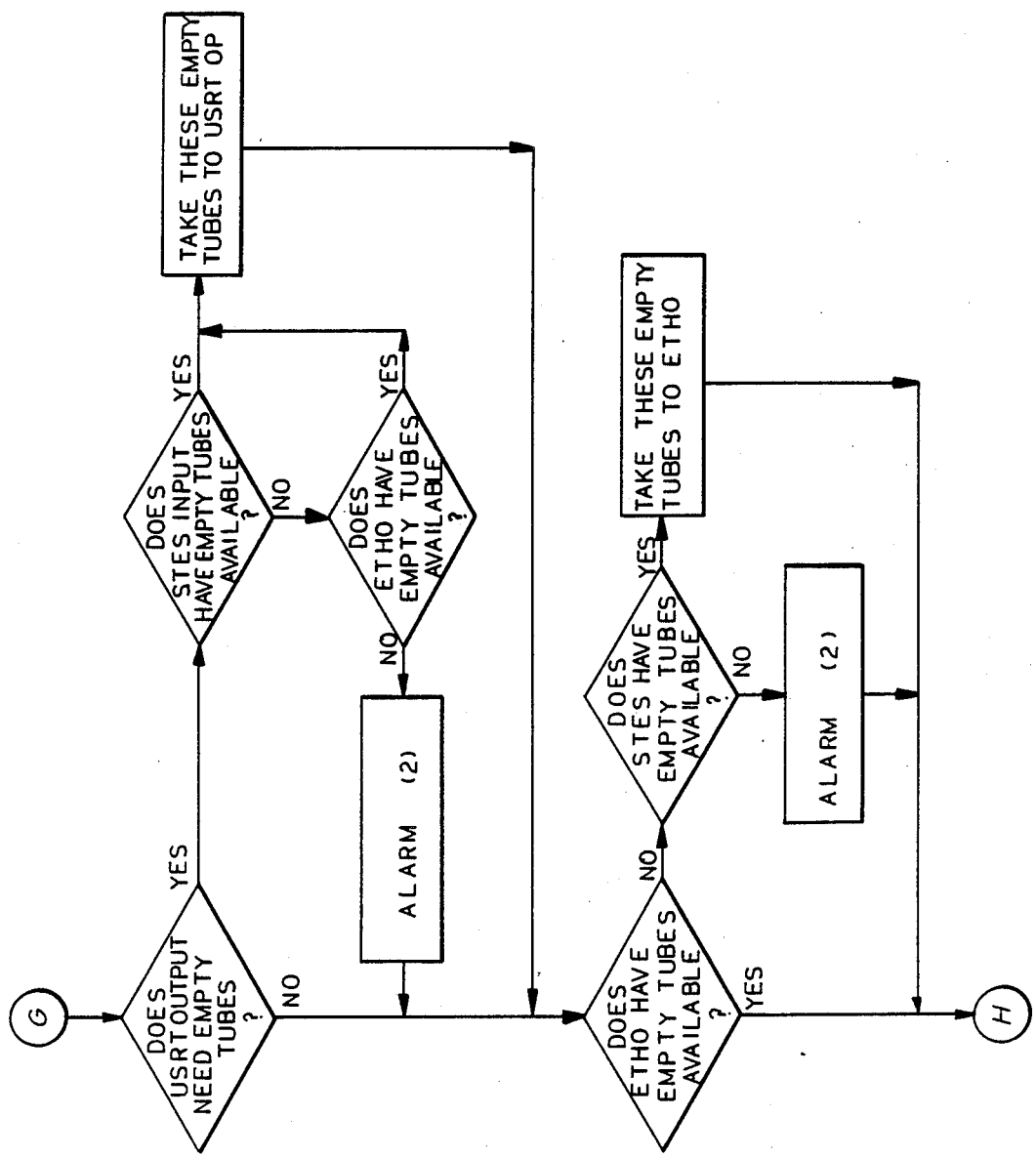
Figure 101:
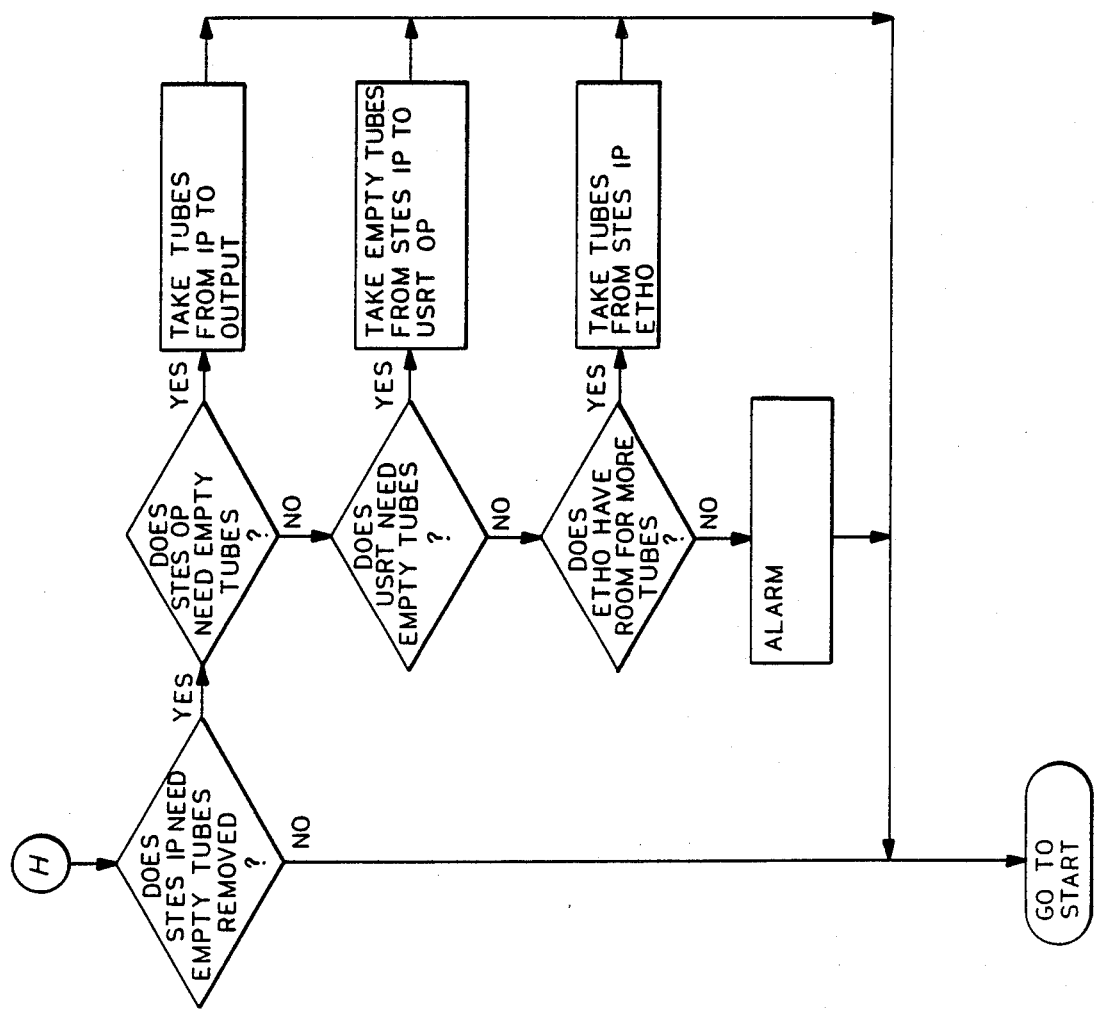

An on-board microprocessor controls operation of the unloader-sorter 180 as shown generally in the flow chart in FIG. 9. Referring now to FIGS. 1 and 9, the unloader-sorter 180 begins operation (step 402) by monitoring the presence of burn-in cartridges in the unloader input buffer. As shown in step 404, the central computer 900 is informed of the absence of cartridges in the input buffer. A cartridge in the input buffer is moved automatically to the unloading station and the bar code label on one or both of the cartridge side faces is scanned by the bar code reader in an attempt to locate a side face loaded with IC packages. If the cartridge has already been completely unloaded, it is transferred to the unloader discharge buffer, and another burn-in cartridge is removed from the input buffer.

When a cartridge side face with IC packages is located, the appropriate unload and sort program is downloaded from the central computer 900 to the unloader 180. Before the unloader 180 begins to unload the cartridge, it determines whether a sorting operation is to take place (step 408). In instances where no sorting is to occur, the unloading mechanism then unloads IC packages from the cartridge row-by-row. After all rows are unloaded, the cartridge, if two-sided, is rotated and the bar code scanner examines the label on the other side face of the cartridge to determine whether unloading is required (step 406).

In the preferred embodiment, if a sorting operation is to take place, the unloading mechanism is instructed to unload a particular grade of IC package from the cartridge row presently aligned with the unloading mechanism. The unloader 180 confirms that a storage container ("tube") is in place for receiving the particular grade of IC package and that the tube has room to accommodate additional IC packages. As each IC package of the particular grade is released and delivered to a tube, it is counted by the unloader 180 (step 410). A bar code scanner identifies the particular tube and the unloader/sorter communicates this information, along with the lot number of the IC packages placed therein, to the central computer 900. After all the IC packages of a particular grade are removed from the row being unloaded, the unloader determines whether all IC packages have been unloaded from that row. If any IC packages remain, another grade of IC packages is unloaded, and the process is repeated until the row is completely unloaded. Once the row is unloaded, the cartridge is repositioned to the next row of IC packages, and the row is unloaded by grade of IC packages. When all rows are unloaded, the cartridge, if two-sided, is rotated and operation picks up at step 406 with the scanning of the bar code label.

Discharge Tube Handler

Figure 12A:
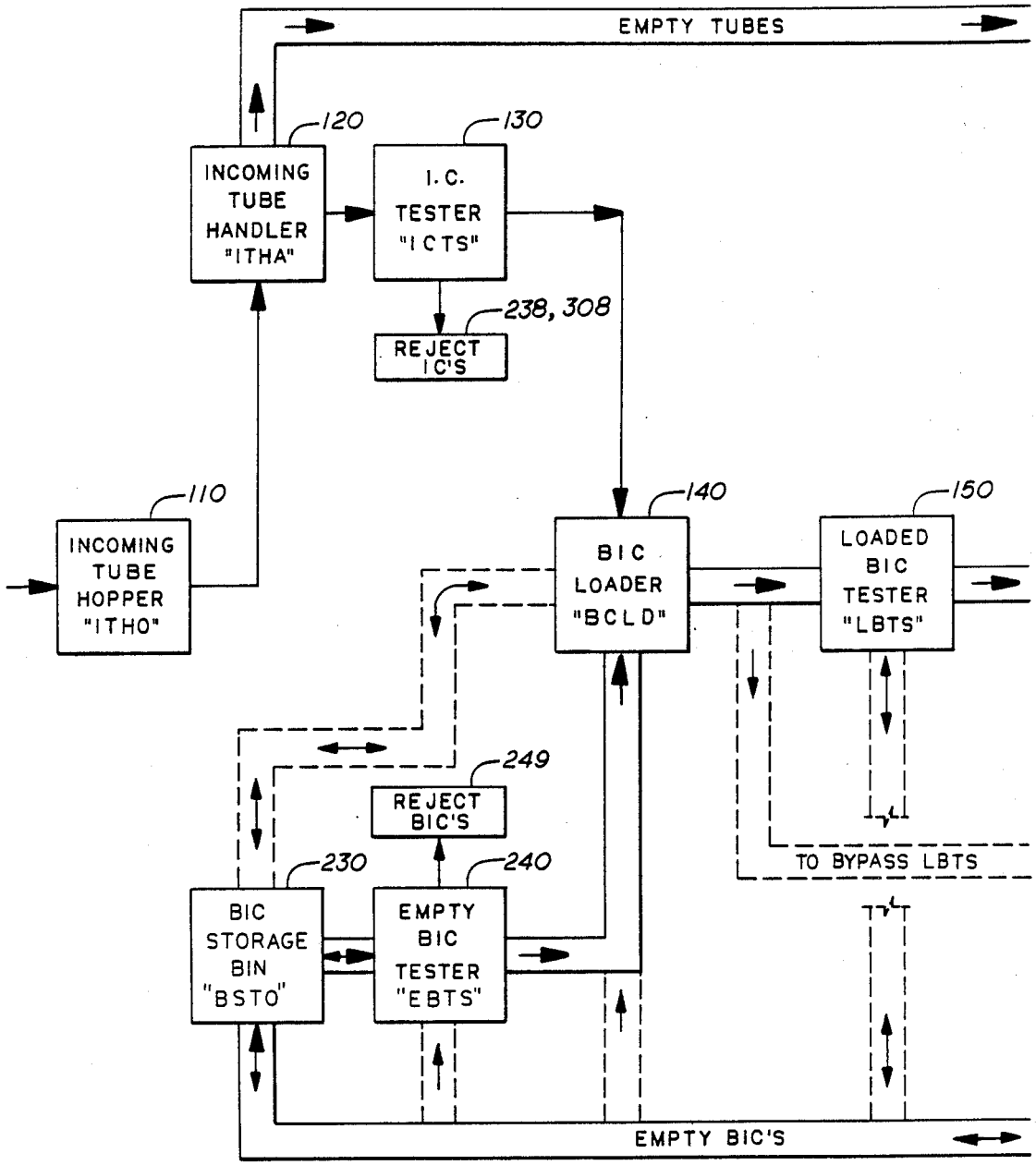
FIGS. 12A and B are a flow chart depicting the preferred flow of IC packages and cartridges among individual units of the burn-in system.
Figure 12B:
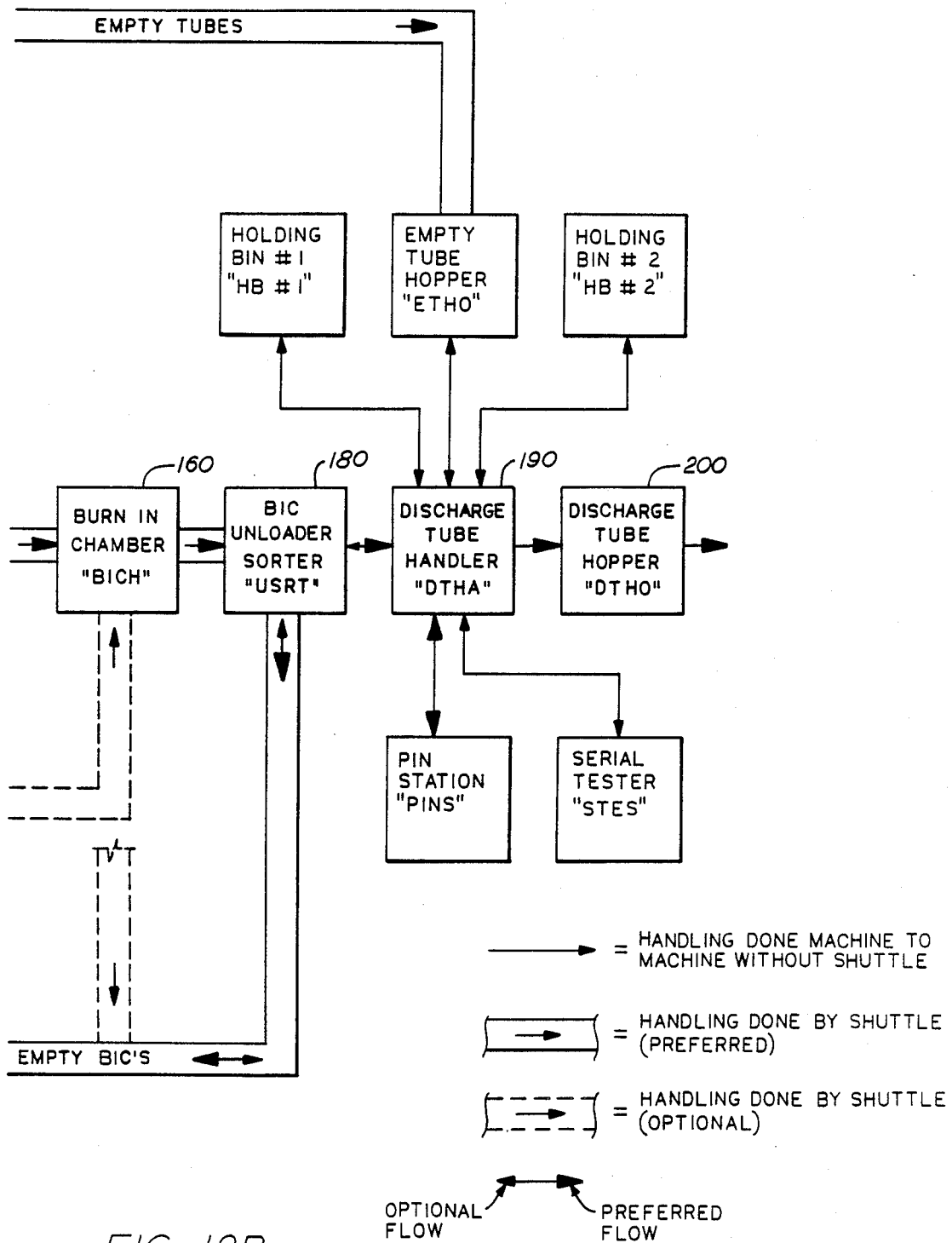
Figure 13A:
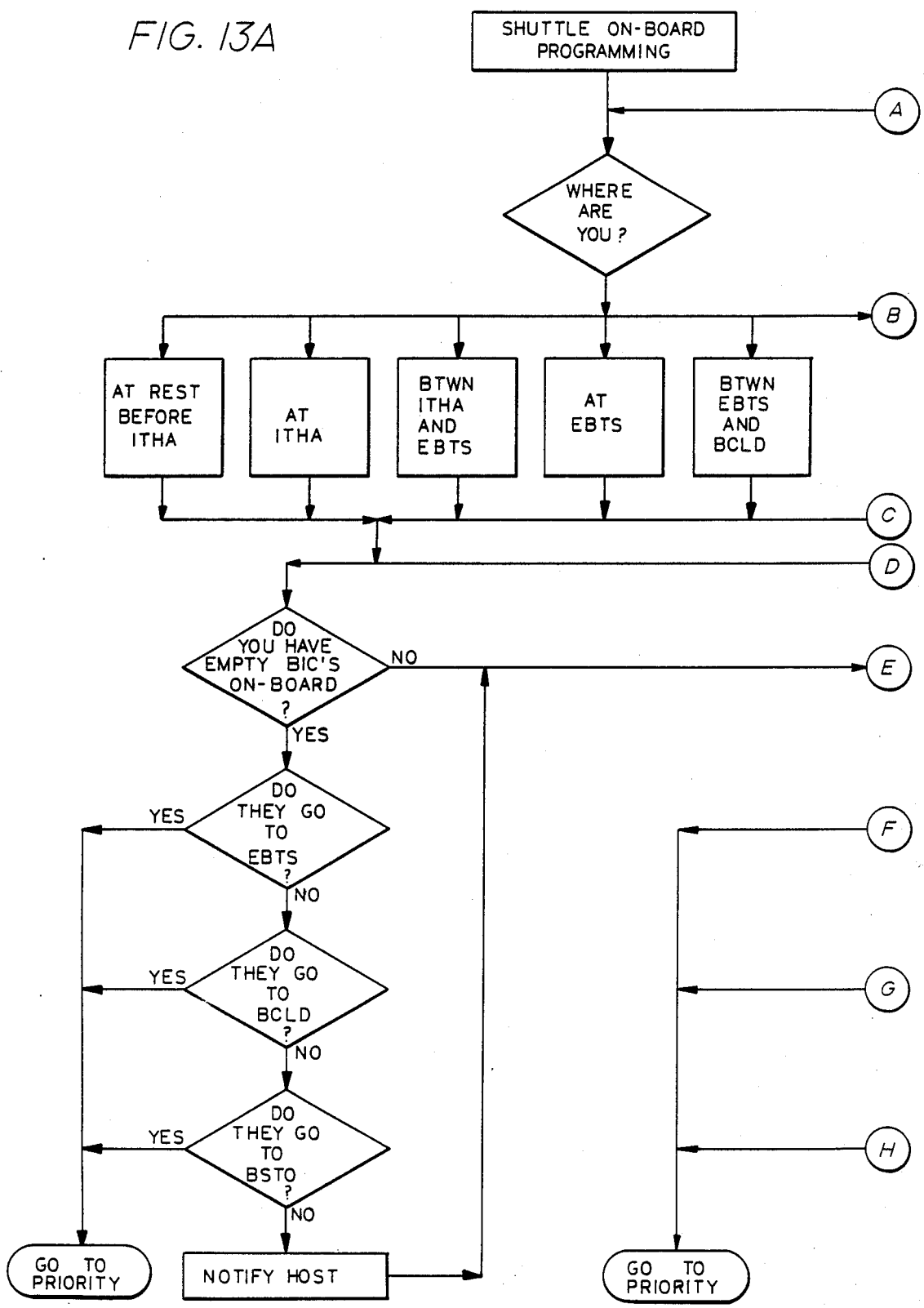
FIGS. 13A–D are an operational flow chart for the shuttle apparatus.
Figure 13B:
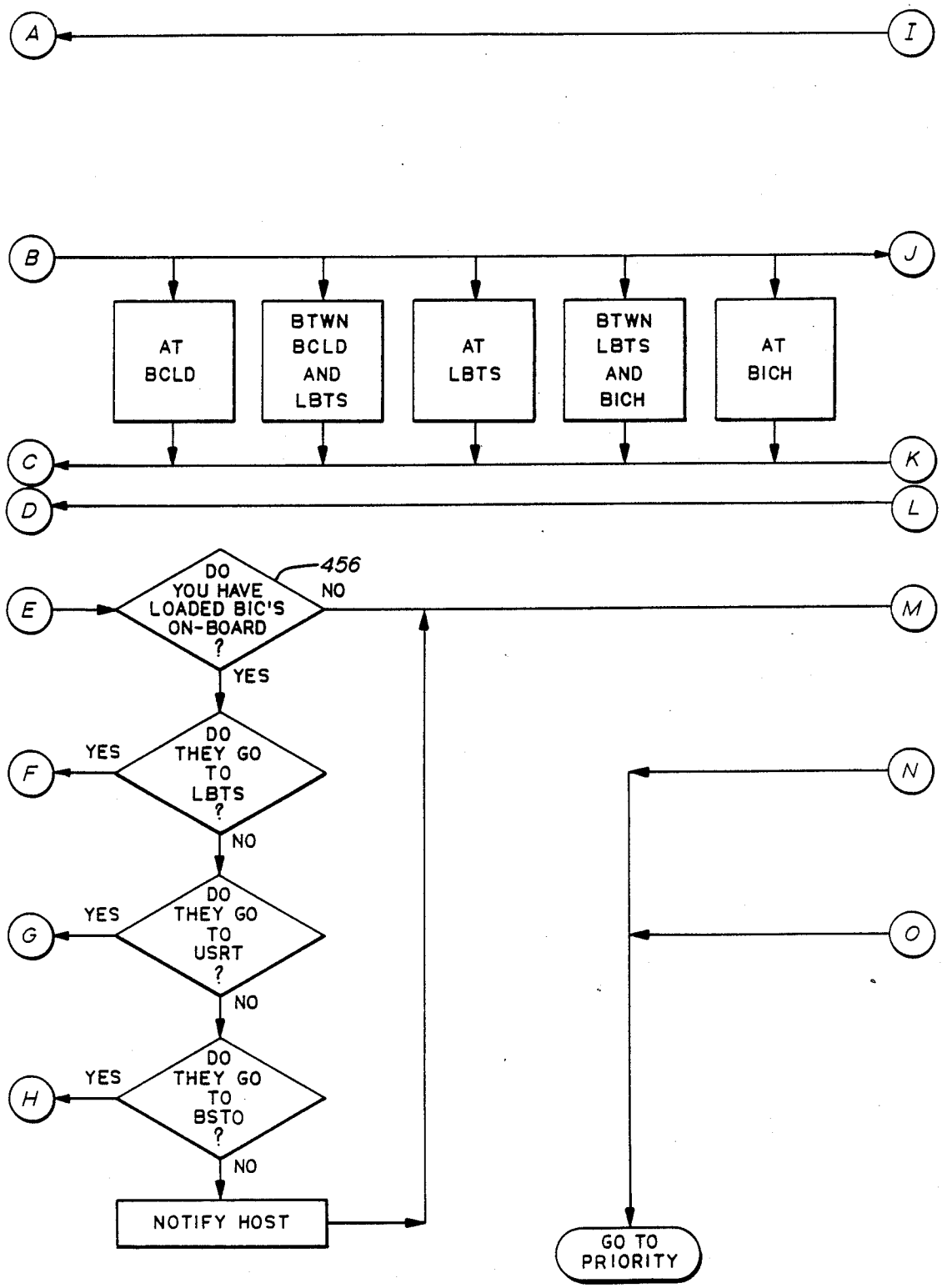
Figure 13C:
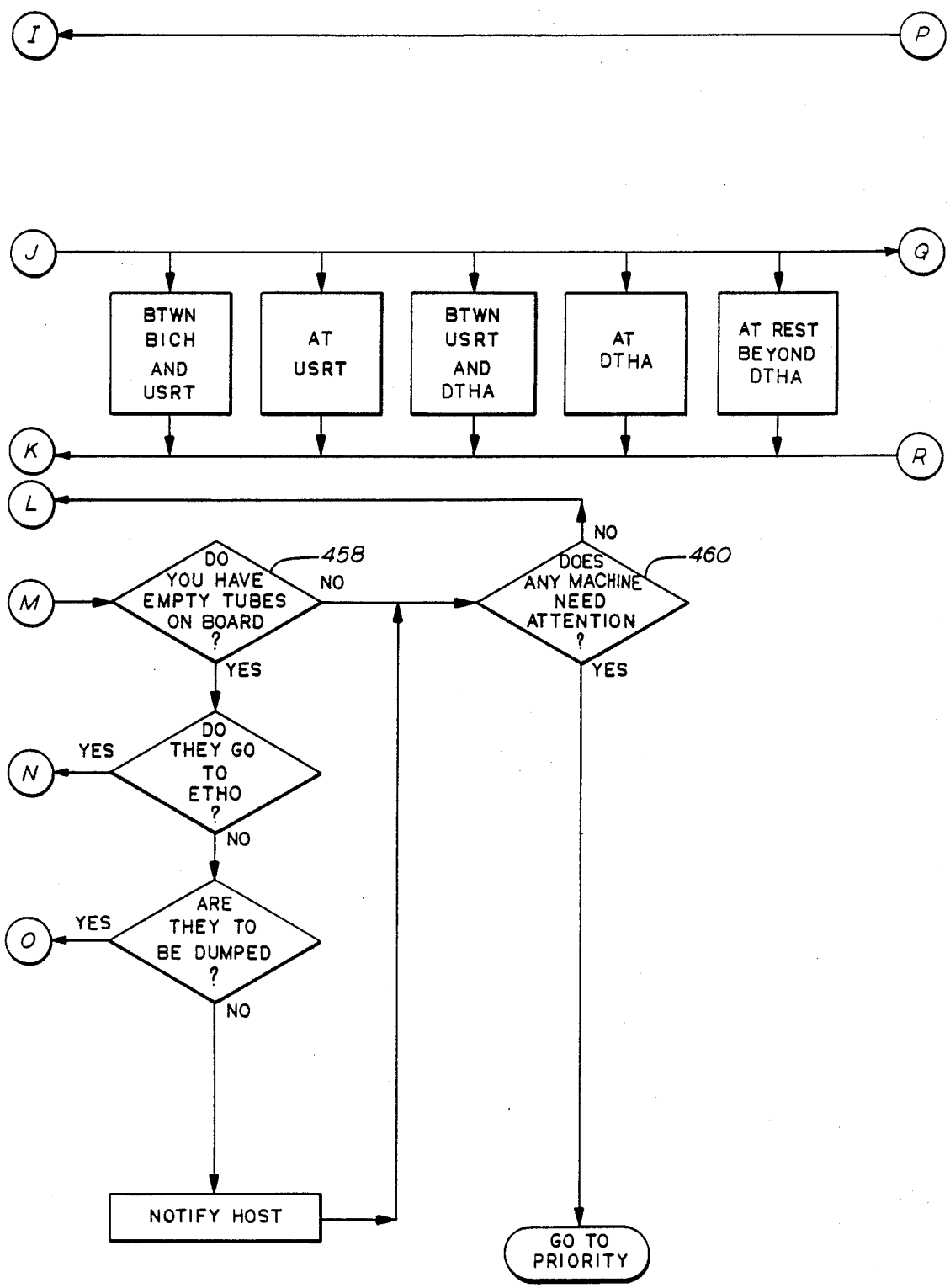
Figure 13D:
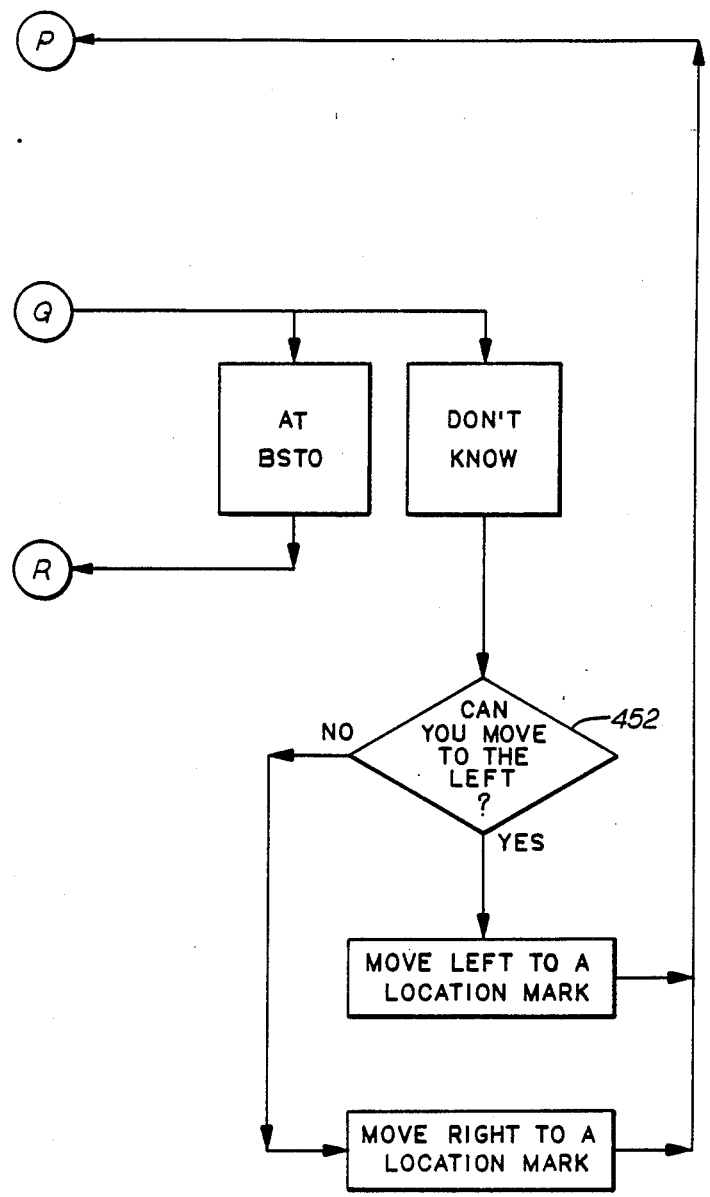

The discharge tube handler ("THDE") 190 coordinates the flow of IC packages in storage tubes from the unloader/sorter 180 to the discharge tube hopper 200, diverting tubes of IC packages to the serial tester 185 when testing is desired, as shown in FIGS. 1, 2, and 12. The serial IC tester 185 performs parametric tests on the IC packages. A pin station 265, associated with the tube handler 190, caps the full tubes before the tubes are placed in the discharge tube hopper 200. In addition, the pin station 265 may mark the individual IC packages according to performance during testing. If marking is desired, the tube is emptied onto a track similar to that used in the IC tester 130. The packages are marked and then pass down the track into an empty tube; the tube is pinned after all IC packages have descended down the track. The tube handler 190 can also place tubes in a pair of holding bins 280, 285 which serve as temporary storage areas for full tubes passing to and from the serial tester 185 and to and from the pin station 265. The tube handler 190 receives empty tubes from an empty tube hopper 255, which stores empty tubes received from the incoming tube handler 190 by means of an operator or the shuttle apparatus 210. Consequently, the empty tube hopper 255 is preferably positioned adjacent the discharge tube handler 190 in a manner permitting access thereto by the shuttle apparatus 210.

The operational flow chart for the tube handler 190 is shown in FIG. 10, and a microprocessor is programmed accordingly to control discharge handler operation. The tube handler 190 obtains empty tubes from the empty tube hopper 255 and places these tubes at the output of the unloader 180 and at the output of the serial IC tester 185 as required. The tube handler 190 monitors the level of IC packages in the tubes at the cartridge unloader 180 (step 420). Once a tube is full of IC packages, the handler 190 distinguishes between sorted IC packages and unsorted IC packages. Sorted IC packages are removed in tubes by performance grade while unsorted IC packages are removed uniformly in their tubes. When serial testing is required, the tube handler removes the tube full of IC packages from the unloader 180 and deposits it at the input of the serial tester 185 or at holding bins 280,285 if space is unavailable at the serial tester. The tubes are fed to the serial tester 185 by category when a sorting operation occurs at the unloader-sorter 180.

In situations where serial testing is unnecessary, or after serial testing is completed, the discharge tube handler 190 places the tube at the input of the pin station 265. Alternatively, the tube may be placed at holding bins 280,285 until space becomes available at the pin station.

The tubes are capped at pin station 265, picked up by the tube handler 190, and placed in the discharge tube hopper 200, or in holding bins 280,285 until space is available in the discharge tube hopper 200. The tube handler 190 also removes empty tubes from the input of the serial tester 185 and places them in the empty tube hopper 255 (step 422).

A bar code reader is preferably provided at the serial tester 185, pin station 265, and holding bins 280,285 to identify the tubes and thus insure that the tubes are transferred by the tube handler 190 in proper sequence to the desired destination.

Discharge Tube Hopper

Referring now to FIG. 1, the discharge tube hopper ("DTHO") 200 is similar to the incoming tube hopper 110. The discharge tube hopper 200 may include, for example, a storage bin into which the discharge tube handler 190 places the tubes filled with IC packages. The discharge tube handler 190 delivers the filled tubes to the discharge tube hopper 200. The operator then removes the tubes from the tube hopper 200.

Empty Cartridge Tester

Referring still to FIG. 1, after the burn-in board cartridge is unloaded at the cartridge unloader 180, the cartridge may be delivered to the empty burn-in cartridge tester ("EBTS") 240, if empty cartridge testing is desired. The cartridge tester 240 examines the empty cartridge for electrical open or short circuits to identify sockets that are not functioning properly. A Good Socket Map is generated and sent to the central computer 900; this socket map is used by the cartridge loader 140 during the loading process so that IC packages are mounted only in good sockets.

The empty cartridge tester 240 includes an input buffer, a test station, and a discharge buffer. The input buffer and discharge buffer serve as storage areas for the cartridge before and after being tested. The tester 240 utilizes an electrical test probe which is inserted into each socket on the cartridge. The probe resembles an IC package to the extent that it includes a plurality of conductive leads which are inserted, like an IC package, into the socket. A BIC ("burn-in cartridge") reject bin 249 stores burn-in cartridges that include an excessive number of bad sockets.

Figure 11A:
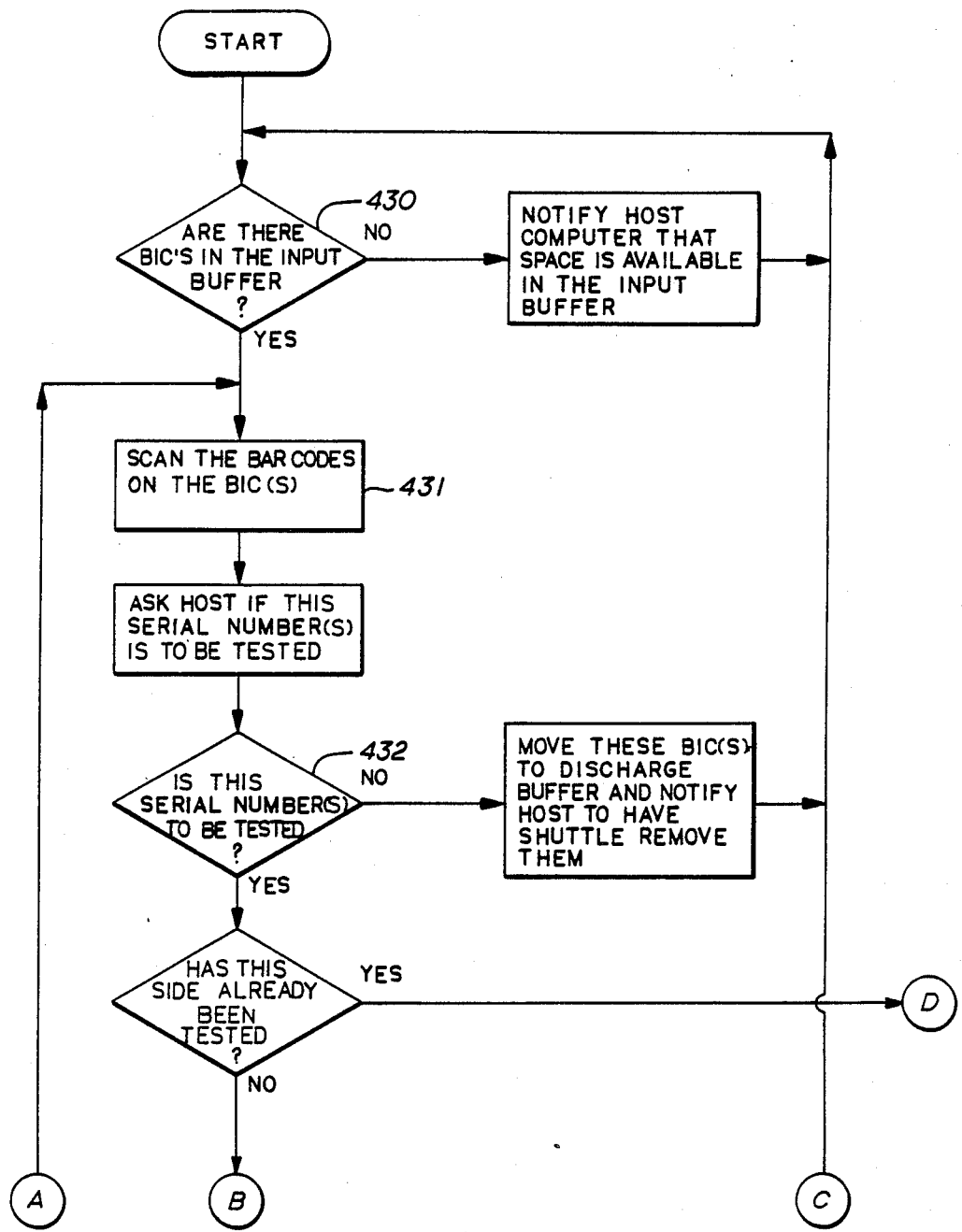
FIGS. 11A–C are an operational flow chart for the empty cartridge tester.
Figure 11B:
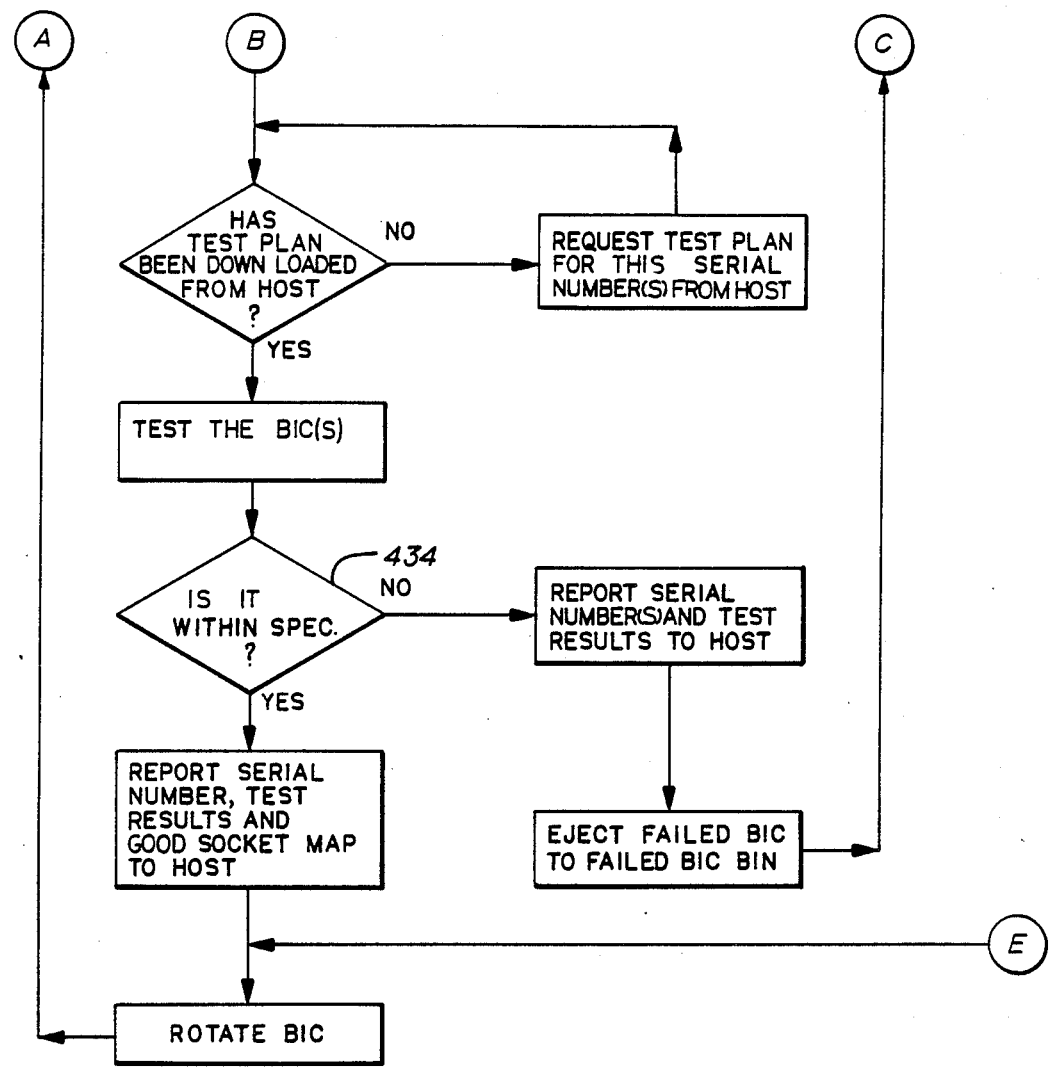
Figure 11C:
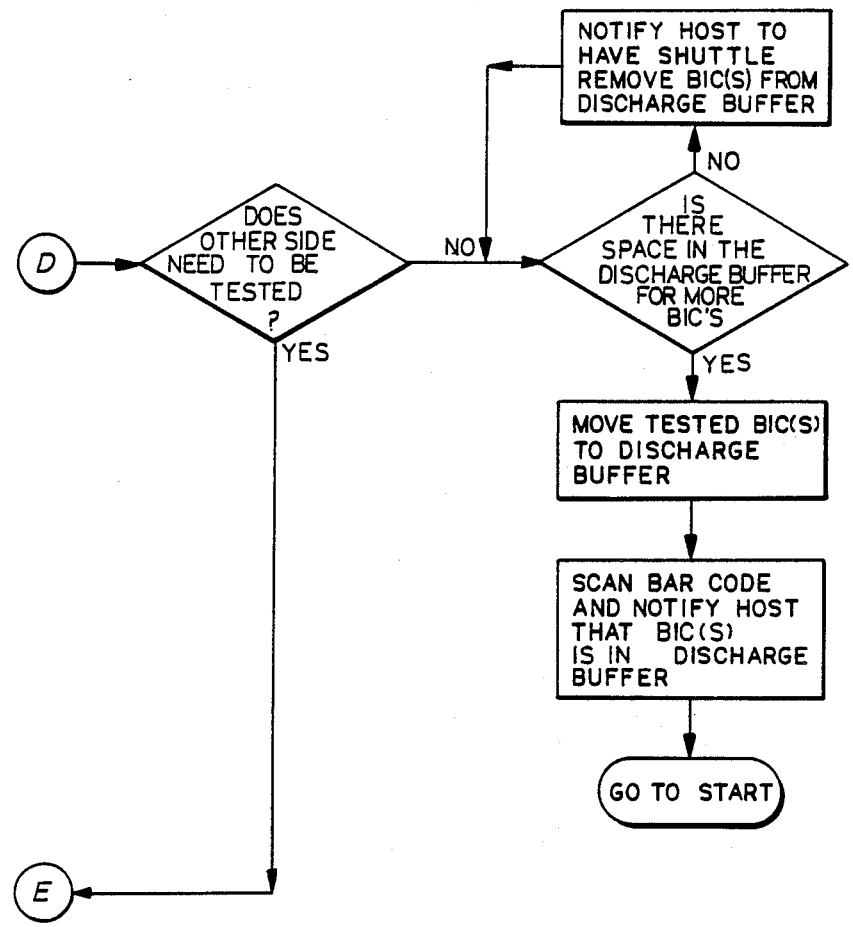

The tester 240 is controlled by an on-board microprocessor, programmed in accordance with the flow chart of FIG. 11. Referring now to FIGS. 1 and 11, tester 240 begins its operation at step 430 by monitoring the presence of burn-in cartridges in the input buffer; the central computer 900 is notified in the event of an absence of cartridges. Once a cartridge becomes available, it is placed in the test station. The bar code label on the side face of the cartridge facing the electrical test probe is scanned by a bar code reader to identify the cartridge and the particular side face. The tester 240 communicates with the central computer 900 to determine whether this particular cartridge should be tested (step 432). A determination that the cartridge is not to be tested causes the cartridge to be transferred to the discharge buffer.

If testing is to proceed on the cartridge under examination, the tester 240 determines whether the side face of a single-sided cartridge, or both side faces of a two-sided cartridge, have already been tested. If the side faces of the cartridge have been tested, the cartridge is transferred to the discharge buffer, and the central computer 900 is subsequently notified.

Once the tester 240 determines that a side face of the cartridge needs to be tested, the tester 240 requests the central computer 900 to download the test plan, and the side face of the cartridge is tested by inserting the test probe into each socket. After the test is concluded, the tester 240 determines whether the cartridge has met minimum specification requirements by having less than a predetermined threshold number of socket failures (step 434). If the side face exceeds the predetermined threshold, the cartridge is sent to the BIC reject bin 249, and the test results are reported to the central computer 900. For those cartridges that pass the test by meeting the minimum specifications, a socket map designating good (or bad) sockets for that side face is sent to the central computer 900. The cartridge, if two-sided, is then rotated, and the process is repeated commencing at step 431.

Burn-In Cartridge Storage and Tube Dump

Referring again to FIG. 1, the burn-in system preferably includes a burn-in cartridge ("BIC") storage area. The BIC storage 230 is used to store temporarily both empty and loaded cartridges which are awaiting the next stage of processing in the burn-in system. The BIC storage interacts primarily with the cartridge unloader 180, the empty cartridge tester 240, and the cartridge loader 140 (see FIG. 12). In addition, the BIC storage may interact with the loaded cartridge tester 150, the burn-in chamber 160, the cartridge unloader 180 and the cartridge loader 140. The BIC storage may include a bar code reader for ascertaining the identity of stored cartridges.

The automated burn-in system of the present invention may also include a tube dump area 245 to receive from the incoming tube handler 120 and store empty tubes which are not to be re-used. The tube dump 245 includes a bar code reader to identify the "dumped" tubes to insure they are not re-used accidentally. The tube dump area 245 can be located any place within the in-line system.

Cartridge Shuttle

Figure 14A:
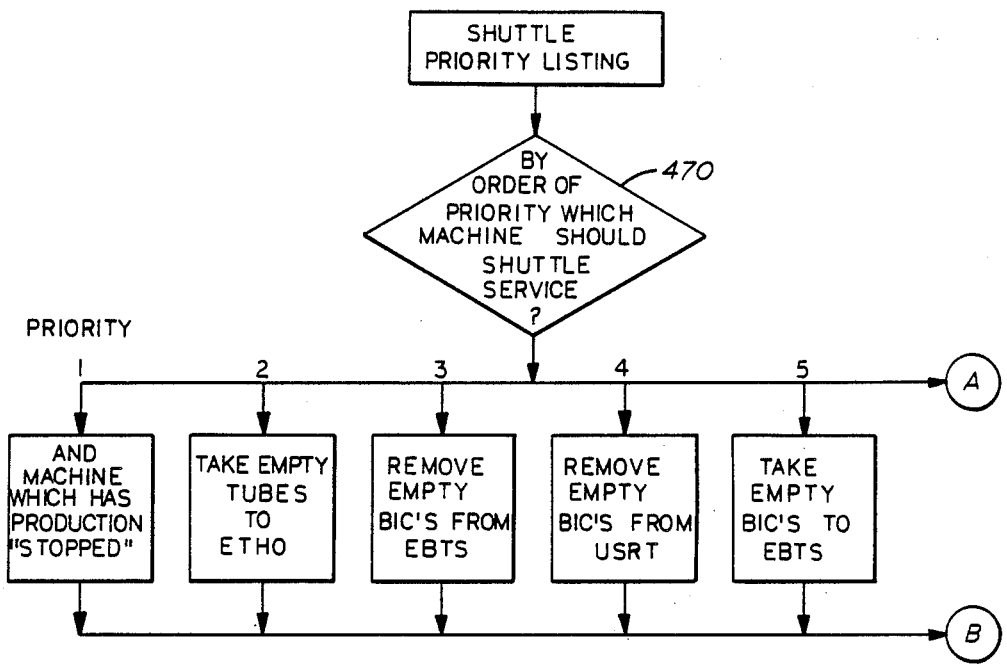
FIGS. 14A–C are a flow chart showing priority for use of the shuttle apparatus.
Figure 14B:
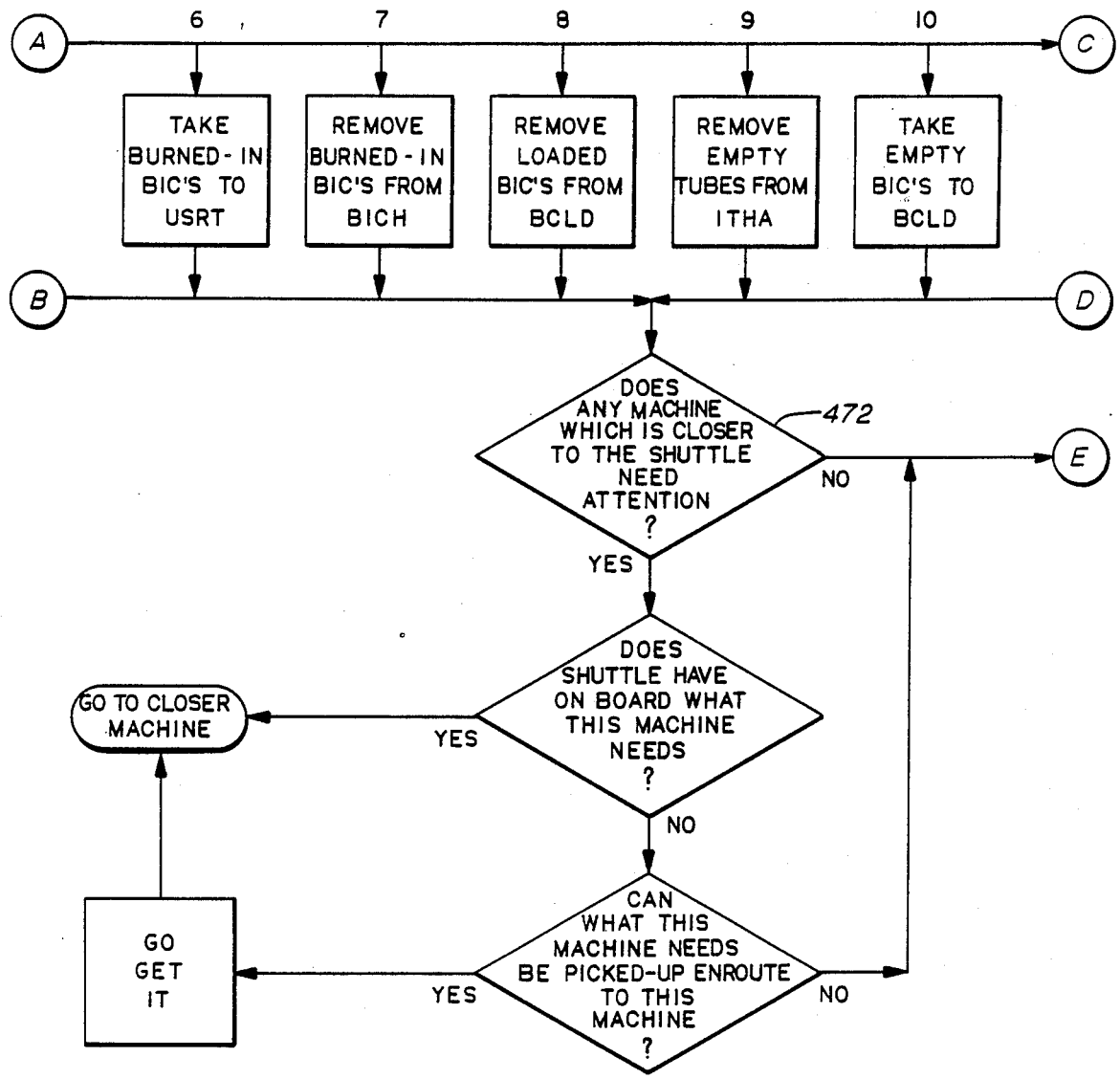
Figure 14C:
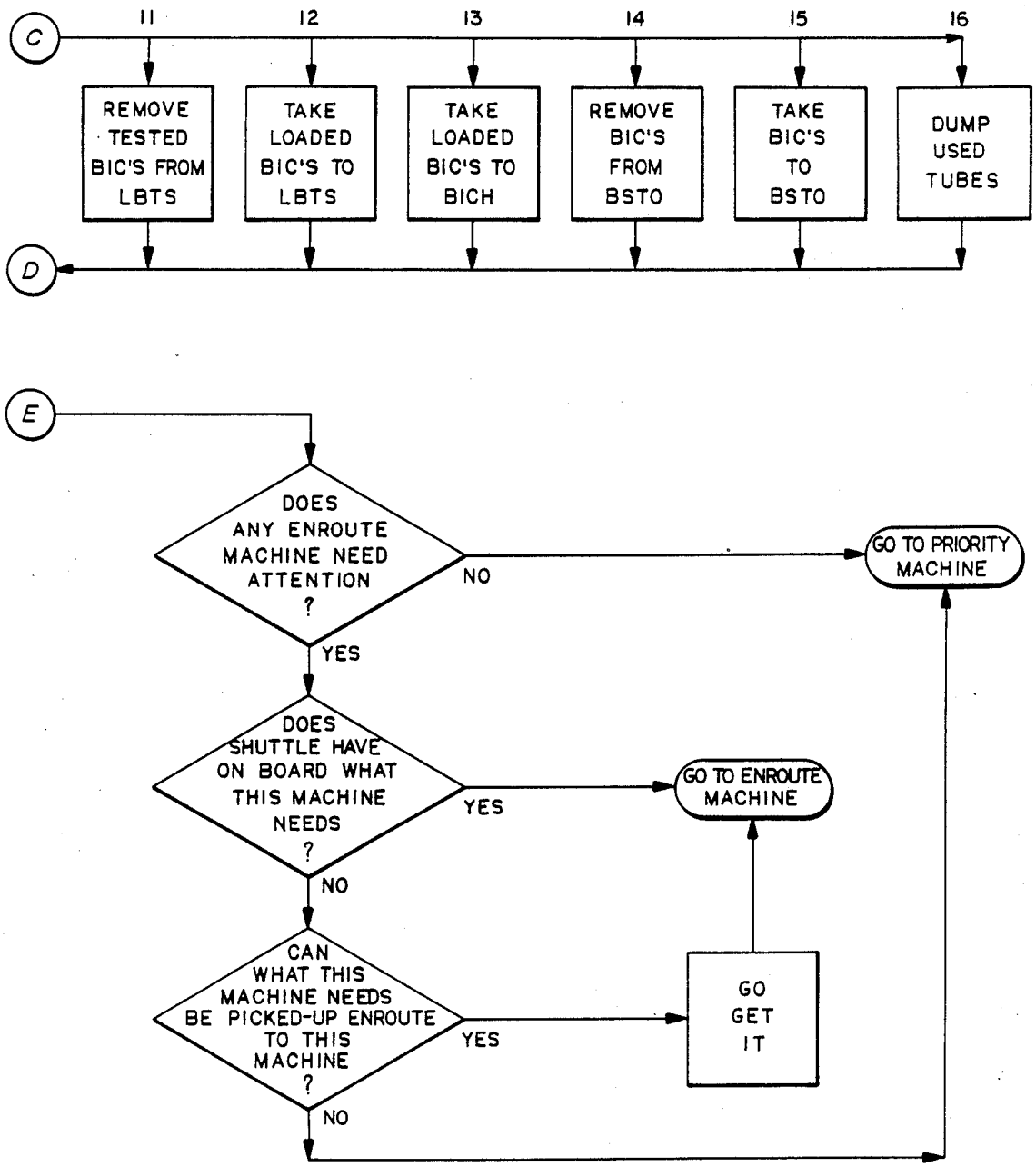

The shuttle apparatus 210 transports the cartridges among the individual units of the burn-in system as reflected in FIG. 12, positions cartridges in the individual units, and removes cartridges from individual units. The shuttle preferably passes alongside the system apparatus as illustrated in FIG. 1, and therefore loads and unloads cartridges by generally horizontal motion into and out of (or onto and away from) each apparatus. FIG. 2 depicts an alternative embodiment in which an overhead rail is used to transfer cartridges vertically between the shuttle and the system apparatus. FIG. 12 shows schematically the flow of cartridges and IC packages among the individual units of the automated burn-in system. The shuttle apparatus 210 includes an on-board microprocessor programmed in accordance with the flow charts shown in FIGS. 13 and 14. The basic control routine, shown in FIG. 13, detects shuttle position and plots future actions. FIG. 14 depicts a subroutine that establishes priority for the various shuttle activities.

Referring now to FIGS. 1, 13, and 14, the shuttle apparatus 210 maintains constant awareness of its location in the burn- system. If the position is unknown, the shuttle executes a series of maneuvers, as shown in step 452, designed to identify its position. After ascertaining its location, the shuttle apparatus 210 plots its course by analyzing the apparatus presently on-board the shuttle. The shuttle first determines whether it has on-board empty burn-in cartridges, loaded burn-in cartridges, or empty tubes. If there are empty cartridges on-board the shuttle, the shuttle determines the ultimate destination of the empty cartridges. Once a proper destination is found, the basic control program exits to the priority subprogram of FIG. 14. If a proper destination is not identified, the central computer 900 is notified, and execution of the basic control program continues.

If no empty cartridges are on-board, the shuttle apparatus 210 considers whether there are loaded burn-in cartridges on-board the shuttle (step 456). If loaded cartridges are on-board and their destination is identified, execution is transferred to the priority subroutine. In the absence of loaded cartridges or a known destination, execution of the basic control program continues.

The shuttle apparatus 210 next determines at step 458 whether empty tubes are on-board and if so, the intended destination for the tubes. As before, the presence of empty tubes and the known destination transfers execution to the priority subprogram. In the absence of empty tubes or a known destination, execution of the basic control program continues.

In the absence of cartridges or empty tubes on board the shuttle, the shuttle apparatus 210 determines whether any individual unit in the burn-in system requires attention (step 460). If so, execution is transferred to the priority subprogram.

In the priority subprogram of FIG. 14, the basic services provided by the shuttle are ranked in order of priority. It should be noted that this priority ranking may vary from system to system and within any one system from time-to-time due to a variety of factors, including the time required to burn-in and test a particular type of IC package.

As shown at step 470, execution of the priority subprogram commences with a determination, by order of priority, of the individual unit that will be serviced first by the shuttle. Once the prioritized target is identified, the shuttle determines whether it can perform more efficiently by servicing a unit more proximate to the shuttle apparatus (step 472). If the shuttle has on-board the necessary equipment or space, or if it can pick up the necessary equipment on the way to the closer unit, the shuttle is instructed to service the closer unit. Alternatively, if a unit which is positioned between the shuttle and its destination needs attention and the shuttle can perform more efficiently by servicing the intermediate unit, it is instructed to do so. Finally, if it is most efficient to service the prioritized machine, that activity is conducted first.

The shuttle apparatus 210 used in the horizontal loading system of FIG. 1 may also include equipment for raising the shuttle to access a plurality of horizontal levels in the burn-in system.

Central Control Apparatus

Referring again to FIG. 1, the host or central computer 900 is connected electrically to each individual unit in the system (except the hoppers 110,200, and the tube dump 245) and serves to coordinate operation of the various units. The connection to the shuttle apparatus 210 may be by remote control, overhead wire, through the shuttle rails, or any other suitable means. At the beginning of a burn-in operation, the operator enters into the central computer 900 the lot numbers of the IC packages to be tested, the number of IC packages in the lot, the type of IC packages in the lot, and the burn-in plan (including time, temperature, and signal information). As the burn-in of the IC packages progresses, the central computer 900 receives additional information and messages from the various microprocessors in the system, such as test results and locations of the IC packages and cartridges, and, when necessary, relays needed data to apparatus in the system.

II. BURN-IN CARTRIDGE

Figure 15:
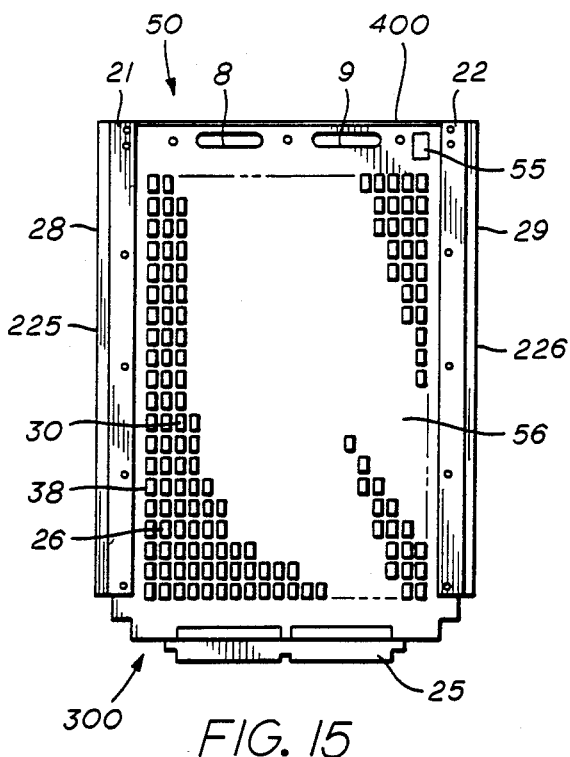
FIG. 15 shows a front elevation of the preferred embodiment of the burn-in board cartridge.

The automated burn-in system constructed in accordance with the principles of the present invention includes a single-sided and/or a two-sided burn-in cartridge ("BIC") for supporting IC packages during the burn-in process. Referring now to FIG. 15, the BIC 50 includes a grasping end 400, a connector end 300, lateral sides 225, 226, and one or two side faces 56. FIG. 15 shows one side face 56 of the BIC 50. It will be assumed for purposes of this discussion that when two-sided BIC's are used the second side face of the cartridge is identical to the first; in fact, however, the two side faces of the cartridge may differ in circuit design or otherwise as desired. Each side face of the two-sided cartridge is made up of a standard printed circuit card 30 onto which sockets 38 are mounted A single- sided cartridge has only one side face and thus uses only a single printed circuit card 30. Integrated circuit (IC) packages 26 that are to be processed in the burn-in system are inserted into the sockets 38.

This discussion focuses primarily on the two-sided cartridge. The single-sided cartridge utilizes the same structure as the two-sided cartridge except as noted herein. Referring now to FIGS. 15-18, the printed circuit cards 30 are held in place by frames 21,22. Frames 21,22 are elongated metal brackets with a generally U-shaped cross-section which extend along substantially the entire length of the lateral sides 225, 226 of the cartridge 50. Preferably, the frames 21, 22 are composed of aluminum and are approximately 24 inches long and 1.5 inches wide (equivalent to the width of the cartridge). The U-shaped frames have a uniform material thickness of about 0.15 inch. The cards 30 are secured to the opposed inside surfaces of the U-shaped frames by suitable fastening means such as screws, bolts, or rivets.

Figure 16:
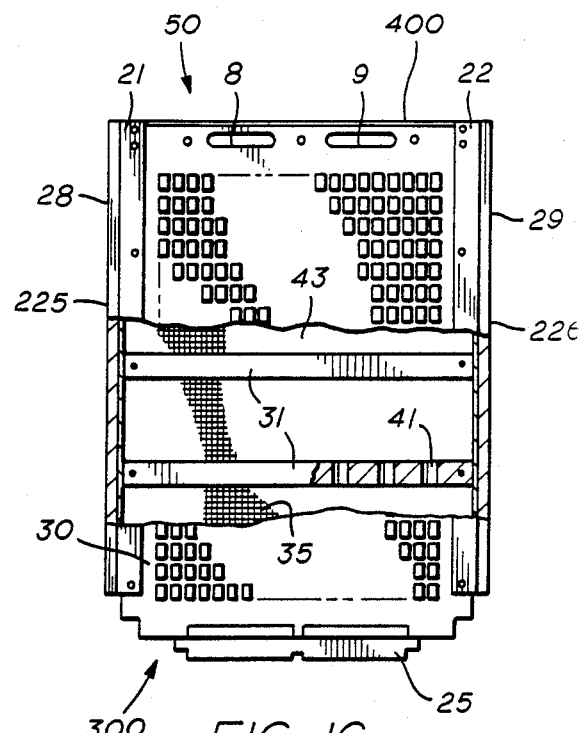
FIG. 16 shows the cartridge of FIG. 15 with portions thereof cutaway to depict the internal structure of the burn-in board cartridge.

FIG. 16 illustrates one side face of the two-sided BIC 50 with a portion of the printed circuit card 30 removed exposing the interior of the BIC 50. The back side 35 of the second printed circuit card 30 of a two-sided cartridge is now viewable. Between the two printed circuit cards 30 or behind the single printed circuit card of the single-sided cartridge are cross-beams 31. The cross-beams 31 are three-dimensional rectangular structures positioned uniformly along the length of the BIC, perpendicularly to frames 21, 22. Preferably, the cross-beams are composed of a non-conducting plastic such as "DELRIN," made by DuPont, and are approximately 16 inches long and 1.5 inches wide (width of cartridge), with a thickness of about 1.0 inch. In the preferred embodiment, five cross-beams 31 are utilized between the first and second printed circuit cards 30. One cross-beam is positioned at both the top and bottom ends of the BIC, and the other three cross-beams are spaced equidistantly therebetween. Interior chambers 43 are defined in the space between two adjacent cross-beams, within the interior of the two-sided BIC. Thus, in the preferred embodiment, the five cross-beams 31 define four interior chambers 43.

Figure 20:
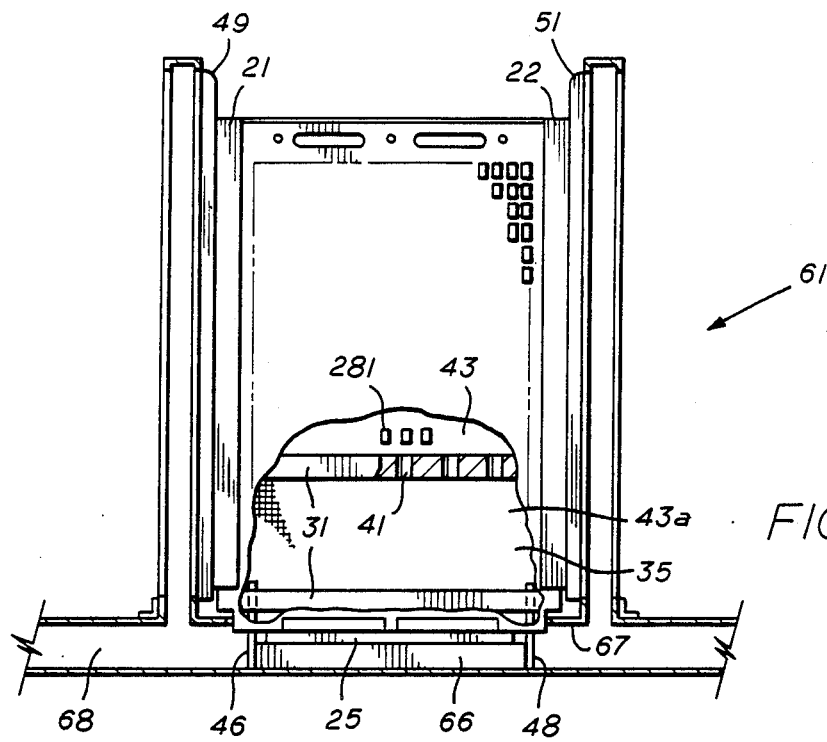
FIG. 20 depicts an alternative embodiment of the cartridge of FIG. 15 wherein electronic components and cooling means are provided in the interior of the burn-in board cartridge.

Cross-beams 31 have boreholes 41 through which cooling tubes 46, 48 may be passed for use with the two-sided cartridge. Referring to FIGS. 16 and 20, boreholes 41 are preferably about 1 inch in diameter and extend through the cross-beams 31 in a direction generally parallel to the U-shaped frames 21, 22. While cooling tubes 46, 48 may pass through the entire interior of the two-sided BIC 50 by means of boreholes 41 in each of the interior cross-beams 31, the preferred manner of cooling is to insert the tubes only into an end interior chamber 43a. Consequently, cooling holes 264, 266 (FIG. 17) are provided in the bottom end crossbeam of the two-sided cartridge for receiving tubes 46, 48 (FIG. 20). Airflow through the boreholes 41 then provides cooling to the other interior chambers 43. In order to reduce the exposure temperature of electronic circuitry in the cartridge interior, and pressurize the interior against the influx of hot gases from the chamber, nitrogen or cool ambient air may be blown in through tube 46, while the outflow of air passes through tube 48.

Figure 17:
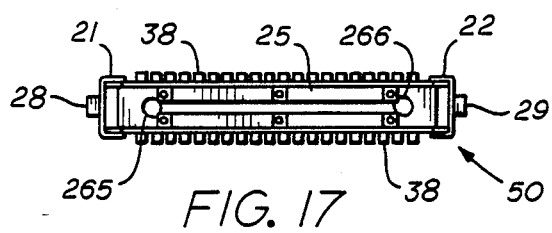
FIG. 17 shows a bottom elevation of the burn-in board cartridge depicted in FIG. 15.

The connector end 300 of the cartridge is illustrated in FIG. 17. The BIC 50 is electrically connected to the circuitry of a burn-in chamber or other apparatus through connectors 25. These connectors 25 may be any conventional type such as edge or pin connectors. In the preferred embodiment, rails 28, 29 are provided along the outer lateral side of frames 21, 22 for engagement within a track 49, 51 set in the burn-in chamber, or any other individual unit into which the BIC 50 is placed (see FIGS. 15 and 20).

Figure 19:
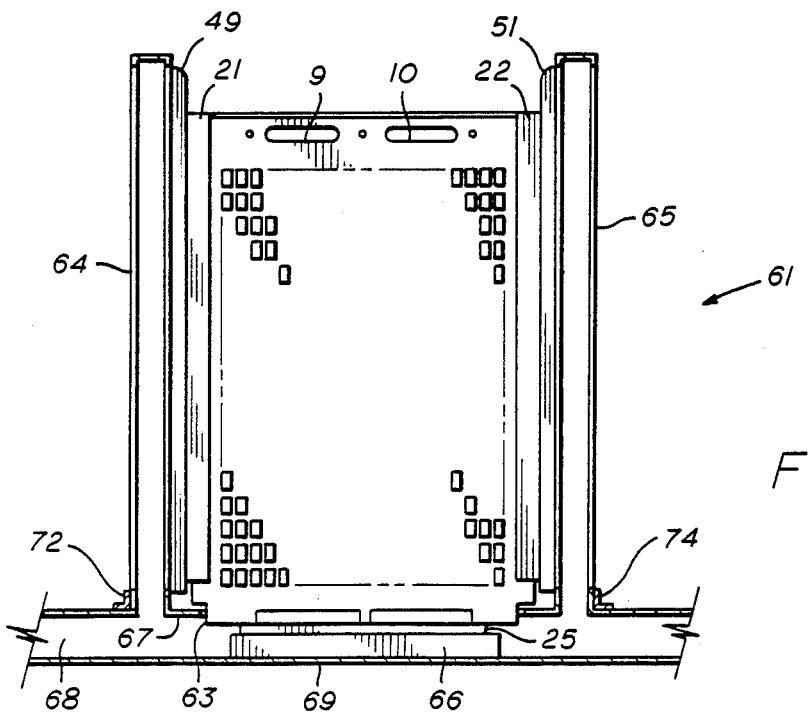
FIG. 19 shows a cross-sectional side elevation of a cartridge support structure with the cartridge of FIG. 15 received therein.

Referring now to FIGS. 19 and 20, the apparatus into which the BIC 50 is placed includes a cartridge support structure 61 comprising side supports 64, 65 and an end support 68. The side supports 64, 65 are made of sheets of a rigid material, for example, aluminum, and extend perpendicularly from end support 68 to a distance of approximately 24 inches. At the far end of each side support 64, 65 is a flange 72, 74 lying in a plane perpendicular to the outer surface of each side support. Extending perpendicularly along the inside surface of the side supports 64, 65 are tracks 49, 51 into which the rails 28, 29 of the cartridge 50 slide.

End support 68, which may be composed of the same material as side supports 64, 65, forms the base of the cartridge support 61, giving the cartridge support 61 a generally U-shaped cross-section. The end support 68 is a two-layered structure with an outer layer 67 and an inner layer 69, similar to that shown and described in commonly assigned U.S. Pat. No. 4,374,317, which is incorporated herein by reference. The flanges 72, 74 of the side supports 64, 65 are secured to the outer layer 67 by suitable fastening means; the distance between the side supports 64, 65 is approximately 16.5 inches. Preferably, the outer layer 67 has a generally rectangular slot 63 forming an opening for receiving the connector end 300 of the BIC 50 therethrough. Slot 63 is positioned so that its longitudinal axis is centered on a line between the two tracks 49, 51. The longitudinal length of slot 63 is about 15 inches while the transversal length is about two inches.

Inner layer 69 is placed about two inches beyond outer layer 67. Apparatus connectors 66 are mounted on the inner layer 69 and are positioned directly beyond rectangular slot 63. Electrical connections extend from the back of apparatus connectors 66, through inner layer 69, to apparatus circuitry (not shown). Cooling tubes 46, 48 may also be positioned proximate to the apparatus connectors 66 beyond slot 63. Tubes 46, 48 extend to a height of about 1 inch from inner layer 69. Nitrogen or cool ambient air can be blown through tube 46 into the cartridge with the outflow of air from the cartridge passing through tube 48.

When the BIC 50 is placed into the cartridge support structure 61, cartridge rails 28, 29 are received within tracks 49, 51, effectively targeting the BIC 50 into the unit in such a manner that, when fully inserted, cartridge connectors 25 will contact apparatus connectors 66 and cooling tubes 46, 48 will be inserted into the two-sided BIC 50 through cooling holes 264, 266. Inserting the BIC 50 in this manner also insures that the exact location of the BIC 50 and its sockets may be predetermined for purposes of further automated handling of the BIC or IC packages loaded thereon. A number of cartridge support structures 61 may be utilized in individual units to increase the number of BICs 50 that can be processed.

Figure 18:
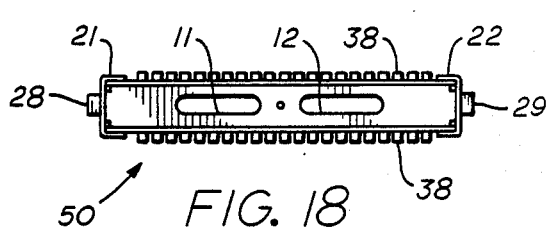
FIG. 18 shows a top elevation of the burn-in board cartridge depicted in FIG. 15.

The BIC structured in accordance with the principles of the present invention may further include apparatus for automated handling of both the one and two-sided BIC 50. Referring now to FIGS. 15 and 18, such handling apparatus may include apertures 8, 9, cavities 11, 12, and carrier means such as the shuttle apparatus 210 (FIG. 1). Apertures 8, 9 are provided through both of the side faces 56 near the grasping end 400 of the BIC 50. The apertures 8, 9 are generally cigar-shaped, with a length of approximately two inches and a width of 0.5 inch. Rimming the apertures 8, 9 are rings of a rigid material, such as aluminum, set in the printed circuit cards. The apertures 8, 9 are positioned approximately 0.5 inch from the grasping end 400 of the BIC 50 with aperture 8 positioned approximately three inches from the left lateral side 225 of the BIC 50 and aperture 9 positioned approximately 3 inches from the right lateral side 226 of the BIC 50.

The cavities 11, 12 form generally cigar-shaped openings in the grasping end 400 of the BIC 50. Like apertures 8, 9, cavities 11, 12 are approximately 2 inches long and 0.5 inch wide. In addition, cavity 11 is preferably spaced approximately 3 inches from the left lateral side 225 of the BIC 50 and cavity 12 is set approximately 3 inches from the right lateral side 226 of the BIC 50.

Referring now to FIG. 22, in the automated system structured according to the principles of the present invention, it is necessary to utilize some type of automated carrier means to transport the BIC 50. The carrier means or shuttle apparatus 210 disclosed herein includes two inverted T-shaped handles 83, 84 which are used to grasp the BIC 50 thereby permitting automatic handling of the BIC 50. The inverted T-shaped handles 83, 84 have a connecting rod 286, forming the vertical part of the inverted "T", and a horizontal base part 189 positioned at the bottom of the connecting rod 286. The connecting rod is attached to the horizontal base part 189 in such a manner as to divide the horizontal base part into two equal end portions 88, 89. Connecting rod 286 extends from and retracts into the carrier means to extend and to retract base part 189. End portions 88, 89 are each approximately 0.75 inch in length. The diameter of end portions 88, 89 tapers from about 0.625 inch at the connecting rod 286 down to 0.375 inch at the end point.

To grasp the cartridge, the two inverted T-shaped handles 83, 84 are extended from the carrier means and inserted into cavities 11, 12 set in the grasping end 400 of the BIC 50. The T-shaped handles 83, 84 are inserted until they are inline with apertures 8, 9 and then are rotated 90 degrees. Rotation of the T-shaped handles 83, 84 causes the end portions 88, 89 of each T-shaped handle 83, 84 to protrude from apertures 8, 9. End portions 88, 89 bind securely in apertures 8, 9 due to their tapered diameter; consequently when the T-shaped handles 83, 84 are retracted by the retraction of connecting rod 286 back into the carrier means, the BIC 50 is also retracted.

A bar code label 55 may be provided in a convenient location on each side face 56 of the BIC 50 to identify the particular side face and the particular cartridge in the automated burn-in system (FIG. 15). Alternatively, an electrical code may be used which includes an arrangement of circuit elements on the burn-in board cartridge, such as diodes, which can be scanned by inputting and outputting an electrical signal. The bar code label identifies both the tube and IC packages in the tube.

A plurality of T-shaped handle pairs 83, 84 may be provided to permit the simultaneous or almost simultaneous loading and unloading of a plurality of cartridges. In the preferred embodiment, the shuttle apparatus 210 is capable of carrying "n" number of cartridges, where "n" is equal to the number of slots in each electrical zone of a burn-in chamber. Similarly, "n" number of T-shaped handle pairs 83, 84 are preferably provided in the shuttle apparatus 210, so that there is one handle pair for each cartridge 50. As a result, an entire burn-in chamber zone can be loaded at one time. After the shuttle is positioned beside or above the burn-in chamber, the cartridges are preferably placed in the chamber simultaneously. Each of the cartridges is then inserted into the connectors 25 in a sequential fashion, one after another, in the manner described above, in order to minimize the total force exerted by the shuttle apparatus on the chamber at any one time.

The BIC 50 may also comprise a single-sided burn-in board. Referring now to FIGS. 15, 18, and 23, the single-side cartridge, like the two-sided cartridge, includes frames 21, 22, cross beams 31, connectors 25, sockets 38, rails 28, 29, apertures 8, 9 and cavities 11, 12. The single-sided cartridge, however, uses only one printed circuit card 30. The grasping end 400 of the single-sided cartridge includes grasping support 450 which is used to insure stability of the single printed circuit card. The grasping support 450, shown in FIG. 23, has a truncated pentagonal configuration which in cross-section resembles a jar with a bottle-neck. The single printed circuit card 30 is placed in the opening of the grasping support 450. The sides of the U-shaped cartridge frames 21, 22 are also partially within the support 450, with the outer sides of the frames 21, 22 extending therefrom. As a result of this construction, the printed circuit card 30 is sandwiched at its grasping end between the grasping support 450 and the front side of frames 21, 22. A screw, bolt, rivet, or other suitable fastening means 105 is used to hold the circuit card between the support 450 and the frames 21, 22. The other open side of the grasping support 450 is secured to the back side of frames 21, 22.

The grasping support includes apertures 8, 9 and cavities 11, 12 to permit automatic handling of the single-sided cartridge by the shuttle apparatus 210 in a manner similar to the two-sided cartridge.

The burn-in board cartridge 50 presents a myriad of advantages over the conventional burn-in board. Frames 21, 22 provide a sturdy structure and prevent circuit cards 30 from warping or being damaged. In addition, the cross-beams 31 provide added stability to frames 21, 22 and reduce the amount of flexing that occurs at the printed circuit card whenever IC packages are inserted into or removed from the BIC 50. Since one configuration of BIC 50 is two-sided, electronic circuitry 281 can be placed between the printed circuit cards in a position close to the sockets as preferred in high speed digital circuits (see FIG. 20). In the single-sided cartridge, electronic circuitry 281 can be placed on the back of the printed circuit card. Blowing nitrogen or cool ambient air through tube 46 into the end interior chamber 43a of the two-sided BIC serves to maintain test circuitry at lower temperatures, thereby substantially extending the life of the circuitry.

Furthermore, the two-sided configuration of BIC 50 is capable of handling certain IC packages which cannot be handled by conventional burn-in boards due to the great number of leads possessed by the IC package. The great number of leads requires more input and output connections than are available on the edge connector of a conventional burn-in board. The two sided configuration of burn-in cartridge 50 makes burn-in and testing of these packages possible by utilizing connectors from both side faces of the two-sided BIC 50. Referring now to FIG. 21, an end printed circuit card 501 is provided at the grasping end 400 of the two-sided configuration BIC 50 and is connected electrically to the printed circuit cards placed on each side face of the BIC 50 so that the two sides of the BIC literally comprise one printed circuit card. Since the two-sided BIC has twice as many edge connections as a conventional burn-in board, one edge connector can be used for input connections and the other can be used for output connections. For example, one side of the BIC could be used solely to receive input signals while the other side of the BIC could be used solely to deliver output signals.

III. BURN-IN CHAMBER

Figure 24:
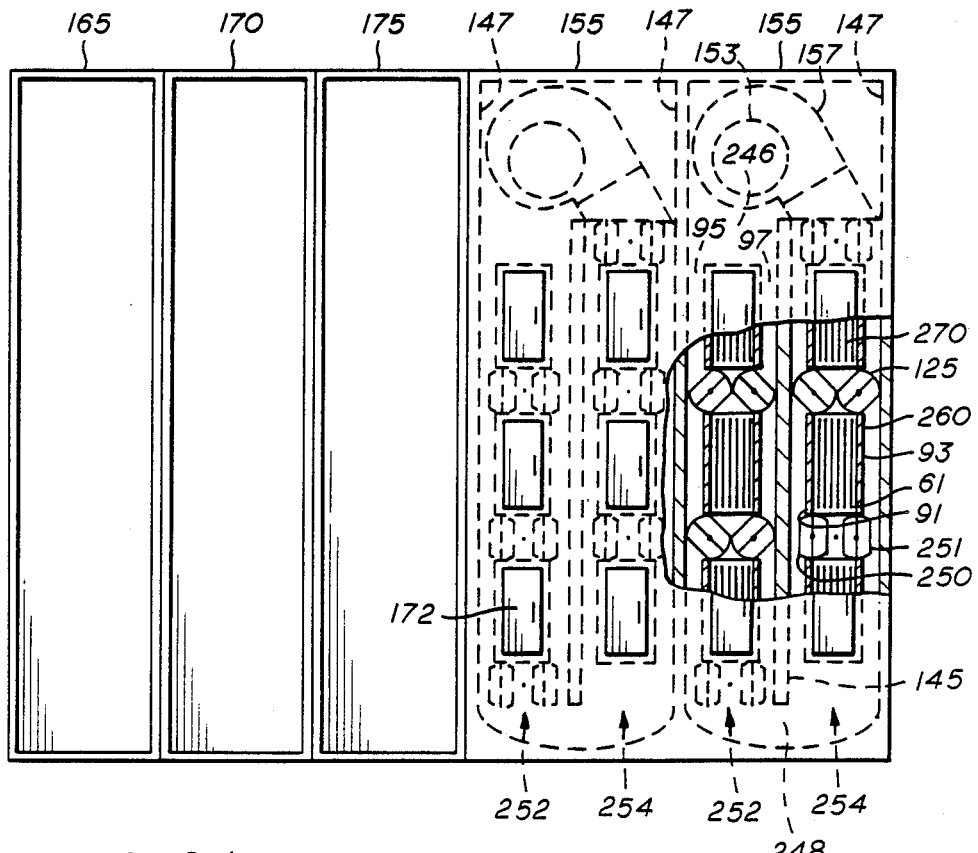
FIG. 24 shows a front view of the burn-in chamber.
Figure 27:
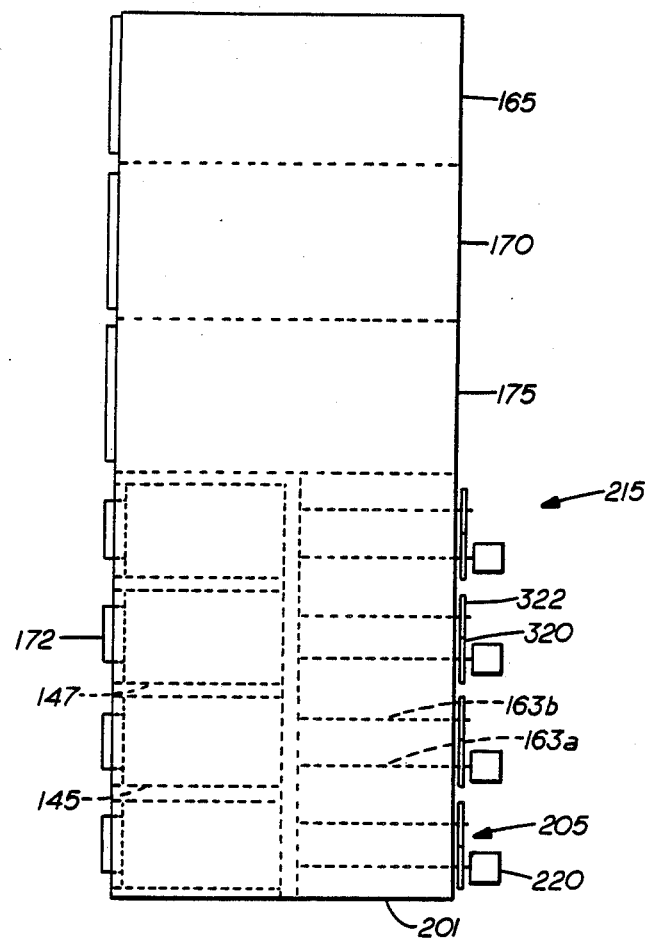
FIG. 27 shows a top view of the burn-in chamber of FIG. 24.
Figure 26:
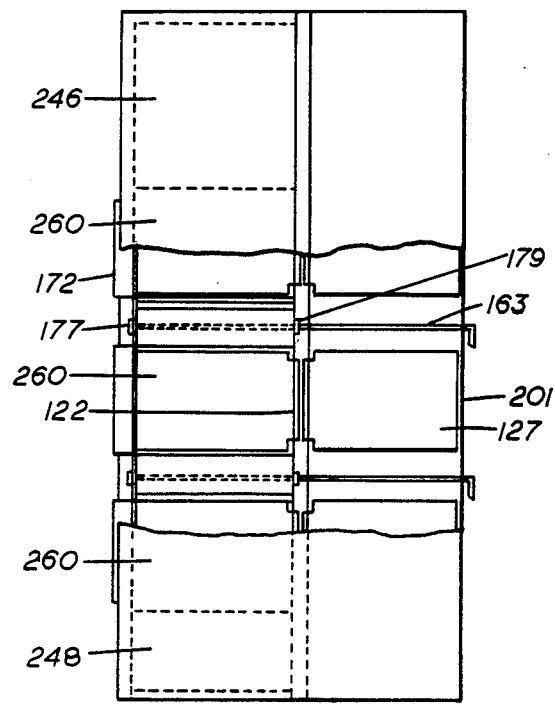
FIG. 26 shows a side view of the burn-chamber of FIG. 24.

Referring now to FIGS. 24, 26 and 27, a burn-in chamber 160 constructed in accordance with the principles of the present invention includes an instrumentation housing 170, a power supply housing 175, a mother board cabinet (201), and one or more stress chambers 155. Except as otherwise set forth herein, the burn-in chamber 160 is constructed and operates in substantially the same manner as a conventional burn-in chamber such as is well-known to those skilled in the art. Thus, the instrumentation housing 170 includes a microprocessor for coordinating the burn-in and test process for the stress chambers, as well as the various apparatus necessary to control the thermal environment of the stress chambers 155. The power supply housing 175 includes the various apparatus necessary to supply and to control the supply of electrical power to the burn-in boards and electronic apparatus connected thereto. In addition, equipment in the power supply housing may supply power to the instrumentation equipment and may receive control signals from the microprocessor. The mother board cabinet 201 encloses the various printed circuit boards 127 on the exterior backplane of the stress chambers 155. These boards 127 include mother boards, into which the burn-in cartridges are plugged, clocking boards for generating the electrical signals that exercise the IC packages on the burn-in cartridges, and monitor boards, which monitor the burn-in cartridges for the presence of clocking signals.

The burn-in chamber 160 may also include a test cabinet 165 for housing the electronic apparatus necessary to conduct functional testing of IC packages within the stress chambers 155.

Referring still to FIG. 24, the stress chambers 155 (two of which are depicted in FIG. 24) are surrounded on all sides by an exterior wall 147, which is preferably formed of a steel interior and exterior with a middle of fiberglass (or marinite) 159 to insulate the stress chambers 155 from other portions of the burn-in chamber 160. A mid-chamber wall 145, constructed in substantially the same manner as the exterior wall 147, divides each stress chamber into left and right sections 252,254. The mid-chamber wall 145 extends through the entire horizontal depth of the stress chamber with the top of the wall spaced vertically below the top of the stress chamber so as to form an upper duct 246, and the bottom of the wall spaced vertically above the bottom of the stress chamber so as to form a lower duct 248. Each stress chamber also includes a heater mechanism 153, of a type well-known in the art, for heating the interior of the stress chamber and an air mover mechanism 157, also of a type well-known in the art, for circulating air through the stress chamber so as to maintain a minimal temperature gradient throughout the chamber. While air is the preferred medium used in the stress chamber 155, nitrogen, an air/nitrogen mixture, or fluorinated fluid may also be used in the burn-in process. In operation, the air mover 157 forces air downwardly through right section 254, horizontally through lower duct 248, and then upwardly through left section 252 of the stress chamber. Preferably, air mover 157 should drive the air at a rate of approximately 30 feet per second in order to maintain a narrow temperature gradient during the burn-in process.

In a burn-in chamber 160 constructed in accordance with the principles of the present invention, each stress chamber is divided into a plurality of burn-in zones 260. Each burn-in zone 260 supports a plurality of burn-in cartridges and can be operated substantially independently of other zones 260. Thus, each zone 260 is electrically independent of every other zone, whereby clocking signals communicated to burn-in cartridges may be varied from zone to zone. In addition, each zone 260 may be isolated thermally from all other zones, whereby burn-in cycle timing may vary from zone to zone. The number of zones 260 in each stress chamber 155 may vary according to the desired capacity of the stress chamber.

Each zone 260 comprises a plurality of cartridge support structures 61, one for each burn-in cartridge in the zone 260, a connection device assembly 122, an opening for providing access to the zone 260, and an air diverter mechanism 125. Each cartridge support structure preferably comprises the structures 61 depicted in FIG. 20, and described in detail supra in the section entitled "Burn-in Cartridge." The structures 61 are positioned adjacent to one another and are spaced one from the next to accomodate the flow of air between cartridges received therein. The number of burn-in cartridges supported by each zone 260 may vary according to the demands of each burn-in system, but preferably comprises four to eight cartridges.

The connection device assembly 122 is the electrical connection apparatus by which electrical signals are communicated to and received from the burn-in cartridges. The connection device assembly of the present invention preferably is constructed in the manner disclosed in U.S. Pat. Nos. 4,374,317 and 4,507,544, which are expressly incorporated herein by reference, with the assembly forming a part of the rear wall of the stress chamber. As described in detail in the named patents, edge connections on the burn-in cartridges are received through slots 270 (in FIG. 24) in the rear wall of the zone 260 into edge connectors forming a part of a mother board. Clocking boards and monitor boards, which are connected electrically to the opposing face of the mother board by means of edge connectors, generate the electrical signals necessary to exercise and monitor the particular type of IC packages supported on the corresponding burn-in cartridges, in a manner now well-known to those skilled in the art. The connection device assembly also preferably includes as a part of the rear wall of the stress chamber the isolation apparatus described in detail in U.S. Pat. No. 4,374,317.

The opening in the front portion of each zone 260 permits access to the zone. Each opening is covered by an associated door 172, such that when the door 172 is closed, the associated zone is substantially thermally insulated from the ambient outside the zone Each door 172 is constructed in such a manner as to enable it to be opened and closed automatically for insertion and removal of burn-in cartridges.

The air diverter mechanism 125 is an apparatus that controls the flow of hot air moving through the stress chamber, whereby hot air may be diverted around the outside of a zone in order to insert or remove burn-in cartridges from the zone while burn-in progresses in adjacent zones. The air diverter mechanism comprises a pair of zone sidewalls 91,93 extending alongside each zone and a pair of rotatable baffles 250,251 positioned at the upstream end of each zone.

The zone sidewalls 91,93 preferably comprise insulated steel plates approximately one inch thick positioned on opposing sides of each zone. The sidewalls, which extend horizontally through the full depth of the zone, are generally parallel to and spaced from the adjacent mid-chamber wall 145 or exterior wall 147, whichever is applicable, of the stress chamber 155 to define dual airflow paths 95,97 around the outside of the zone. The vertical dimension of the sidewalls 91,93, and hence the airflow paths, is approximately the same as that of the corresponding zone. In order to maintain approximately the same cross-sectional area for airflow through the zone 260 and the alternative airflow paths 95,97, the sidewalls 91,93 preferably are spaced from the corresponding mid-chamber or exterior wall by approximately one-half of the distance between the two zone sidewalls.

Referring to FIGS. 24 and 25A-C, the baffles 250,251 are comprised of three steel blades 113,115,117 mounted in parallel between a front oblong endplate 177 and a rear oblong endplate 179 and thus extend from the rear wall of the stress chamber 155 to the front wall of the stress chamber.

Figure 25A:
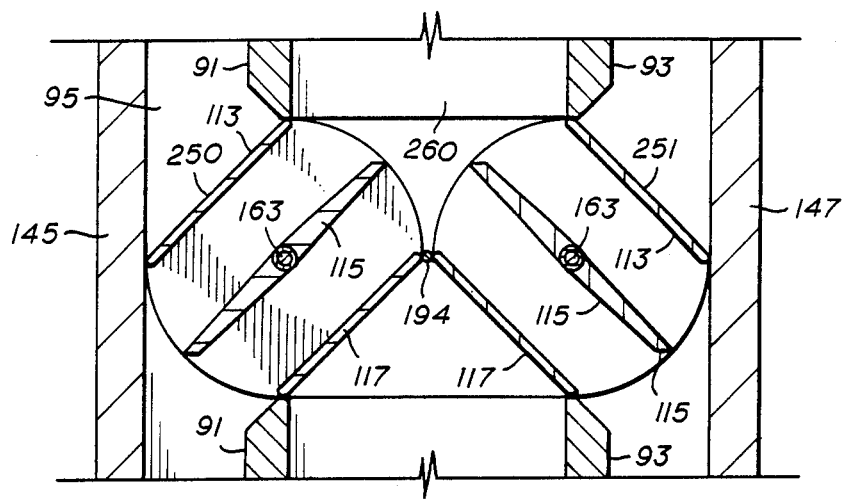
FIGS. 25A-C depict schematically the operation of the burn-in chamber air diverters.

Each baffle rotates on a shaft 163 that extends from a bearing-engagement in the front wall of the stress chamber through the front endplate 177, lengthwise through the center of the middle blade 115, through the rear endplate 179, through a bearing-engagement in the rear wall of the stress chamber, and into the mother board cabinet, where it connects with a baffle drive mechanism 215, as described below. The shaft 163 for each baffle is positioned above and in alignment with the corresponding zone sidewall, whereby the middle blade can be rotated into metal-to-metal substantially sealing engagement with the upper end of the sidewall when the middle blade 115 is substantially aligned with the sidewall, as depicted in FIG. 25C.

The middle blade 115 preferably defines an aerodynamic profile tapered to a point along the lengthwise edges so as to minimize turbulence in the airflow through the stress chamber. If the baffle is positioned beneath an adjacent zone, the shaft 163 is positioned halfway between the upper end of the first zone sidewall and the lower end of the adjacent zone sidewall, whereby the middle blade 115 can be aligned to form a sealed extension between the two sidewalls 91,93, as shown in FIG. 25C.

Each pair of baffles 250,251 has associated therewith a baffle support rod 194, approximately one inch in diameter, which extends horizontally through the stress chamber at the same horizontal level as and halfway between the shafts 163 of the associated pair of baffles 250,251.

Collateral blades 113,117, positioned on opposing sides of and generally parallel to the middle blade 115, are generally plate-shaped with rounded lengthwise edges so as to facilitate airflow through the stress chamber 155 with minimal turbulence. Outer collateral blade 113 is welded to the outer side of the front and back oblong endplates, while inner collateral blade 117 is welded to the interior side of the two endplates.

Figure 25B:
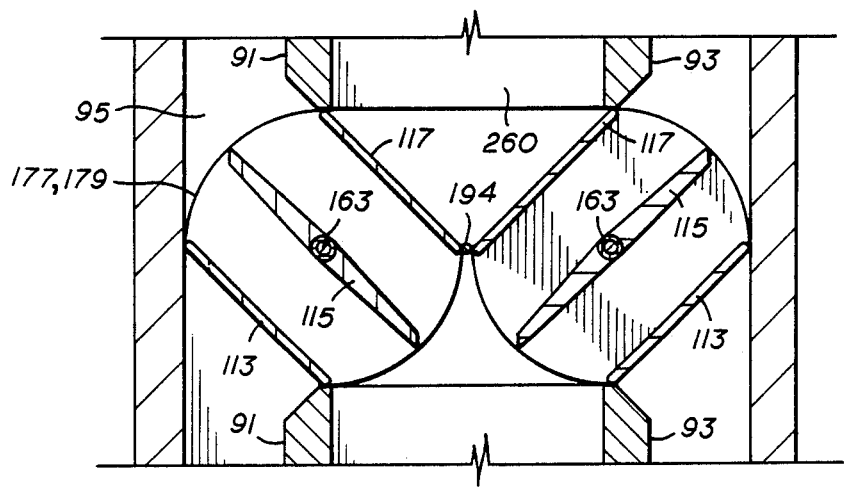
Figure 25C:
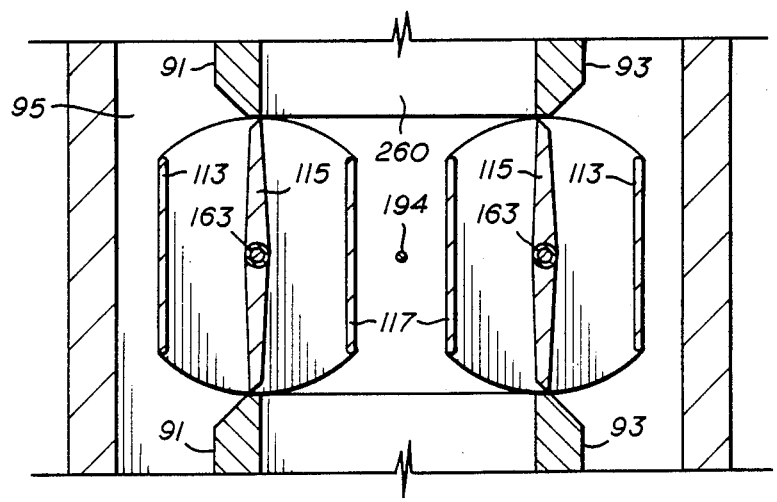

The blades 113, 117 are of such a width that when the downstream end of the baffles 250,251 are rotated toward one another, as in FIG. 25B, outer blade 113 effectively caps the downwind air path by forming a seal between the downwind zone's outer sidewall and either the chamber wall or mid-chamber wall. At the same time, the inner blades 117 converge at the downwind edges to form a "V", with the upstream edges of inner blades 117 sealingly engaging the upwind zone sidewalls 91,93, and the downwind edges sealingly engaging the support rod 194.

When the downstream end of the baffles rotate outward, as in FIG. 25A, inner blades 117 form an inverted "V", capping the downstream zone 260. The downstream edges of the innner blades 117 sealingly engage the downstream zone sidewalls, while the upstream edges sealingly engage the support rod 194. The outer blades 113 sealingly engage the downstream edge of the upstream sidewall and either the chamber wall or midchamber wall, whichever is applicable.

Referring to FIGS. 26 and 27, baffle drive mechanism 215 comprises a stepping motor 220 and coupling gears 205. Stepping motor 220 preferably couples directly to one shaft 163a of the baffle pair 250,251. Coupling gears 205 comprise a pair of gears 320,322, which couple the motor-driven shaft 163a to the second shaft 163b in a one-to-one ratio, whereby the two shafts rotate in opposite directions by the same angular displacement at all times.

Preferably, the baffle drive mechanism 215 attaches to shafts 163a,163b on the rearward side of mother board cabinet 201 so as to avoid any contamination of electronics within the mother board cabinet 201. Alternatively, however, the drive mechanism 215 may be included within the interior of the mother board cabinet 201, in the available space between the clock/monitor boards 127 for each burn-in zone. In the alternative embodiment, the drive mechanism 215 preferably is itself enclosed by a partition to prevent contamination of the electronics within the cabinet 201.

In operation, the microprocessor within the instrumentation cabinet 170 communicates commands to a motor controller (not shown) for the stepping motor 220. In response to these signals, stepping motor 220 rotates shaft 163a a predetermined angular distance in either a clockwise or counterclockwise direction. Angular motion of shaft 163a is translated by coupling gears 205 into angular motion of shaft 163b in the opposite direction, thereby effecting movement of the corresponding pair of baffles 250,251 to the desired position.

Referring to FIGS. 25A-C, the operation of the air diverter mechanism will be discussed. The baffles 250,251 channel the air driven by the air mover 157 through and around the zones of the stress chamber 155. Normally, the baffles 250, 251 are maintained in the neutral position depicted in FIG. 25C to d41irect the flow of air through the downstream zone 260 and prevent the flow of air within the airflow paths 95, 97. By rotating the downstream ends of the pair of baffles 250,251 away from one another, as shown in FIG. 25A, the hot air is diverted around the downstream zone 260 and through airflow paths 95,97 around the outside of the zone. The airflow can be re-channeled from the air paths 95,97 back through the next downstream zones 260 by rotating the downstream ends of the intervening baffles toward one another, as shown in FIG. 25B.

The ability to bypass a zone by channeling hot air around the zone provides many advantages not present in prior art burn-in chambers. Each burn-in zone may operate, in effect, as a separate burn-in chamber, being subjected to burn-in or being cooled down, as desired. In addition, since a separate chamber door 172 is provided for each zone 260, cooling can be accelerated in any one zone by bypassing the zone and then opening the associated door.

Burn-in zones can also be loaded and unloaded individually once cooled, while burn-in continues in other zones. As a result, overall IC package throughput can be maximized by loading and unloading each individual zone as burn-in is completed.

As described herein, the preferred embodiment of the burn-in chamber 160 comprises a horizontal stress chamber, in which the door to each burn-in zone is positioned on one side of the stress chamber whereby burn-in cartridges move generally horizontally into and out of the stress chamber. In an alternative embodiment of the present invention, such as is depicted generally in FIG. 2, the burn-in chamber 160 comprises a vertical stress chamber wherein the zone doors are located on the top of the stress chamber, and burn-in cartridges are moved generally vertically into and out of the stress chamber. The vertical stress chamber, which is essential for liquid burn-in techniques and particularly useful for conservation of floor space, is constructed according to the same basic principles set forth herein, except perhaps for positioning of the instrumentation and power supply cabinets, which may preferably be located beneath rather than beside the stress chamber.

IV. AUTOMATIC HANDLER

Figure 30:
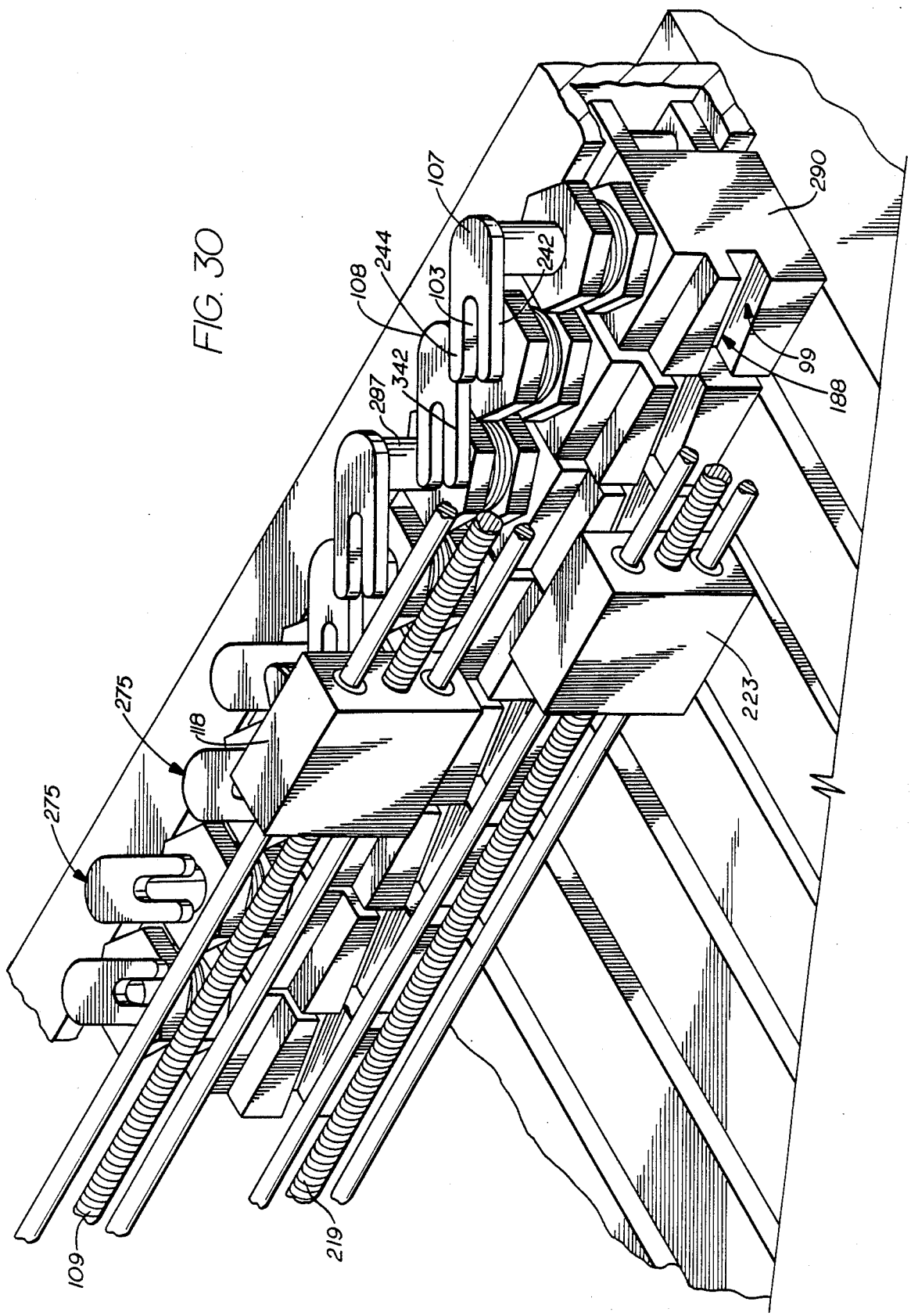
FIG. 30 depicts isometrically a line of automatic handlers.

FIGS. 28–30 depict certain details of the automated handler 275, which was described generally supra in the section entitled, "Burn-in Cartridge." In the preferred embodiment, the shuttle apparatus 210 (FIG. 22) includes a pair of automated handlers for grasping each burn-in board cartridge 50. This discussion focuses on a single automated handler, it being understood that a number of identical automated handlers may be constructed accordingly and used with the shuttle apparatus 210 shown in FIG. 22, as described in more detail hereafter.

Referring now to FIGS. 28 and 29, the automated handler 275 preferably includes a support block 290, an outer shaft 217, an inner shaft 283, an angular displacement mechanism 258, and a linear displacement mechanism 272. The outer shaft 217 is threadedly engaged within the support block 290 and threadedly engages the inner shaft 283, which extends generally coaxially through the outer shaft 217 and through the support block 290. One end of the inner shaft 283 is arranged to engage a BIC 50, and the other end of the inner shaft interacts cooperatively with the angular displacement mechanism 258. The angular displacement mechanism 258, as discussed herein, causes the handler 275 to rotate through an arc of approximately 90 degrees whereby the inner shaft 283 engages or disengages the BIC. The linear displacement mechanism 272, with which a portion of the support block 290 interacts, as hereinafter described, causes limited vertical displacement of the engaged BIC, whereby connector edges on the BIC may be inserted within or removed from one or more edge connectors.

More particularly, the support block 290 comprises a support housing 212 having a generally rectangular cross section, a central bore 204 machined within the housing 212, and a slotted lip 99, which protrudes from one face of the housing 212 and which interacts cooperatively with the linear displacement mechanism.

Referring still to FIGS. 28 and 29, support housing 212 includes six faces, hereinafter described as a front face 129, a back face 124, a left face 192, a right face 193, a top face 128 and a bottom face 232. Central bore 204, which may vary in diameter as reflected generally in FIG. 28, extends through support housing 212 from the right face 193 to the left face 192. A portion of the interior surface of the central bore 204, that intersects the right face 193 of support housing 212, is machined to form female threads for receiving the outer shaft 217.

Slotted lip 99 includes a cam support body 197 having a cam groove 188 machined therein. The cam support body 197 comprises a solid protrusion of generally rectangular cross section, as viewed in FIG. 29, machined in the top face 128 of the support housing 212. The cam groove 188 comprises a linear groove of generally rectangular cross section machined in the portion of the top face 128 formed by cam support body 197. The centerline of the cam groove 188 is angled with respect to the planes defined by the left and right faces 192, 193 of the support housing 212, whereby walls 292, 293 of the groove 188 form bearing surfaces for receiving a roller bearing 151 forming a part of the linear displacement mechanism. Motion of the roller bearing within the groove 188 along a line generally parallel with the plane of the left and rights faces 192, 193 is thereby translated to axial displacement of the support block 290. The dimensions of the same support body 197 and the cam groove 188 are calculated according to known engineering principles so as to enable the slotted lip 99 to support insertion and removal of a connector edge on a BIC into and out of a card edge connector.

Referring still to FIG. 28, the outer shaft 217 comprises a bushing 294 threadedly engaged within the support block 290 and a locknut 297. Bushing 294 includes a stem 282 bearing male threads for engaging the threaded portion of the interior surface of the central bore 204, a hexagonally-shaped cap 277, and a vertical bore 211 extending through the stem 282 and cap 277 and defining a hollow interior surface in the outer shaft 217. Threaded stem 282 is machined to include female threads, preferably of the acme-type, on the hollow interior surface of the stem 282, as well as the abovementioned threads on the exterior of the stem 282. Cap 277 is fixedly attached to the upper end of threaded stem 282, whereby the axial displacement of the stem 282 within the support housing 212 may be adjusted by rotation thereof.

Locknut 297 is a hexagonally-shaped nut that threadedly engages the exterior surface of the threaded stem 282 between the support housing 212 and the bushing cap 277. Tightening locknut 297 against the right face 193 of support housing 212 secures the outer shaft 217 in a fixed position relative to the support housing 212. Loosening locknut 297 enables bushing 294 to be inserted further into or removed from the central bore 204 of the support housing 212.

The inner shaft 283 comprises a generally cylindrical rod 286 having at one end a handle 83 for engaging a BIC 50 and at the other end a cam lever 107 for cooperative interaction with the angular displacement mechanism 258. More particularly, the rod 286 has a first end 121 forming a part of the handle 83, a middle portion 119 extending through the central bore 204 of the support housing 212 and the vertical bore 211 of the outer shaft 217, and a second end 123 forming a part of the cam lever 107. The middle portion 119 of connecting rod 286 is machined to define a male thread, preferably of the acme-type, for engagement within the outer shaft 217, whereby the axial displacement of the inner shaft 283 relative to the support block 290 may be adjusted easily.

As described supra in Section II, entitled "Burn-in Cartridge," handle 83 may have an inverted T-shaped configuration. In the preferred embodiment of FIG. 28, handle 83 comprises a cross-bar 191 extending generally perpendicularly through the rod 286 approximately one inch from the end 121 of the rod 286. The cross-bar 191 may be, for example, a generally cylindrical rod received within a bore in the rod 286 and attached therein whereby two equal end portions 288, 289 with a length of approximately 0.75 inches extend from opposing sides of the rod 286. The diameter of end portions 288, 289 preferably taper from approximately 0.625 inch near the rod 286 to approximately 0.375 inch near the outer ends thereof.

Referring now to FIGS. 28 and 29, cam lever 107 comprises a lever body 111 supporting a pair of spaced cam fingers 242, 244. The lever body 111 is secured to the second end 123 of the rod 286, with cam fingers 242, 244 extending generally perpendicularly of the axis of the rod 286. Cam fingers 242, 244, as shown in FIG. 29, form an elongated U-shaped configuration, defining therebetween a cam slot 103. The side walls of cam slot 103 comprises bearing surfaces that will accommodate a roller bearing 161 forming a part of the angular displacement mechanism 258, whereby linear motion of the roller bearing 161 will engage the cam slot 103 and cause the rod 286 to rotate through an arc of approximately 90°.

Referring still to FIGS. 28 and 29, the angular displacement mechanism 258 constructed in accordance with the principles of the present invention comprises a cam roller bearing 161, which engages and rotates cam lever 107, a bearing support apparatus 209, and a ball screw 109 coupled to a motor (not shown).

Bearing support apparatus 209 comprises a central post 167 rotatably supporting the cam roller bearing and a pair of spaced, horizontally extending bearing support arms 202, 203 attached to each end of the central post 167, and a cam support block 118. The roller bearing 161 preferably has an axial length of approximately two inches and a diameter that is slightly less than the width of cam slot 103 between cam fingers 242, 244. Central post 167 extends axially along the length of the roller bearing 161. Post 167 has a length that is greater than bearing 161 so that the top and bottom ends of post 167 protrude beyond the ends of bearing 161. Cam arms 202, 203 connect to the top and bottom ends of central post 167 and extend perpendicularly therefrom.

The cam support block 118 comprises means for supporting cam arms 202, 203 and a threaded bore 206 for receiving therethrough the ball screw 109, whereby the roller bearing 161 may be moved along a line so as to effect angular motion sequentially to a plurality of cam levers 107. Thus, cam arms 202, 203 are secured to the cam support block 118 to support the roller bearing 161 therefrom. The threaded bore extends through the cam support block 118 along a line generally perpendicular to the plane of the support arms 202, 203.

Referring now to FIGS. 22 and 28, in the preferred embodiment, ball screw 109 extends generally horizontally through the interior of the shuttle apparatus 210, adjacent to the cam lever 107 of each handler 275, in a direction transverse to cam arms 202, 203. Ball screw 109 threadedly engages the threaded bore of threaded block 118 so that the threaded block 118 traverses along ball screw 109 as ball screw 109 is turned in a conventional manner by, for example, a stepper or other suitable motor directly coupled to the ball screw 109. As threaded block 118 moves horizontally, vertical cam follower 209 engages cam lever 107 and rotates lever 107 approximately 90 degrees, thereby rotating inner shaft 283 and handle 83 ninety degrees to engage and disengage BIC 50.

Referring now to FIGS. 28 and 29, the linear displacement mechanism 272 constructed in accordance with the preferred embodiment comprises a cam pin roller bearing 151, which engages the cam groove 188 in the slotted lip 99 in support block 290, a bearing support apparatus 221, and a ball screw 219 coupled to a motor (not shown) in a conventional manner. By engaging the cam groove 188, the pin roller bearing 151 thereby linearly displaces support block 290, outer shaft 217 and inner shaft 283, whereby handler 275 may move the BIC 50 so as to cause the BIC 50 to be connected and disconnected from connectors 25 (shown in FIG. 19).

The bearing support apparatus 221 comprises a central post 152 rotatably supporting the pin roller bearing 151 and a cam support block 223. Bearing 151 includes an engaging end 169 that may be received in the cam groove 181; has an axial length preferably in excess of the depth of the cam groove 181 in the support housing 212; and has a diameter that is slightly less than the cam groove 188. Central post 152, with a length greater than that of bearing 151, extends axially through the bearing 151 and lies flush with the engaging end 169 of bearing 151. Post 152 protrudes from the end of bearing 151 opposite the engaging end 169 and connects permanently to the cam support block 223.

The cam support block 223 includes a threaded bore that extends through block 223 perpendicularly of central post 152.

In a construction similar to that of ball screw 109, ball screw 219 extends generally horizontally across the interior of the shuttle apparatus 210 in a direction transverse to central post 152 and cam arms 202, 203. Ball screw 219 threadedly engages the threaded bore of cam support block 223 in such a manner that cam support block 223 moves horizontally along ball screw 219 as ball screw 219 is rotated by a direct-coupled motor. As cam support block 219 moves horizontally, pin roller bearing 151 also moves horizontally and engages cam groove 181. As the pin roller bearing 151 moves generally horizontally along a line defined by ball screw 219, it traverses the cam groove 188. Motion of the bearing through the cam groove is translated by the angular extent of the cam groove 188 to axial displacement of the handler 275, the direction of displacement being dependent upon the angle of the groove axis relative to the planes of left and right faces 192, 193 of the support housing 212. Axial motion of the handler 275 connects and disconnects BIC 50 into and out of its associated edge connector.

According to the preferred embodiment, as described supra in section II, entitled "Burn-in Cartridge," a plurality of handler pairs may be provided to permit the handling of a plurality of BICs 50. Thus, a plurality of automated handler pairs may be provided to engage and insert BICs 50 automatically in a sequential fashion.

According to the preferred embodiment as further described herein, two parallel rows of automated handlers, each with "n" number of handlers, define "n" pairs of automated handlers, each pair being capable of attachment to a single BIC 50. The discussion herein focuses on the operation of a single such row of automated handlers, it being understood that the second row would be constructed identically.

Referring now to FIGS. 28 and 30, and generally to the angular displacement mechanism 258 described supra, a plurality of automated handlers 275 are positioned sequentially along a single line, or row. Ball screws 109 and 219 extend generally horizontally along beside the row of handlers 275. In the preferred embodiment, as shown generally in FIG. 28, the length of the inner shaft 283 alternates between two different lengths, whereby every other handler 275 has an inner shaft 283 of a same length. The difference in length of adjacent inner shafts 283 is less than the axial length of cam roller bearing 161, whereby cam roller bearing 161 can engage the cam lever 107 on adjacent handlers 275 sequentially. Thus, the cam levers 107 for the row of handlers 275 define a pair of spaced, parallel planes. The alternate positioning of cam levers 107 enables adjacent handlers 275 to be positioned more closely to one another than would otherwise be possible given the required angular motion of cam lever 107.

Referring now to FIG. 30, as the cam roller bearing 151 moves generally horizontally in response to rotation of ball screw 109, it engages the first cam lever 107 in the row of handlers and rotates it approximately 90 degrees before disengaging the first cam slot 103. As cam roller bearing 161 disengages the first cam lever 107, it immediately engages the second cam lever 108, with cam finger 244 of the first cam lever 107, overlapping cam finger 342 of the second cam lever 108, as described supra. As vertical cam follower 209 traverses the length of ball screw 109, each cam lever 107, 108 is sequentially engaged and rotated 90 degrees to cause each handle 83 to engage (or disengage) sequentially a BIC 50.

Referring now to FIGS. 28 and 30, and generally to the linear displacement mechanism 272 described supra, the support blocks 290 of adjacent handlers 275 are aligned one to the next such that the cam pin roller bearing 151 moving generally horizontally along a path defined by the ball screw 219 will engage the cam groove 188 in the slotted lip 99 on each support block 290. As the cam pin roller bearing 151 moves generally horizontally, it engages an edge of the cam groove 188 on the first handler 275. As the roller bearing continues to move generally horizontally, the angular orientation of the cam groove 188 relative to the ball screw 219 causes the support block 290 to be displaced axially. Immediately after exiting from the first cam groove 188, the cam pin roller bearing 151 engages the cam groove on an adjacent support block 290, axially displacing the second handler 275 in the same manner as the first. In this manner, each handler 275 is displaced sequentially to connect or disconnect each BIC 50 sequentially so as to minimize the total force required to be exerted by the shuttle apparatus on the chamber at any one time, as discussed supra, in section II.

According to the preferred embodiment of the invention, the automated handlers may be oriented for motion either vertically or horizontally, depending upon the configuration of the chamber being serviced thereby, without departing from the description set forth herein. While a preferred embodiment of the invention has been shown and described, modifications can be made by one skilled in the art without departing from the spirit of the invention.

What is claimed is:

1. Apparatus for automatically inserting and removing a burn-in board in a chamber, said burn-in board being used for burning-in integrated circuits, comprising:
   means for grasping the burn-in board;
   means connected to said grasping means, for displacing said grasping means angularly to lock said grasping means onto the burn-in board; and
   means for displacing said grasping means linearly to insert the burn-in board into and remove the burn-in board from a connector in said chamber.

2. Apparatus according to claim 1 wherein said grasping means includes a handle and a cylindrical rod attached to the handle.

3. Apparatus according to claim 2 further comprising a bushing disposed about a portion of said rod for adjusting the positioning of said handle.

4. Apparatus according to claim 3, wherein said linear displacement means is disposed about said rod.

5. Apparatus according to claim 4, further comprising a bushing disposed between said rod and said linear displacement means.

6. Apparatus according to claim 5 wherein said bushing includes a bushing head and a hollow body portion with an interior surface and an exterior surface;
   the interior surface of the hollow body portion is threaded;
   a portion of said rod is threaded; and
   said rod is screwed into the hollow body portion of said bushing and mates with the threaded interior surface of the hollow body portion.

7. Apparatus according to claim 6 further comprising a block portion disposed between said bushing and said linear displacement means.

8. Apparatus according to claim 7 wherein a bore is machined into said block portion;
   part of said bore is threaded;
   the exterior surface of the hollow body portion of said bushing is threaded; and
   the hollow body portion of said bushing is screwed into said bore.

9. Apparatus according to claim 5 further comprising a block portion disposed between said bushing and said linear displacement means.

10. An automatic handler according to claim 4 further comprising a rectangular block portion, with a front and a back, disposed about said rod, and said linear displacement means includes a slot in said block portion which extends along one side of said block portion from the front of said block portion to the back of said block portion.

11. An automatic handler according to claim 10 wherein said slot angles downwardly from the front to the back of said block portion.

12. An automatic handler according to claim 11 wherein said linear displacement means includes a roller bearing movable about a fixed axis, with a portion of said roller bearing received within said slot as said roller bearing moves along the axis.

13. An automatic handler according to claim 12 wherein said linear displacement means includes a ball screw, positioned in a plane parallel to the fixed axis, a threaded block, disposed about the ball screw, and said roller bearing connects to the threaded block.

14. An automatic handler according to claim 10 wherein said slot is angled from the front to the back of said block portion.

15. Apparatus according to claim 2 wherein said angular displacement means includes a cam lever connected to said rod and a roller bearing movable about a fixed axis, with the roller bearing engaging the cam lever as the roller bearing moves about the axis.

16. An automatic handler according to claim 15 wherein said angular displacement means includes a ball screw positioned in a plane parallel to the fixed axis, a threaded block connected to the roller bearing, and the threaded block being disposed about the ball screw.

17. Apparatus according to claim 1 wherein said grasping means includes a T-shaped handle.

18. Apparatus for handling a plurality of burn-in boards, each burn-in board having a connector edge that may be received within one of a plurality of edge connectors comprising:
   a plurality of means for grasping a burn-in board, at least one said grasping means provided for each burn-in board of the plurality of burn-in boards;
   means for displacing each of said grasping means angularly to connect and disconnect said grasping means to and from the burn-in boards; and
   means for displacing each of said grasping means linearly to connect and disconnect the burn-in boards to and from edge connectors.

19. Apparatus according to claim 18, wherein said linear displacing means engages said plurality of grasping means sequentially, one of said grasping means at a time, to insert and remove each burn-in board of the plurality of burn-in boards from the edge connector so as to limit the total force applied to the plurality of edge connectors at any one time.

20. Apparatus according to claim 18, wherein said angular displacing means engages said plurality of grasping means sequentially, one said grasping means at a time, to connect and disconnect each grasping means to and from the burn-in boards so as to limit the total force required at any one time to effect the connection and disconnection.

21. An automatic handler comprising:
   a plurality of grasping means aligned in a row;
   a plurality of cylindrical rods aligned in a row, each of said plurality of cylindrical rods including a first and second end;
   a plurality of cam levers;
   each of said handling means connected to the first end of one of said rods, and each of said cam levers attached to the second end of said rods;
   a roller bearing, movable along a fixed axis, engaging each of said plurality of cam levers and rotating each said cam lever as said roller bearing moves along the axis.

* * * * *

UNITED STATES PATENT AND TRADEMARK OFFICE
CERTIFICATE OF CORRECTION

PATENT NO. : 4,947,545
DATED : August 14, 1990
INVENTOR(S) : Robert L. Gussman

It is certified that error appears in the above—identified patent and that said Letters Patent is hereby corrected as shown below:

In claim 7, line 1, after "claim", delete "6" and insert -- 5 --.

In claim 8, line 1, after "claim", delete "7" and insert -- 9 --.

In claim 9, line 1, after "claim", delete "5" and insert -- 6 --.

Signed and Sealed this

Seventh Day of January, 1992

Attest:

HARRY F. MANBECK, JR.

Attesting Officer     Commissioner of Patents and Trademarks